US011700019B2

(12) United States Patent
Yamamoto et al.

(10) Patent No.: US 11,700,019 B2
(45) Date of Patent: *Jul. 11, 2023

(54) TRANSMISSION DEVICE, TRANSMISSION METHOD, RECEPTION DEVICE, AND RECEPTION METHOD

(71) Applicant: SONY GROUP CORPORATION, Tokyo (JP)

(72) Inventors: Makiko Yamamoto, Tokyo (JP); Yuji Shinohara, Kanagawa (JP)

(73) Assignee: SONY GROUP CORPORATION, Tokyo (JP)

(*) Notice: Subject to any disclaimer, the term of this patent is extended or adjusted under 35 U.S.C. 154(b) by 476 days.

This patent is subject to a terminal disclaimer.

(21) Appl. No.: 16/757,791

(22) PCT Filed: Oct. 17, 2018

(86) PCT No.: PCT/JP2018/038586
§ 371 (c)(1),
(2) Date: Apr. 21, 2020

(87) PCT Pub. No.: WO2019/087774
PCT Pub. Date: May 9, 2019

(65) Prior Publication Data
US 2021/0152185 A1 May 20, 2021

(30) Foreign Application Priority Data
Oct. 31, 2017 (JP) ............................ JP2017-209878

(51) Int. Cl.
*H03M 13/00* (2006.01)
*H03M 13/11* (2006.01)
(Continued)

(52) U.S. Cl.
CPC .... *H03M 13/1148* (2013.01); *H03M 13/1105* (2013.01); *H03M 13/19* (2013.01); *H03M 13/271* (2013.01)

(58) Field of Classification Search
CPC ........... H03M 13/255; H03M 13/1165; H03M 13/1177; H03M 13/1105; H03M 13/1174;
(Continued)

(56) References Cited

U.S. PATENT DOCUMENTS 8,887,024 B2 * 11/2014 Eroz .................. H03M 13/255 714/758
9,577,790 B2 * 2/2017 Park .................. H03M 13/1102
(Continued)

FOREIGN PATENT DOCUMENTS

EP 2 365 639 A2 9/2011
EP 2 613 443 A1 7/2013
(Continued)

OTHER PUBLICATIONS

"Digital Video Broadcasting (DVB); Frame structure channel coding and modulation for a second generation digital terrestrial television broadcasting system(DVB-T2)"', European Standard, European Telecommunications Standards Institute (ETSI), Reference REN/JTC-DVB-308, ETSI EN 755 V1.3.1, 2012,188 total pages, pp. 38,39 p. 129-p. 138 XP014069715.
(Continued)

*Primary Examiner* — Esaw T Abraham
(74) *Attorney, Agent, or Firm* — Oblon, McClelland, Maier & Neustadt, L.L.P.

(57) ABSTRACT

A transmission device, a transmission method, a reception device, and a reception method for securing good communication quality in data transmission using an LDPC code. The LDPC coding is performed using a parity check matrix with the code length N of 17280 bits and the coding rate r
(Continued)

of 13/16 or 14/16. The LDPC code includes information bits and parity bits, and the parity check matrix includes an information matrix portion corresponding to the information bits and a parity matrix portion corresponding to the parity bits. The information matrix portion is represented by a parity check matrix initial value table, and the parity check matrix initial value table is a table representing positions of elements of 1 of the information matrix for every 360 columns.

8 Claims, 81 Drawing Sheets

(51) Int. Cl.
*H03M 13/19* (2006.01)
*H03M 13/27* (2006.01)

(58) Field of Classification Search
CPC . H03M 13/1148; H03M 13/19; H03M 13/271
See application file for complete search history.

(56) References Cited

U.S. PATENT DOCUMENTS

| | | | | |
|---|---|---|---|---|
| 10,164,661 | B2 * | 12/2018 | Ikegaya | H03M 13/271 |
| 10,193,571 | B2 * | 1/2019 | Ikegaya | H03M 13/1162 |
| 10,411,736 | B2 * | 9/2019 | Jeong | H03M 13/6552 |
| 2015/0128013 | A1 | 5/2015 | Okamura | |
| 2016/0233892 | A1 * | 8/2016 | Kim | H03M 13/2778 |
| 2017/0041025 | A1 * | 2/2017 | Murakami | H03M 13/1111 |
| 2017/0163290 | A1 | 6/2017 | Kim | |

FOREIGN PATENT DOCUMENTS

| | | | |
|---|---|---|---|
| EP | 2 955 853 | A1 | 12/2015 |
| EP | 3 151 435 | A1 | 4/2017 |
| JP | 2006508587 | A | 3/2006 |
| JP | 2009510875 | A | 3/2009 |
| JP | 2015156530 | A | 8/2015 |
| JP | 2015-228647 | A | 12/2015 |
| WO | WO-2015098065 | A1 | 7/2015 |
| WO | WO-2015174053 | A1 | 11/2015 |
| WO | WO-2015182102 | A1 | 12/2015 |

OTHER PUBLICATIONS

International Search Report dated Dec. 18, 2018 in PCT/JP2018/038586 filed Oct. 17, 2018.

ATSC Standard: Physical Layer Protocol; Doc. A/322:2017; Jun. 6, 2017; 20 total pages.

NHK Science & Technology Research Laboratories 2017; 1.9 Terrestrial Broadcast Transmission Technology; 11 total pages.

ATSC Standard: Physical Layer Protocol (A/322); Doc. A/322:2016; 7 Sep. 7, 2016; 258 total pages.

* cited by examiner

FIG. 3

$$
H=\begin{bmatrix}
1 & 1 & 1 & 0 & 0 & 0 & 1 & 0 & 1 & 1 & 0 & 0 \\
1 & 1 & 0 & 1 & 1 & 0 & 0 & 0 & 0 & 0 & 1 & 1 \\
0 & 0 & 1 & 1 & 1 & 1 & 1 & 0 & 0 & 1 & 0 & 0 \\
0 & 0 & 0 & 1 & 1 & 1 & 0 & 1 & 1 & 0 & 0 & 1 \\
1 & 1 & 0 & 0 & 0 & 1 & 0 & 1 & 0 & 1 & 1 & 0 \\
0 & 0 & 1 & 0 & 0 & 0 & 1 & 1 & 1 & 0 & 1 & 1
\end{bmatrix}
$$

CHECK NODE

VARIABLE NODE

FIG. 13

NUMBER OF COLUMNS OF EACH COLUMN WEIGHT

| Nominal CODING RATE | N=64800 X | N=64800 KX | N=64800 K3 | N=64800 M | N=16200 X | N=16200 KX | N=16200 K3 | N=16200 M |
|---|---|---|---|---|---|---|---|---|
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | --- | --- | --- | --- |

FIG. 15
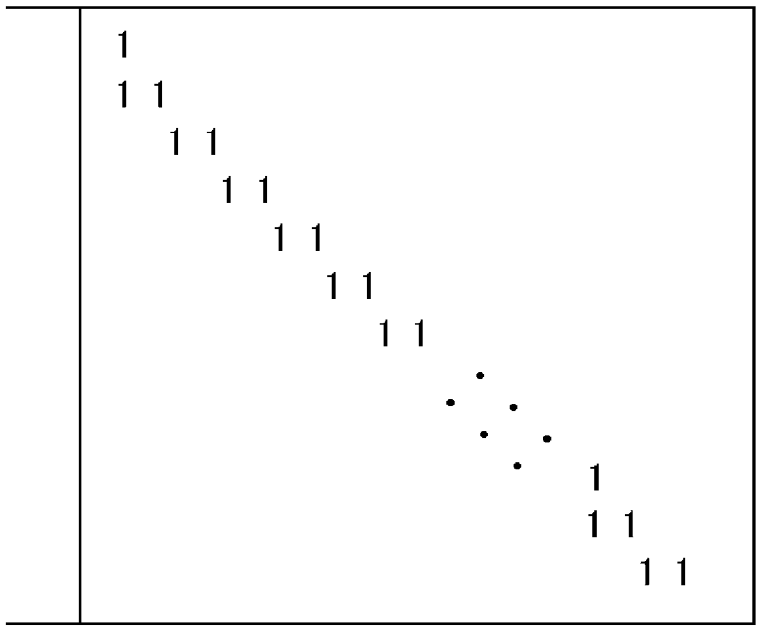
STEP STRUCTURE OF PARITY MATRIX
A
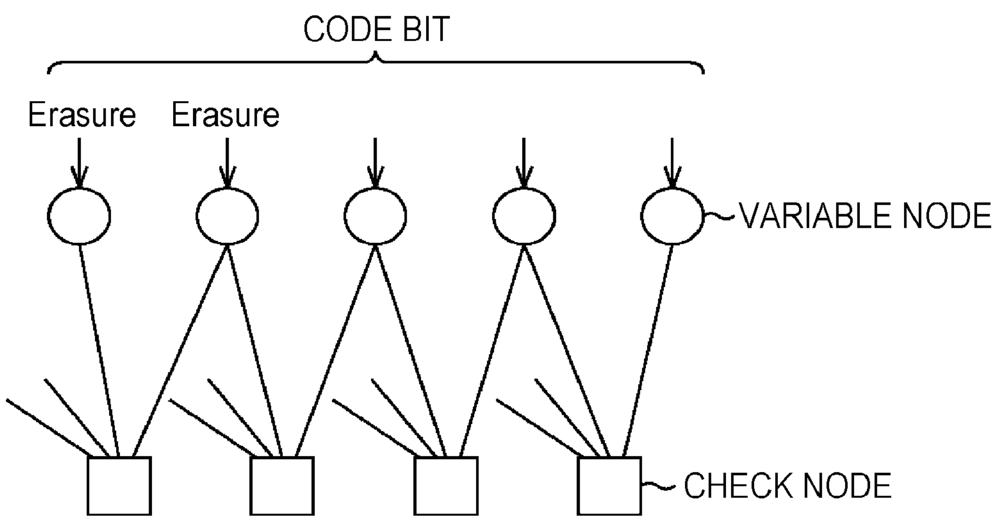
STEP STRUCTURE PORTION OF Tanner Graph
B r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

Rate 2/16 17k TypeA CODE TABLE 485 1444 1737 3762 7283 10663
181 1563 1623 3902 12647
1077 1216 1709 11264 13865
303 1225 1369 13470 14991
1067 1226 1795 2169 2507 2677 2727 2773 3609 3926 3996 4192 5004 5921 6134 6385 7419 7595 7821 8996 9413 10318 10557 10886 11307 11599 12641 13430
101 1264 1427 1860 2032 2063 3143 3156 4227 4554 4732 5165 5447 5902 6145 6721 7170 8660 8833 9081 9643 9800 10233 11723 12547 13124 14196 14723
3403 3678 5842 7967 8991 9220 9663 10299 10343 10550
1951 2354 3899 4774 7602 9120 9666 11048 14327 15089
2588 3047 4252 4831 5220 5487 5626 6380 9410 10618
2261 2295 5693 6711 6789 8342 11569 11943 12826 14312
3441 5287 7665 7864 8134 8446 10920 11625 12710 13309

FIG. 31

Rate 3/16 17k TypeA CODE TABLE 10 1155 1332 1608 8228 8253 11662
483 1297 1433 4678 5776 10410 13553
862 967 1036 1842 2950 10129 12042
258 872 1037 7129 9442 9491 10644
215 260 590 6003 7554 10499
197 521 1190 1670 3696 4410 4436 4686 5350 5651 7397 7503 8553 9844 10729 11421 11605 11742 11835 12338 12422
288 560 1427 1492 1932 3255 4508 4628 5259 5881 6136 8019 8152 8192 8230 8669 8880 10289 11160 11665 12374
694 1175 1205 2363 2756 2962 3097 3374 4268 4811 6072 6393 6942 9514 9733 10681 11081 11360 12386 13467 13980
25 1200 1266 3036 3441 4940 5161 5254 7231 7585 8088 9414 10217 10349 10409 11177 12151 12497 12934 13123 14029
2599 5475 6890 7755 8567 9088 11980
2708 2836 6062 6328 8890 9831 11173
2522 2634 4989 6831 9523 10731 12107
4738 5653 7862 11986 12773 12839 13045

*FIG. 32*

Rate 4/16 17k TypeA CODE TABLE 478 512 714 1103 3052 4701 6654 7690 7824 11154 11948 12493
73 155 855 1758 2467 4962 5168 5785 7323 11891 12232
41 433 636 1280 2182 2342 2768 3511 7654 8802 9938
196 434 672 5407 6013 7349 8268 8640 9257 9675 11987
23 543 562 1355 2157 3037 6464 8139 10004 10047 12628
743 900 982 3188 5095 7926 8936 10387 10419 11190 12422
102 647 1000 3957 4826 5892 8640 8655 11125 11210 12955
273 652 788 1958 2647 4003 5015 6364 9191 9966 10147
372 566 772 7093 7353 8285 8592 9651 11787 12190 12376
33 257 943 3805 5647
196 681 983 9412 11567
59 720 1009 2814 12177
1148 1691 2098 2308 2328 3860 4055 6680 6822 7271 8041 8748 9723 10748 12636 12730 12865
1827 2104 3047 3338 5151 5312 5452 6563 8783 8998 9056 10576 10679 10817 12032 12681 12822
1948 2778 3225 4292 5260 5874 6550 6773 7369 7627 8500 9799 10247 11775 12207 12324 12891

FIG. 33

Rate 5/16 17k TypeA CODE TABLE 301 342 350 1797 7970 8230 10820 11305
139 530 615 1566 6290 6425 9185 9466
48 419 444 1773 3213 4793 8594 10480
246 455 531 3011 5845 7383 8393 10709
39 262 290 3282 5208 9539 10955 11204
234 267 623 1033 1537 8766 11527 11557
494 661 671 1123 4497 6601 6715 10473
164 425 436 3259 4505 5614 8192 10221
326 377 477 7699 10162 11174 11878
206 360 557 891 930 1847 2427 3888 4491 6494 6911 8084 8945 9549
402 588 657 888 3271 4858 5257 6398 6631 6972 9678 11140 11159 11398
39 111 168 1192 1879 3121 3127 5987 8385 8488 9302 9884 10891 11879
639 640 693 1477 1790 2442 3388 3547 4622 6890 7315 7478 7905 11518
337 544 604 1184 1238 1334 2434 5239 6832 7770 9123 9397 9646 10254
32 77 604 762 1428 2756 2758 6854 7193 7311 7517 9105 10765 11173
910 1918 2342 3280 3362 3913 4586 6316 7693 8878 10922 11145 11863
790 1177 1386 1961 2437 3571 5179 5961 8222 9195 9569 10414 11498

FIG. 34

Rate 6/16 17k TypeA CODE TABLE 416 437 444 1657 2662 4109 4405 6308 8251
75 498 687 3903 4582 7035 7650 7871 10382
394 419 474 3515 6708 7277 8703 9969 10489
167 289 612 1847 5277 5900 8326 8508 9462
196 439 620 2128 2375 2501 6902 9308 9552
154 495 623 5024 6241 8364 9996 10104 10346
230 329 661 879 1474 3222 4109 8079 8865
97 172 692 1018 1629 1752 3170 5930
359 377 712 6273 7131 7278 8292 10457
368 551 708 787 2891 6140 7195 9555
44 512 655 2196 6692 7975 8410 10727
27 94 611 5585 7258 8091 9867 10714
608 639 691 3560 6819 7492 7754 7916
46 115 214 2175 5986 7177 8589 10757
282 589 604 969 1856 2433 5742 8900
243 262 669 1330 1366 3339 5517 7517
62 392 651 4175 8349 8557 9192 10015
206 375 697 1449 2015 2390 3926 4428 5084 5236 5872 8486 9398 9997 10469
1079 1384 1664 2936 4618 5359 5455 5537 5726 5875 8044 8521 9746
791 1106 1497 1885 2682 3473 3716 4506 5671 5829 8388 8641 9454

FIG. 35

Rate 7/16 17k TypeA CODE TABLE 512 531 598 3235 3447 5630 5765 6208 7026 9012
88 486 926 1714 5140 5725 6006 6506 7619 8191
200 447 460 1088 2612 3297 4001 4275 4992 8638
106 434 618 5357 5713 9045 9335 9429 9696
23 192 661 1220 2962 3867 5783 6410 6790
311 744 934 1267 1428 1959 2462 2865 5461
69 494 991 1278 4441 5620 5705 5936 8872
297 637 1031 2346 2946 4519 7235 7264 9243
330 599 790 3674 5457 6535 6660 7398 8110
263 630 826 1978 3384 4259 5159 5588 5885
196 648 983 1529 1821 2312 2428 7249 7359
59 774 1036 1427 2005 5811 6998 7987 8222
454 474 986 1633 4040 6880 7786 8518 9039
433 443 849 2517 3617 5477 6294 7914 9456
175 242 906 2924 3412 4063 7737 9084 9338
385 624 1004 3218 5225 6479 7684 7933 8875
233 622 807 2302 3315 3898 4079 7109 9201
3 877 1070 1331 2607 3552 4672 7549 8083
247 753 806
12 242 598
221 561 643
1135 1424 2228 9426
4998 5209 7742 8652
2042 5925 6236 9405

FIG. 36

Rate 7/16 17k TypeB CODE TABLE 193 217 530 596 789 1340 1569 1662 1887 1889 2299 2610 2629 2790 3464 3607 3935 4439 5460 5721 5758 6094 6280 6350 6449 6613 6682 6826 6906 7048 7425 8229 8627 8679 8735 8814 9079 9146
435 572 815 903 1063 1962 1989 2215 2417 2862 2914 3182 3980 4414 4566 4895 4950 5163 5336 5388 5642 5764 6586 6719 6787 7262 7609 8000 8561 8790 9027 9334 9358 9420 9444 9553 9614
250 3557 3865 4350 4394 4644 5303 6590 8377 8497 9655
21 602 1038 1212 1243 3938 4136 5620 6516 6777 8226
134 214 1550 1554 1615 3178 5113 5163 5201 7168 7574
134 2692 3810 4954 6766
2394 4734 5731 7427 7653
509 1009 3867 5069 9121
540 2975 6248
4 831 3592
503 1385 7170
348 7774 8897
67 3553 5134
623 6525 8314
2871 7545 8960
4330 4839 7689
4793 5327 8046
2877 3422 8836
2069 7584 9102
1376 3862 4352
4693 7147 9461

FIG. 37

Rate 8/16 17k TypeB CODE TABLE 516 1070 1128 1352 1441 1482 2437 5049 5157 5266 5585 5716 6907 8094
299 4342 4520 4988 5163 5453 5731 5752 6985 7155 8031 8407 8519 8618
178 181 743 814 1188 1313 1384 1769 1838 1930 1968 2123 2487 2497 2829 2852 3220 3245 3936 4054 4358 4397 4482 4514 4567 4711 4785 5217 6030 6747 7127 7254 7845 8552
125 430 594 628 641 740 1895 2007 2148 2363 2790 2920 3158 3493 3768 3805 3896 5067 5103 5121 5292 5764 5857 5948 6338 6523 6578 6880 7303 7557 8242 8371 8387 8634
1631 2139 2453 2544 5442 6255
127 2676 3774 4289 5764 7450
1270 1856 2025 2065 3259 7787
645 1648 5077 6644 6650 8198
485 904 4510
624 4137 7388
724 4865 8587
1247 4729 6266
5604 6147 6898
63 4763 6319
930 6174 7453
981 2960 8486
4286 4304 8058
1460 6205 7561
2339 2998 8002
1824 6660 8286
4264 5378 7779
4145 6343 8515
5007 6959 7845
1853 6196 8289

FIG. 38

Rate 9/16 17k TypeB CODE TABLE 291 817 1023 1118 1168 1195 1419 1763 2507 3005 3886 3952 4046 4924 5372 5586 5742 5925 6080 6157 6301 6600 6644 7052 7093 7105 7487
133 565 957 1018 1150 1196 1210 1224 1361 1484 2330 2448 2525 2583 2639 3198 3407 3504 4272 4383 5133 5399 5421 5545 6972 7156
129 365 541 1026 1199 1527 2467 3386 3458 4215 4438 4778 5176 5484 5521 5540 5788 6103 6287 6360 6605 6745 6973 7251 7329 7336
996 1392 2493 2910 3048 3281 4969 5189 5632 6236 6983
165 2521 2650 2824 3493 4637 5670 6470
266 345 390 2365 2843 3274 4321 5165
245 2173 2274 2687 3763 4284 5562 6564
2787 2970 3503
691 3718 5047
593 969 3593
331 3809 6269
1627 2886 5935
1046 2976 4457
4725 6028 6458
6172 6610 7530
1536 7102 7148
233 2463 4955
826 4319 6969
3073 6675 6774
407 4251 7087
1380 3802 4937
1911 4360 6306
4027 6219 7292
398 1190 1936
250 830 7241
5500 5828 7478
1261 4649 7237

FIG. 39

Rate 10/16 17k TypeB CODE TABLE 579 608 613 760 795 839 910 1895 2239 2535 2670 2871 3127 3316 3779 3829 3936 4454 4772 4926 6048 6166 6352
263 291 694 1172 1232 1925 2657 3037 3057 3400 3550 3812 4185 4325 5202 5441 5479 5640 5864 5892 6154 6157 6227
527 601 1254 1476 1760 2070 2099 2725 2961 3529 3591 4324 4393 4462 4841 5070 5480 5698 5856 5865 6087 6446
235 319 480 2036 2188 2358 2423 2510 2911 3225 3472 3677 3840 4409 4574 4892 5119 5548 5805 5901 6290 6477
1809 2974 3464 5295 5490 5671
2148 3629 4304 4854 4876 6037
2031 2246 3358 4679 6125 6331
874 2483 2964 3872 4509 4904
4001 4303 5079
1652 4524 5263
2551 3381 5524
713 1908 6304
2722 3347 6201
433 923 5564
2181 4242 6202
51 2711 4435
414 708 5539
2222 5036 5974
784 3588 5125
4256 5004 5540
1761 2781 6037
1547 2266 4377
4109 5836 6337
767 2468 4764
2528 5457 5872
884 4651 4807
161 3582 5164
744 2624 4852
239 1740 5807
33 3595 5121

FIG. 40

Rate 11/16 17k TypeB CODE TABLE 91 382 494 654 681 695 1643 2171 2576 3027 3115 3390 3633 3644 3812 3883 4474 4607 4674
384 396 982 988 1053 1867 2215 2345 2472 3323 3503 3573 3883 4159 4576 4917 5104 5130
456 580 1590 1715 1786 1843 1934 2251 2261 2466 2525 2958 3467 4334 4530 4779 4885 5021
227 381 394 502 1059 1108 1480 1508 1523 1620 1840 1996 2436 2989 3716 3957 4072 4243 4482 4517 4717 4910 5105 5220 5238 5279
376 957 1706 2028 2228 2439 2552 4249 5234
89 676 1098 1103 1127 1449 1605 2362 4640
66 613 1692 1901 2247 3025 3244 4864 5050
1628 2015 2596
521 802 3804
3178 4080 5057
344 3486 3948
595 2538 2964
300 1355 3476
1292 2761 4819
462 773 3996
133 3494 4342
37 3698 4382
345 3624 4745
124 4197 4978
873 2686 4266
989 2966 4180
1468 1932 4913
1140 4164 5060
3361 4952 5287
2584 4646 5260
809 2481 4893
1201 1532 3877
128 2430 4279
621 4810 5249
200 717 5066
2283 2998 4164
704 2587 4736
106 2080 3279

FIG. 41

Rate 12/16 17k TypeB CODE TABLE 137 199 292 423 527 694 798 2233 2339 2948 2986 3261 3284 3410 3612 3866 4296
633 691 1035 1038 1250 1476 1885 2332 2871 3064 3186 3785 4114 4205 4213 4280 4291
136 166 369 677 878 1119 1360 1401 1501 1823 1950 2492 2760 2843 3151 3168 3189
23 27 74 90 779 1085 1204 1364 1846 2594 2971 3075 3373 3486 4030 4037 4044
286 789 1412 1513 2388 2407 2725 2757 2790 2839 3111 3227 3292 3596 3665 3710 4147
79 178 389 447 608 625 672 786 965 1258 1605 1677 1816 1910 3027 3815 4292
208 2694 3685
480 770 791
261 3447 3751
1271 2122 3312
134 352 1592
517 1877 2106
173 693 1792
1975 2062 3529
734 1035 1136
546 863 4212
817 2712 3692
415 3771 4305
646 1514 3870
1481 2675 4276
454 2248 2517
1073 1754 2107
1170 1472 3699
841 2243 3804
2485 3636 3894
1961 2302 3591
225 2704 3938
487 1067 3992
2747 3054 3661
2476 2885 3456
242 487 4018
2037 2511 4232
1278 1636 3609
1099 1450 3842
1299 1632 1717
545 4160 4295

FIG. 42

Rate 13/16 17k TypeB CODE TABLE 225 274 898 916 1020 1055 1075 1179 1185 1343 1376 1569 1828 1972 2852 2957 3183
548 602 628 928 1077 1474 1557 1598 1935 1981 2110 2472 2543 2594 2721 2884 2981
59 69 518 900 1158 1325 1367 1480 1744 2069 2119 2406 2757 2883 2914 2966 3232
1330 1369 1712 2133 2206 2487 2596 2606 2612 2666 2726 2733 2754 2811 2948 3030
391 542 689 748 810 1716 1927 2006 2296 2340 2357 2514 2797 2887 2896 3226
256 410 799 1126 1377 1409 1518 1619 1829 2037 2303 2324 2472 2475 2874 2992
862 1522 1905
809 842 945
561 1001 2857
2132 2592 2905
217 401 1894
11 30 1860
210 1188 2418
1372 2273 2455
407 2537 2962
939 2401 2677
2521 3077 3173
1374 2250 2423
23 188 1320
472 714 2144
2727 2755 2887
1814 2824 2852
148 1695 1845
595 1059 2702
1879 2480 2578
17 411 559
146 783 2154
951 1391 1979
1507 1613 3106
642 882 2356
1008 1324 3125
196 1794 2474
1129 1544 2931
765 1681 2591
1550 1936 3048
1596 1607 2794
156 1053 2926
1246 1996 3179
348 752 1943

FIG. 43

Rate 14/16 17k TypeB CODE TABLE 337 376 447 504 551 864 872 975 1136 1225 1254 1271 1429 1478 1870 2122
58 121 163 365 515 534 855 889 1083 1122 1190 1448 1476 1635 1691 1954
247 342 395 454 479 665 674 1033 1041 1198 1300 1484 1680 1941 2096 2121
80 487 500 513 661 970 1038 1095 1109 1133 1416 1545 1696 1992 2051 2089
32 101 205 413 568 712 714 944 1329 1669 1703 1826 1904 1908 2014 2097
142 201 491 838 860 954 960 965 997 1027 1225 1488 1502 1521 1737 1804
453 1184 1542
10 781 1709
497 903 1546
1080 1640 1861
1198 1616 1817
771 978 2089
369 1079 1348
980 1788 1987
1495 1900 2015
27 540 1070
200 1771 1962
863 988 1329
674 1321 2152
807 1458 1727
844 867 1628
227 546 1027
408 926 1413
361 982 2087
1247 1288 1392
1051 1070 1281
325 452 467
1116 1672 1833
21 236 1267
504 856 2123
398 775 1912
1056 1529 1701
143 930 1186
553 1029 1040
303 653 1308
877 992 1174
1083 1134 1355
298 404 709
970 1272 1799
296 1017 1873
105 780 1418
682 1247 1867

FIG. 47

| Rate | K | X1 | K1 | X2 | K2 | X3 | K3 | XM1 | M1 | M2 |
|---|---|---|---|---|---|---|---|---|---|---|
| 2/16 | 2160 | 6 | 360 | 5 | 1080 | 28 | 720 | 10 | 1800 | 13320 |
| 3/16 | 3240 | 7 | 1440 | 6 | 360 | 21 | 1440 | 7 | 1440 | 12600 |
| 4/16 | 4320 | 12 | 360 | 11 | 2880 | 5 | 1080 | 17 | 1080 | 12240 |
| 5/16 | 5400 | 8 | 2880 | 7 | 360 | 14 | 2160 | 13 | 720 | 11160 |
| 6/16 | 6480 | 9 | 2520 | 8 | 3600 | 15 | 360 | 13 | 720 | 10080 |
| 7/16 | 7560 | 10 | 1080 | 9 | 5400 | 3 | 1080 | 4 | 1080 | 8640 |

FIG. 49

| Rate | K | X1 | KX1 | X2 | KX2 | X3 | KX3 | X4 | KX4 | Y1 | KY1 | M |
|---|---|---|---|---|---|---|---|---|---|---|---|---|
| 7/16 | 7560 | 38 | 360 | 37 | 360 | 11 | 1080 | 5 | 1080 | 3 | 4680 | 9720 |
| 8/16 | 8640 | 14 | 720 | 34 | 720 | 6 | 1440 | 0 | 0 | 3 | 5760 | 8640 |
| 9/16 | 9720 | 27 | 360 | 26 | 720 | 11 | 360 | 8 | 1080 | 3 | 7200 | 7560 |
| 10/16 | 10800 | 23 | 720 | 22 | 720 | 6 | 1440 | 0 | 0 | 3 | 7920 | 6480 |
| 11/16 | 11880 | 19 | 360 | 18 | 720 | 26 | 360 | 9 | 1080 | 3 | 9360 | 5400 |
| 12/16 | 12960 | 17 | 2160 | 0 | 0 | 0 | 0 | 0 | 0 | 3 | 10800 | 4320 |
| 13/16 | 14040 | 17 | 1080 | 16 | 1080 | 0 | 0 | 0 | 0 | 3 | 11880 | 3240 |
| 14/16 | 15120 | 16 | 2160 | 0 | 0 | 0 | 0 | 0 | 0 | 3 | 12960 | 2160 |

FIG. 50

| Input Data Cell y | Constellation Point $z_s$ |
|---|---|
| 00 | $(1+j1)/\sqrt{2}$ |
| 01 | $(-1+j1)/\sqrt{2}$ |
| 10 | $(+1-j1)/\sqrt{2}$ |
| 11 | $(-1-j1)/\sqrt{2}$ |

FIG. 51

| w/CR | 2/15 | 3/15 | 4/15 | 5/15 | 6/15 | 7/15 |
|---|---|---|---|---|---|---|
| w0 | 0. 7062+j0. 7075 | 0. 3620+j0. 5534 | 0. 3412+j0. 5241 | 0. 3192+j0. 5011 | 0. 5115+j1. 2092 | 0. 2592+j0. 4888 |
| w1 | 0. 7075+j0. 7062 | 0. 5534+j0. 3620 | 0. 5241+j0. 3412 | 0. 5011+j0. 3192 | 1. 2092+j0. 5115 | 0. 4888+j0. 2592 |
| w2 | 0. 7072+j0. 7077 | 0. 5940+j1. 1000 | 0. 5797+j1. 1282 | 0. 5575+j1. 1559 | 0. 2663+j0. 4530 | 0. 5072+j1. 1980 |
| w3 | 0. 7077+j0. 7072 | 1. 1000+j0. 5940 | 1. 1282+j0. 5797 | 1. 1559+j0. 5575 | 0. 4530+j0. 2663 | 1. 1980+j0. 5072 |

| w/CR | 8/15 | 9/15 | 10/15 | 11/15 | 12/15 | 13/15 |
|---|---|---|---|---|---|---|
| w0 | 0. 2535+j0. 4923 | 0. 2386+j0. 5296 | 0. 4487+j1. 1657 | 0. 9342+j0. 9847 | 0. 9555+j0. 9555 | 0. 9517+j0. 9511 |
| w1 | 0. 4923+j0. 2535 | 0. 5296+j0. 2386 | 1. 2080+j0. 5377 | 0. 9866+j0. 2903 | 0. 9555+j0. 2949 | 0. 9524+j0. 3061 |
| w2 | 0. 4927+j1. 2044 | 0. 4882+j1. 1934 | 0. 2213+j0. 4416 | 0. 2716+j0. 9325 | 0. 2949+j0. 9555 | 0. 3067+j0. 9524 |
| w3 | 1. 2044+j0. 4927 | 1. 1934+j0. 4882 | 0. 6186+j0. 2544 | 0. 2901+j0. 2695 | 0. 2949+j0. 2949 | 0. 3061+j0. 3067 |

FIG. 52

| u/CR | 2/15 | 3/15 | 4/15 | 5/15 | 6/15 | 7/15 |
|---|---|---|---|---|---|---|
| u0 | 0. 3317 | 0. 2382 | 0. 1924 | 0. 1313 | 0. 1275 | 0. 0951 |
| u1 | 0. 3321 | 0. 2556 | 0. 1940 | 0. 1311 | 0. 1276 | 0. 0949 |
| u2 | 0. 3322 | 0. 2749 | 0. 2070 | 0. 1269 | 0. 1294 | 0. 1319 |
| u3 | 0. 3321 | 0. 2558 | 0. 2050 | 0. 1271 | 0. 1295 | 0. 1322 |
| u4 | 0. 3327 | 0. 2748 | 0. 3056 | 0. 3516 | 0. 3424 | 0. 3170 |
| u5 | 0. 3328 | 0. 2949 | 0. 3096 | 0. 3504 | 0. 3431 | 0. 3174 |
| u6 | 0. 3322 | 0. 2749 | 0. 2890 | 0. 3569 | 0. 3675 | 0. 3936 |
| u7 | 0. 3322 | 0. 2558 | 0. 2854 | 0. 3581 | 0. 3666 | 0. 3921 |
| u8 | 0. 9369 | 0. 9486 | 0. 7167 | 0. 6295 | 0. 6097 | 0. 5786 |
| u9 | 0. 9418 | 0. 8348 | 0. 7362 | 0. 6301 | 0. 6072 | 0. 5789 |
| u10 | 0. 9514 | 0. 7810 | 0. 7500 | 0. 6953 | 0. 7113 | 0. 7205 |
| u11 | 0. 9471 | 0. 8348 | 0. 7326 | 0. 6903 | 0. 7196 | 0. 7456 |
| u12 | 0. 9448 | 0. 9463 | 0. 9667 | 0. 9753 | 0. 9418 | 0. 9299 |
| u13 | 0. 9492 | 0. 8336 | 0. 9665 | 1. 0185 | 1. 0048 | 1. 0084 |
| u14 | 0. 9394 | 0. 9459 | 1. 1332 | 1. 2021 | 1. 2286 | 1. 2349 |
| u15 | 0. 9349 | 1. 4299 | 1. 4761 | 1. 4981 | 1. 5031 | 1. 5118 |

| u/CR | 8/15 | 9/15 | 10/15 | 11/15 | 12/15 | 13/15 |
|---|---|---|---|---|---|---|
| u0 | 0. 0773 | 0. 0638 | 0. 0592 | 0. 0502 | 0. 0354 | 0. 0325 |
| u1 | 0. 0773 | 0. 0638 | 0. 0594 | 0. 0637 | 0. 0921 | 0. 0967 |
| u2 | 0. 1614 | 0. 1757 | 0. 1780 | 0. 1615 | 0. 1602 | 0. 1623 |
| u3 | 0. 1614 | 0. 1756 | 0. 1790 | 0. 1842 | 0. 2185 | 0. 2280 |
| u4 | 0. 3086 | 0. 3069 | 0. 2996 | 0. 2760 | 0. 2910 | 0. 2957 |
| u5 | 0. 3085 | 0. 3067 | 0. 3041 | 0. 3178 | 0. 3530 | 0. 3645 |
| u6 | 0. 4159 | 0. 4333 | 0. 4241 | 0. 4040 | 0. 4264 | 0. 4361 |
| u7 | 0. 4163 | 0. 4343 | 0. 4404 | 0. 4686 | 0. 4947 | 0. 5100 |
| u8 | 0. 5810 | 0. 5765 | 0. 5561 | 0. 5535 | 0. 5763 | 0. 5878 |
| u9 | 0. 5872 | 0. 5862 | 0. 6008 | 0. 6362 | 0. 6531 | 0. 6696 |
| u10 | 0. 7213 | 0. 7282 | 0. 7141 | 0. 7293 | 0. 7417 | 0. 7566 |
| u11 | 0. 7604 | 0. 7705 | 0. 8043 | 0. 8302 | 0. 8324 | 0. 8497 |
| u12 | 0. 9212 | 0. 9218 | 0. 9261 | 0. 9432 | 0. 9386 | 0. 9498 |
| u13 | 1. 0349 | 1. 0364 | 1. 0639 | 1. 0704 | 1. 0529 | 1. 0588 |
| u14 | 1. 2281 | 1. 2234 | 1. 2285 | 1. 2158 | 1. 1917 | 1. 1795 |
| u15 | 1. 4800 | 1. 4646 | 1. 4309 | 1. 3884 | 1. 3675 | 1. 3184 |

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(Z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(Z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

B

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(Z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(Z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 54

| | | |
|---|---|---|
| $y_{0,q}$ | 1 | 0 |
| $Re(z_q)$ | −1 | 1 |

FIG. 55

| | | |
|---|---|---|
| $y_{1,q}$ | 1 | 0 |
| $Im(z_q)$ | −1 | 1 |

FIG. 56

| | | | | |
|---|---|---|---|---|
| $y_{0,q}$<br>$y_{2,q}$ | 1<br>0 | 1<br>1 | 0<br>1 | 0<br>0 |
| $Re(z_q)$ | −3 | −1 | 1 | 3 |

FIG. 57

| | | | | |
|---|---|---|---|---|
| $y_{1,q}$<br>$y_{3,q}$ | 1<br>0 | 1<br>1 | 0<br>1 | 0<br>0 |
| $Im(z_q)$ | −3 | −1 | 1 | 3 |

FIG. 58

| | | | | | | | | |
|---|---|---|---|---|---|---|---|---|
| $y_{0,q}$ | 1 | 1 | 1 | 1 | 0 | 0 | 0 | 0 |
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | −7 | −5 | −3 | −1 | 1 | 3 | 5 | 7 |

FIG. 59

| | | | | | | | | |
|---|---|---|---|---|---|---|---|---|
| $y_{1,q}$ | 1 | 1 | 1 | 1 | 0 | 0 | 0 | 0 |
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| $Im(z_q)$ | −7 | −5 | −3 | −1 | 1 | 3 | 5 | 7 |

*FIG. 60*

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 0 | 0 | 0 | 0 | 0 | 0 | 0 | 0 |
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | −15 | −13 | −11 | −9 | −7 | −5 | −3 | −1 | 1 | 3 | 5 | 7 | 9 | 11 | 13 | 15 |

FIG. 61

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 |
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $Im(z_q)$ | −15 | −13 | −11 | −9 | −7 | −5 | −3 | −1 | 1 | 3 | 5 | 7 | 9 | 11 | 13 | 15 |

FIG. 62

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | −31 | −29 | −27 | −25 | −23 | −21 | −19 | −17 | −15 | −13 | −11 | −9 | −7 | −5 | −3 | −1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |

FIG. 63

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | −31 | −29 | −27 | −25 | −23 | −21 | −19 | −17 | −15 | −13 | −11 | −9 | −7 | −5 | −3 | −1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |

FIG. 64

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | -63 | -61 | -59 | -57 | -55 | -53 | -51 | -49 | -47 | -45 | -43 | -41 | -39 | -37 | -35 | -33 |

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | -31 | -29 | -27 | -25 | -23 | -21 | -19 | -17 | -15 | -13 | -11 | -9 | -7 | -5 | -3 | -1 |

| | | | | | | | | | | | | | | | | |
|---|---|---|---|---|---|---|---|---|---|---|---|---|---|---|---|---|
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |

| | | | | | | | | | | | | | | | | |
|---|---|---|---|---|---|---|---|---|---|---|---|---|---|---|---|---|
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 33 | 35 | 37 | 39 | 41 | 43 | 45 | 47 | 49 | 51 | 53 | 55 | 57 | 59 | 61 | 63 |

FIG. 65

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | -63 | -61 | -59 | -57 | -55 | -53 | -51 | -49 | -47 | -45 | -43 | -41 | -39 | -37 | -35 | -33 |
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | -31 | -29 | -27 | -25 | -23 | -21 | -19 | -17 | -15 | -13 | -11 | -9 | -7 | -5 | -3 | -1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 33 | 35 | 37 | 39 | 41 | 43 | 45 | 47 | 49 | 51 | 53 | 55 | 57 | 59 | 61 | 63 |

FIG. 66

| w/CR | 2/16 | 4/16 | 6/16 | 8/16 | 10/16 | 12/16 | 14/16 |
|---|---|---|---|---|---|---|---|
| w0 | 0.707107+j0.707107 | 0.707107+j0.707107 | 0.463340+j0.284191 | 0.457029+j0.264235 | 0.493628+j0.253004 | 0.418917+j0.217263 | 0.297592+j0.297592 |
| w1 | 0.707107+j0.707107 | 0.707107+j0.707107 | 0.284191+j0.463340 | 0.264235+j0.457029 | 0.253004+j0.493628 | 0.257090+j0.657759 | 0.297592+j0.954693 |
| w2 | 0.707107+j0.707107 | 0.707107+j0.707107 | 1.192750+j0.530940 | 1.210202+j0.506671 | 1.204042+j0.492548 | 1.144505+j0.432606 | 0.954693+j0.297592 |
| w3 | 0.707107+j0.707107 | 0.707107+j0.707107 | 0.530940+j1.192750 | 0.506671+j1.210202 | 0.492548+j1.204042 | 0.565917+j1.208827 | 0.954693+j0.954693 |

FIG. 67

| w/CR | 3/16 | 5/16 | 7/16 | 9/16 | 11/16 | 13/16 |
|---|---|---|---|---|---|---|
| w0 | 0.587870+j0.405339 | 0.453023+j0.266260 | 0.541390+j0.300280 | 0.608698+j0.346004 | 0.611105+j0.349327 | 0.700327+j0.329907 |
| w1 | 0.587870+j0.405339 | 0.453023+j0.266260 | 0.559889+j0.242973 | 0.673707+j0.196861 | 0.675905+j0.148761 | 0.889256+j0.139511 |
| w2 | 0.587870+j0.405339 | 0.453023+j0.266260 | 0.357657+j0.209444 | 0.301149+j0.169680 | 0.259839+j0.153788 | 0.447469+j0.131347 |
| w3 | 0.587870+j0.405339 | 0.453023+j0.266260 | 0.355882+j0.194677 | 0.302029+j0.151421 | 0.251152+j0.128725 | 0.138015+j0.101309 |
| w4 | 0.405339+j0.587870 | 0.266260+j0.453023 | 0.300280+j0.541390 | 0.346004+j0.608698 | 0.416770+j0.616005 | 0.448992+j0.566892 |
| w5 | 0.405339+j0.587870 | 0.266260+j0.453023 | 0.242973+j0.559889 | 0.196861+j0.673707 | 0.174887+j0.744087 | 0.142663+j0.669940 |
| w6 | 0.405339+j0.587870 | 0.266260+j0.453023 | 0.209444+j0.357657 | 0.169680+j0.301149 | 0.182356+j0.382221 | 0.343126+j0.358344 |
| w7 | 0.405339+j0.587870 | 0.266260+j0.453023 | 0.194677+j0.355882 | 0.151421+j0.302029 | 0.128870+j0.410674 | 0.121210+j0.363416 |
| w8 | 1.056554+j0.611394 | 1.209224+j0.511520 | 0.949854+j0.564434 | 0.885139+j0.562962 | 0.890899+j0.557418 | 0.889124+j0.602821 |
| w9 | 1.056554+j0.611394 | 1.209224+j0.511520 | 1.067076+j0.274552 | 1.019339+j0.225537 | 1.029624+j0.193508 | 1.233619+j0.212708 |
| w10 | 1.056554+j0.611394 | 1.209224+j0.511520 | 1.265348+j0.819022 | 1.259403+j0.843530 | 1.248726+j0.812443 | 1.067496+j0.962512 |
| w11 | 1.056554+j0.611394 | 1.209224+j0.511520 | 1.452799+j0.300853 | 1.486685+j0.292085 | 1.462453+j0.283106 | 1.394097+j0.591196 |
| w12 | 0.611394+j1.056554 | 0.511520+j1.209224 | 0.564434+j0.949854 | 0.562962+j0.885139 | 0.617897+j0.860530 | 0.563858+j0.843483 |
| w13 | 0.611394+j1.056554 | 0.511520+j1.209224 | 0.274552+j1.067076 | 0.225537+j1.019339 | 0.218691+j1.046861 | 0.194790+j0.974535 |
| w14 | 0.611394+j1.056554 | 0.511520+j1.209224 | 0.819022+j1.265348 | 0.843530+j1.259403 | 0.842216+j1.227794 | 0.673475+j1.223631 |
| w15 | 0.611394+j1.056554 | 0.511520+j1.209224 | 0.300853+j1.452799 | 0.292085+j1.486685 | 0.299603+j1.462746 | 0.230654+j1.362914 |

FIG. 68

| w/CR | 2/16 | 4/16 | 6/16 | 8/16 | 10/16 | 12/16 | 14/16 |
|---|---|---|---|---|---|---|---|
| w0 | 0.690825+j0.585349 | 0.457029+j0.264235 | 0.585930+j0.319930 | 0.581805+j0.334988 | 0.550392+j0.290156 | 0.578370+j0.309447 | 0.556205+j0.306313 |
| w1 | 0.690825+j0.585350 | 0.457029+j0.264235 | 0.579831+j0.315654 | 0.585635+j0.330968 | 0.681112+j0.358142 | 0.721702+j0.389496 | 0.698107+j0.361975 |
| w2 | 0.690827+j0.585349 | 0.457029+j0.264235 | 0.629024+j0.217617 | 0.638661+j0.155525 | 0.601303+j0.115783 | 0.660123+j0.174184 | 0.583112+j0.186592 |
| w3 | 0.690826+j0.585349 | 0.457029+j0.264235 | 0.621593+j0.216858 | 0.643156+j0.156558 | 0.768190+j0.154657 | 0.799367+j0.241027 | 0.740611+j0.219107 |
| w4 | 0.690826+j0.585350 | 0.457029+j0.264235 | 0.579831+j0.315654 | 0.582963+j0.340165 | 0.544087+j0.309193 | 0.526085+j0.368822 | 0.497423+j0.421234 |
| w5 | 0.690825+j0.585350 | 0.457029+j0.264235 | 0.574244+j0.311784 | 0.586528+j0.335691 | 0.649801+j0.400611 | 0.630503+j0.500103 | 0.632312+j0.499021 |
| w6 | 0.690827+j0.585349 | 0.457029+j0.264235 | 0.621593+j0.216858 | 0.641671+j0.154211 | 0.602332+j0.106466 | 0.685472+j0.083624 | 0.605376+j0.061678 |
| w7 | 0.690827+j0.585350 | 0.457029+j0.264235 | 0.614800+j0.216139 | 0.645888+j0.155218 | 0.779701+j0.111826 | 0.836826+j0.086747 | 0.761043+j0.074016 |
| w8 | 0.690824+j0.585350 | 0.457029+j0.264235 | 0.313766+j0.177294 | 0.256324+j0.154712 | 0.353588+j0.173948 | 0.421081+j0.189169 | 0.372292+j0.238687 |
| w9 | 0.690824+j0.585350 | 0.457029+j0.264235 | 0.314209+j0.177479 | 0.257740+j0.155093 | 0.142216+j0.108587 | 0.254956+j0.091406 | 0.234548+j0.177704 |
| w10 | 0.690826+j0.585350 | 0.457029+j0.264235 | 0.314479+j0.163373 | 0.253905+j0.133141 | 0.383183+j0.095256 | 0.508228+j0.088452 | 0.438984+j0.152224 |
| w11 | 0.690825+j0.585350 | 0.457029+j0.264235 | 0.314993+j0.163511 | 0.255461+j0.133228 | 0.131151+j0.092101 | 0.086721+j0.072310 | 0.071834+j0.148278 |
| w12 | 0.690825+j0.585350 | 0.457029+j0.264235 | 0.314209+j0.177479 | 0.257989+j0.155663 | 0.353498+j0.175656 | 0.411013+j0.203430 | 0.378135+j0.354399 |
| w13 | 0.690824+j0.585350 | 0.457029+j0.264235 | 0.314645+j0.177662 | 0.259423+j0.156052 | 0.141590+j0.108762 | 0.254446+j0.094768 | 0.234014+j0.058219 |
| w14 | 0.690826+j0.585350 | 0.457029+j0.264235 | 0.314993+j0.163511 | 0.255597+j0.133615 | 0.382409+j0.095366 | 0.515559+j0.071509 | 0.440779+j0.051628 |
| w15 | 0.690826+j0.585350 | 0.457029+j0.264235 | 0.315501+j0.163646 | 0.257175+j0.133701 | 0.130510+j0.092363 | 0.086440+j0.072876 | 0.084467+j0.052398 |
| w16 | 0.585350+j0.690825 | 0.264235+j0.457029 | 0.319930+j0.585930 | 0.379008+j0.600742 | 0.388353+j0.540097 | 0.327555+j0.525982 | 0.338331+j0.660786 |
| w17 | 0.585350+j0.690826 | 0.264235+j0.457029 | 0.315654+j0.579831 | 0.375622+j0.606499 | 0.419487+j0.605548 | 0.382772+j0.675704 | 0.418845+j0.776409 |
| w18 | 0.585351+j0.690825 | 0.264235+j0.457029 | 0.217617+j0.629024 | 0.168779+j0.701232 | 0.183551+j0.653534 | 0.175886+j0.592219 | 0.206352+j0.743684 |
| w19 | 0.585351+j0.690825 | 0.264235+j0.457029 | 0.216858+j0.621593 | 0.176024+j0.703042 | 0.192718+j0.682799 | 0.231337+j0.737121 | 0.278826+j0.886705 |
| w20 | 0.585350+j0.690826 | 0.264235+j0.457029 | 0.315654+j0.579831 | 0.381824+j0.601641 | 0.420648+j0.516710 | 0.406824+j0.473389 | 0.433185+j0.545786 |
| w21 | 0.585350+j0.690826 | 0.264235+j0.457029 | 0.311784+j0.574244 | 0.377966+j0.607168 | 0.478320+j0.574186 | 0.507079+j0.602578 | 0.542935+j0.632044 |
| w22 | 0.585351+j0.690825 | 0.264235+j0.457029 | 0.216858+j0.621593 | 0.162549+j0.708528 | 0.130081+j0.671539 | 0.081174+j0.613265 | 0.065905+j0.768425 |
| w23 | 0.585351+j0.690826 | 0.264235+j0.457029 | 0.216139+j0.614800 | 0.169978+j0.709409 | 0.130631+j0.694276 | 0.083021+j0.767926 | 0.090272+j0.923832 |
| w24 | 0.585349+j0.690826 | 0.264235+j0.457029 | 0.177294+j0.313766 | 0.164033+j0.346721 | 0.254460+j0.369220 | 0.269365+j0.373217 | 0.253830+j0.554022 |
| w25 | 0.585349+j0.690826 | 0.264235+j0.457029 | 0.177479+j0.314209 | 0.164869+j0.347827 | 0.149136+j0.316492 | 0.200539+j0.250430 | 0.176737+j0.283231 |
| w26 | 0.585350+j0.690826 | 0.264235+j0.457029 | 0.163373+j0.314479 | 0.128349+j0.362615 | 0.141602+j0.435973 | 0.109576+j0.442010 | 0.156460+j0.607057 |
| w27 | 0.585350+j0.690826 | 0.264235+j0.457029 | 0.163511+j0.314993 | 0.128793+j0.363810 | 0.099783+j0.370718 | 0.075318+j0.256488 | 0.059053+j0.271040 |
| w28 | 0.585350+j0.690826 | 0.264235+j0.457029 | 0.177479+j0.314209 | 0.165196+j0.349443 | 0.256602+j0.364260 | 0.299438+j0.350712 | 0.295727+j0.448465 |
| w29 | 0.585349+j0.690827 | 0.264235+j0.457029 | 0.177662+j0.314645 | 0.166055+j0.350585 | 0.145729+j0.314336 | 0.205632+j0.245612 | 0.182567+j0.384902 |
| w30 | 0.585351+j0.690826 | 0.264235+j0.457029 | 0.163511+j0.314993 | 0.128552+j0.366258 | 0.131228+j0.437877 | 0.076874+j0.448991 | 0.058840+j0.576445 |
| w31 | 0.585350+j0.690826 | 0.264235+j0.457029 | 0.163646+j0.315501 | 0.129002+j0.367499 | 0.095964+j0.371670 | 0.072444+j0.254884 | 0.061187+j0.420342 |
| w32 | 0.837320+j0.692111 | 1.210202+j0.506671 | 0.915494+j0.562969 | 0.875123+j0.541294 | 1.015975+j0.544514 | 1.010495+j0.556385 | 1.003447+j0.483696 |

FIG. 69

| | | | | | | | |
|---|---|---|---|---|---|---|---|
| w33 | 0.837320+j0.692111 | 1.210202+j0.506671 | 0.899840+j0.548599 | 0.857263+j0.483450 | 0.865222+j0.447384 | 0.861166+j0.469956 | 0.845525+j0.420972 |
| w34 | 0.837322+j0.692111 | 1.210202+j0.506671 | 1.041461+j0.244937 | 1.005452+j0.192113 | 1.128584+j0.334833 | 1.106160+j0.346451 | 1.062454+j0.293134 |
| w35 | 0.837322+j0.692111 | 1.210202+j0.506671 | 1.020188+j0.244325 | 0.959325+j0.208138 | 0.956829+j0.243316 | 0.944992+j0.295093 | 0.896494+j0.255193 |
| w36 | 0.837321+j0.692112 | 1.210202+j0.506671 | 0.899840+j0.548599 | 0.835873+j0.546548 | 0.880528+j0.680960 | 0.975484+j0.737255 | 0.913205+j0.665202 |
| w37 | 0.837320+j0.692112 | 1.210202+j0.506671 | 0.883121+j0.533505 | 0.820382+j0.497932 | 0.787015+j0.549425 | 0.745110+j0.618549 | 0.767362+j0.579003 |
| w38 | 0.837323+j0.692111 | 1.210202+j0.506671 | 1.020188+j0.244325 | 0.978090+j0.164900 | 1.176544+j0.123217 | 1.156123+j0.117857 | 1.090971+j0.098120 |
| w39 | 0.837322+j0.692112 | 1.210202+j0.506671 | 0.997866+j0.243471 | 0.934838+j0.182858 | 0.984649+j0.117137 | 0.989858+j0.099899 | 0.921093+j0.085363 |
| w40 | 0.837319+j0.692112 | 1.210202+j0.506671 | 1.151606+j0.765652 | 1.146306+j0.718300 | 1.215598+j0.699359 | 1.191952+j0.656926 | 1.187342+j0.536796 |
| w41 | 0.837318+j0.692112 | 1.210202+j0.506671 | 1.215021+j0.808778 | 1.291524+j0.653771 | 1.470503+j0.909385 | 1.428402+j0.781680 | 1.372857+j0.669123 |
| w42 | 0.837321+j0.692111 | 1.210202+j0.506671 | 1.352982+j0.268569 | 1.334471+j0.242999 | 1.345613+j0.437140 | 1.302908+j0.407617 | 1.251173+j0.323729 |
| w43 | 0.837320+j0.692112 | 1.210202+j0.506671 | 1.427958+j0.282998 | 1.395846+j0.389207 | 1.641491+j0.562622 | 1.558455+j0.483525 | 1.461132+j0.407370 |
| w44 | 0.837320+j0.692112 | 1.210202+j0.506671 | 1.215021+j0.808778 | 1.124883+j0.844081 | 1.036455+j0.904332 | 1.034030+j0.874552 | 1.088040+j0.742804 |
| w45 | 0.837319+j0.692113 | 1.210202+j0.506671 | 1.479922+j0.989013 | 1.534980+j0.961645 | 1.216171+j1.212947 | 1.241676+j1.044629 | 1.239054+j0.916396 |
| w46 | 0.837322+j0.692112 | 1.210202+j0.506671 | 1.427958+j0.282998 | 1.404319+j0.139223 | 1.412229+j0.146603 | 1.360208+j0.138162 | 1.281447+j0.108014 |
| w47 | 0.837321+j0.692112 | 1.210202+j0.506671 | 1.747630+j0.343683 | 1.784855+j0.324115 | 1.729269+j0.190765 | 1.625172+j0.163628 | 1.504307+j0.136707 |
| w48 | 0.692112+j0.837321 | 0.506671+j1.210202 | 0.562969+j0.915494 | 0.608985+j0.850637 | 0.520270+j0.894599 | 0.523810+j0.993510 | 0.639937+j0.977245 |
| w49 | 0.692111+j0.837321 | 0.506671+j1.210202 | 0.548599+j0.899840 | 0.551777+j0.870592 | 0.483940+j0.849621 | 0.448217+j0.829659 | 0.537002+j0.852344 |
| w50 | 0.692113+j0.837320 | 0.506671+j1.210202 | 0.244937+j1.041461 | 0.190487+j1.082774 | 0.232928+j0.985823 | 0.321209+j1.067223 | 0.455568+j1.065457 |
| w51 | 0.692113+j0.837321 | 0.506671+j1.210202 | 0.244325+j1.020188 | 0.244881+j1.048792 | 0.257181+j0.965383 | 0.276744+j0.893825 | 0.281384+j1.059541 |
| w52 | 0.692112+j0.837321 | 0.506671+j1.210202 | 0.548599+j0.899840 | 0.610952+j0.803882 | 0.694953+j0.796701 | 0.710545+j0.883461 | 0.792733+j0.832232 |
| w53 | 0.692112+j0.837322 | 0.506671+j1.210202 | 0.533506+j0.883121 | 0.555010+j0.811974 | 0.623283+j0.720032 | 0.605159+j0.738080 | 0.662410+j0.724582 |
| w54 | 0.692114+j0.837321 | 0.506671+j1.210202 | 0.244325+j1.020188 | 0.168637+j1.002744 | 0.107876+j0.949063 | 0.108346+j1.104517 | 0.105974+j1.274300 |
| w55 | 0.692113+j0.837321 | 0.506671+j1.210202 | 0.243471+j0.997866 | 0.205501+j0.980310 | 0.122236+j0.924513 | 0.093597+j0.927820 | 0.098152+j1.088542 |
| w56 | 0.692111+j0.837322 | 0.506671+j1.210202 | 0.765652+j1.151606 | 0.811871+j1.077059 | 0.834215+j1.095182 | 0.816510+j1.185736 | 0.775759+j1.106874 |
| w57 | 0.692110+j0.837322 | 0.506671+j1.210202 | 0.808778+j1.215021 | 0.708577+j1.212442 | 0.555938+j1.212930 | 0.741498+j1.425730 | 0.816189+j1.333815 |
| w58 | 0.692112+j0.837321 | 0.506671+j1.210202 | 0.268569+j1.352982 | 0.232238+j1.415900 | 0.134887+j1.326783 | 0.376428+j1.273967 | 0.549851+j1.233599 |
| w59 | 0.692112+j0.837321 | 0.506671+j1.210202 | 0.282998+j1.427958 | 0.447381+j1.368136 | 0.343747+j1.293003 | 0.452484+j1.534369 | 0.549193+j1.472735 |
| w60 | 0.692111+j0.837322 | 0.506671+j1.210202 | 0.808778+j1.215021 | 0.945797+j1.067632 | 0.842609+j1.029273 | 0.838816+j1.052224 | 0.952209+j0.936182 |
| w61 | 0.692111+j0.837322 | 0.506671+j1.210202 | 0.989012+j1.479922 | 1.098653+j1.408274 | 0.867471+j1.388566 | 1.008623+j1.261597 | 1.056456+j1.143504 |
| w62 | 0.692113+j0.837322 | 0.506671+j1.210202 | 0.282998+j1.427958 | 0.188583+j1.727023 | 0.174737+j1.671315 | 0.126520+j1.317668 | 0.319114+j1.324413 |
| w63 | 0.692113+j0.837322 | 0.506671+j1.210202 | 0.343683+j1.747630 | 0.657638+j1.731517 | 0.546701+j1.623153 | 0.151986+j1.588069 | 0.151901+j1.531081 |

FIG. 70

| u/CR | 3/16 | 5/16 | 7/16 | 9/16 | 11/16 | 13/16 |
|---|---|---|---|---|---|---|
| u0 | 0.964850 | 0.746358 | 0.682758 | 0.720492 | 0.718420 | 0.741203 |
| u1 | 0.964851 | 0.724327 | 0.689494 | 0.745635 | 0.785950 | 0.837561 |
| u2 | 0.964850 | 0.701244 | 0.614079 | 0.578601 | 0.566863 | 0.571567 |
| u3 | 0.964851 | 0.724852 | 0.608604 | 0.578878 | 0.591711 | 0.652725 |
| u4 | 0.964851 | 1.089143 | 1.229555 | 1.234916 | 1.228615 | 1.196834 |
| u5 | 0.964851 | 1.487807 | 1.519290 | 1.511816 | 1.446265 | 1.354509 |
| u6 | 0.964851 | 1.016430 | 0.952184 | 0.929933 | 0.919117 | 0.944049 |
| u7 | 0.964851 | 0.981269 | 1.010198 | 1.008385 | 1.055715 | 1.062656 |
| u8 | 0.262799 | 0.188668 | 0.119570 | 0.131917 | 0.179189 | 0.158838 |
| u9 | 0.262799 | 0.187756 | 0.119309 | 0.132245 | 0.179229 | 0.216557 |
| u10 | 0.262799 | 0.183302 | 0.122704 | 0.095129 | 0.060071 | 0.034740 |
| u11 | 0.262799 | 0.184133 | 0.122986 | 0.094858 | 0.060040 | 0.089245 |
| u12 | 0.262799 | 0.299163 | 0.361306 | 0.393581 | 0.431407 | 0.422770 |
| u13 | 0.262799 | 0.295502 | 0.360929 | 0.392102 | 0.437930 | 0.493766 |
| u14 | 0.262799 | 0.306233 | 0.349187 | 0.316988 | 0.303511 | 0.286845 |
| u15 | 0.262799 | 0.310441 | 0.349698 | 0.317410 | 0.304552 | 0.350258 |

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

B

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 72

| u/CR | 2/16 | 4/16 | 6/16 | 8/16 | 10/16 | 12/16 | 14/16 |
|---|---|---|---|---|---|---|---|
| u0 | 0.951821 | 0.772242 | 0.670816 | 0.720040 | 0.687860 | 0.725026 | 0.776914 |
| u1 | 0.951821 | 0.755105 | 0.671187 | 0.717092 | 0.687453 | 0.682522 | 0.731844 |
| u2 | 0.951821 | 0.733323 | 0.684394 | 0.742371 | 0.784311 | 0.833407 | 0.872060 |
| u3 | 0.951821 | 0.748492 | 0.683930 | 0.746130 | 0.778844 | 0.779595 | 0.823606 |
| u4 | 0.951821 | 0.762565 | 0.601258 | 0.568017 | 0.529234 | 0.542187 | 0.605096 |
| u5 | 0.951821 | 0.741006 | 0.601273 | 0.568434 | 0.529245 | 0.530376 | 0.565319 |
| u6 | 0.951821 | 0.771170 | 0.594244 | 0.571550 | 0.587945 | 0.627093 | 0.688258 |
| u7 | 0.951821 | 0.797312 | 0.594239 | 0.571162 | 0.588065 | 0.601059 | 0.646057 |
| u8 | 0.951821 | 1.144458 | 1.253351 | 1.234492 | 1.288591 | 1.273237 | 1.213263 |
| u9 | 0.951821 | 1.153922 | 1.197825 | 1.174495 | 1.172818 | 1.182640 | 1.148415 |
| u10 | 0.951821 | 1.658369 | 1.695168 | 1.675628 | 1.610570 | 1.491684 | 1.361829 |
| u11 | 0.951821 | 1.306308 | 1.431932 | 1.433385 | 1.432017 | 1.374447 | 1.283388 |
| u12 | 0.951821 | 0.910861 | 0.932278 | 0.907903 | 0.905961 | 0.956192 | 0.974968 |
| u13 | 0.951821 | 0.864684 | 0.935172 | 0.914425 | 0.885027 | 0.892801 | 0.922447 |
| u14 | 0.951821 | 0.903549 | 0.990523 | 1.005079 | 1.064442 | 1.100380 | 1.087536 |
| u15 | 0.951821 | 0.940034 | 0.989938 | 0.980523 | 1.006622 | 1.025215 | 1.029882 |
| u16 | 0.306654 | 0.215961 | 0.115733 | 0.153556 | 0.169392 | 0.148680 | 0.177357 |
| u17 | 0.306654 | 0.220732 | 0.115734 | 0.153554 | 0.169393 | 0.148677 | 0.145054 |
| u18 | 0.306654 | 0.224176 | 0.115606 | 0.153573 | 0.172311 | 0.209035 | 0.243373 |
| u19 | 0.306654 | 0.219360 | 0.115605 | 0.153576 | 0.172310 | 0.209018 | 0.210474 |
| u20 | 0.306654 | 0.196638 | 0.116628 | 0.075094 | 0.056177 | 0.029660 | 0.047926 |
| u21 | 0.306654 | 0.200750 | 0.116629 | 0.075095 | 0.056177 | 0.029660 | 0.016211 |
| u22 | 0.306654 | 0.197697 | 0.116766 | 0.075098 | 0.057134 | 0.088798 | 0.112331 |
| u23 | 0.306654 | 0.193649 | 0.116765 | 0.075098 | 0.057134 | 0.088798 | 0.080421 |
| u24 | 0.306654 | 0.263498 | 0.361114 | 0.411488 | 0.400665 | 0.399082 | 0.451783 |
| u25 | 0.306654 | 0.268956 | 0.361058 | 0.411542 | 0.400670 | 0.397734 | 0.415679 |
| u26 | 0.306654 | 0.272340 | 0.359367 | 0.411127 | 0.427709 | 0.467702 | 0.526543 |
| u27 | 0.306654 | 0.266958 | 0.359424 | 0.411075 | 0.427698 | 0.463378 | 0.488786 |
| u28 | 0.306654 | 0.299845 | 0.342823 | 0.304005 | 0.283846 | 0.270711 | 0.310792 |
| u29 | 0.306654 | 0.305269 | 0.342769 | 0.303985 | 0.283843 | 0.270625 | 0.277078 |
| u30 | 0.306654 | 0.302366 | 0.344552 | 0.303827 | 0.293434 | 0.333743 | 0.380080 |
| u31 | 0.306654 | 0.296777 | 0.344606 | 0.303847 | 0.293437 | 0.333375 | 0.345309 |

FIG. 73

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{0,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 74

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 76

| Modulation | Rows in Part 1 $N_{part1}$ | Rows in Part 2 $N_{part2}$ | Columns m |
|---|---|---|---|
| QPSK | 69120 | 0 | 2 |
| 16QAM | 69120 | 0 | 4 |
| 64QAM | 69120 | 0 | 6 |
| 256QAM | 69120 | 0 | 8 |
| 1024QAM | 68400 | 720 | 10 |
| 4096QAM | 69120 | 0 | 12 |

FIG. 78

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

| | | | | | | | | | | | | | | | | | | | | | |
|---|---|---|---|---|---|---|---|---|---|---|---|---|---|---|---|---|---|---|---|---|---|
| 191 | 12 | 188 | 25 | 72 | 119 | 166 | 146 | 132 | 15 | 51 | 48 | 113 | 161 | 91 | 189 | 142 | 93 | 120 | 29 | 156 | 101 |
| 100 | 22 | 165 | 65 | 98 | 153 | 127 | 74 | 106 | 80 | 38 | 56 | 148 | 81 | 13 | 68 | 125 | 0 | 174 | 140 | 124 | 157 |
| 83 | 3 | 104 | 136 | 63 | 162 | 39 | 8 | 158 | 182 | 178 | 90 | 96 | 78 | 168 | 172 | 16 | 64 | 69 | 102 | 45 | 66 |
| 86 | 46 | 163 | 61 | 152 | 164 | 79 | 9 | 111 | 181 | 177 | 53 | 94 | 85 | 173 | 32 | 171 | 184 | 117 | 30 | 110 | 34 |
| 70 | 137 | 5 | 109 | 73 | 41 | 131 | 187 | 185 | 18 | 4 | 150 | 92 | 143 | 14 | 115 | 20 | 50 | 26 | 24 | 36 | 58 |
| 169 | 107 | 129 | 121 | 43 | 103 | 21 | 139 | 52 | 167 | 19 | 2 | 40 | 116 | 128 | 6 | 42 | 17 | 33 | 11 | 135 | 1 |
| 130 | 123 | 180 | 149 | 108 | 75 | 183 | 82 | 23 | 37 | 88 | 67 | 176 | 76 | 35 | 71 | 105 | 87 | 77 | 147 | 55 | 62 |
| 44 | 57 | 97 | 122 | 112 | 59 | 27 | 99 | 118 | 10 | 134 | 141 | 114 | 144 | 49 | 28 | 126 | 95 | 7 | 54 | 186 | 84 |
| 151 | 145 | 175 | 138 | 133 | 31 | 179 | 89 | 155 | 160 | 170 | 60 | 154 | 159 | 47 | 190 | | | | | | |

TRANSMISSION DEVICE, TRANSMISSION METHOD, RECEPTION DEVICE, AND RECEPTION METHOD

CROSS-REFERENCE TO RELATED APPLICATIONS

This application is a National Stage Application of International Application No. PCT/JP2018/038586, filed Oct. 17, 2018, which claims priority to Japanese Patent Application No. 2017-209878, filed Oct. 31, 2017. The benefit of priority is claimed to each of the foregoing.

TECHNICAL FIELD

The present technology relates to a transmission device, a transmission method, a reception device, and a reception method, and more particularly to, for example, a transmission device, a transmission method, a reception device, and a reception method for securing favorable communication quality in data transmission using an LDPC code.

BACKGROUND ART

Low density parity check (LDPC) codes have high error correction capability and are in recent years widely adopted in transmission systems for digital broadcasting and the like, such as the digital video broadcasting (DVB)-S.2 in Europe and the like, DVB-T.2, DVB-C.2, and the advanced television systems committee (ATSC) 3.0 in the United States, and the like, for example (see, for example, Non-Patent Document 1).

With recent researches, it has been found that the LDPC codes are able to obtain performance close to the Shannon limit as the code length is increased, similarly to turbo codes and the like. Furthermore, the LDPC codes have a property that the minimum distance is proportional to the code length and thus have a good block error probability characteristic, as characteristics. Moreover, a so-called error floor phenomenon observed in decoding characteristics of turbo codes and the like hardly occur, which is also an advantage.

CITATION LIST

Non-Patent Document

Non-Patent Document 1: ATSC Standard: Physical Layer Protocol (A/322), 7 Sep. 2016

SUMMARY OF THE INVENTION

Problems to be Solved by the Invention

In data transmission using an LDPC code, for example, the LDPC code is symbols (symbolized) of quadrature modulation (digital modulation) such as quadrature phase shift keying (QPSK), and the symbols are mapped at signal points of the quadrature modulation and are sent.

The data transmission using an LDPC code is spreading worldwide and is required to secure favorable communication (transmission) quality.

The present technology has been made in view of such a situation, and aims to secure favorable communication quality in data transmission using an LDPC code.

Solutions to Problems

A first transmission device/transmission method of the present technology is a transmission device/transmission method including: an encoding unit/step of performing LDPC coding on the basis of a parity check matrix of an LDPC code with a code length N of 17280 bits and a coding rate r of 13/16, in which the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 225 274 898 916 1020 1055 1075 1179 1185 1343 1376 1569 1828 1972 2852 2957 3183
548 602 628 928 1077 1474 1557 1598 1935 1981 2110 2472 2543 2594 2721 2884 2981
59 69 518 900 1158 1325 1367 1480 1744 2069 2119 2406 2757 2883 2914 2966
3232 1330 1369 1712 2133 2206 2487 2596 2606 2612 2666 2726 2733 2754 2811 2948 3030
391 542 689 748 810 1716 1927 2006 2296 2340 2357 2514 2797 2887 2896 3226
256 410 799 1126 1377 1409 1518 1619 1829 2037 2303 2324 2472 2475 2874 2992
862 1522 1905
809 842 945
561 1001 2857
2132 2592 2905
217 401 1894
11 30 1860
210 1188 2418
1372 2273 2455
407 2537 2962
939 2401 2677
2521 3077 3173
1374 2250 2423
23 188 1320
472 714 2144
2727 2755 2887
1814 2824 2852
148 1695 1845
595 1059 2702
1879 2480 2578
17 411 559
146 783 2154
951 1391 1979
1507 1613 3106
642 882 2356
1008 1324 3125
196 1794 2474
1129 1544 2931
765 1681 2591
1550 1936 3048
1596 1607 2794
156 1053 2926
1246 1996 3179
348 752 1943.

In the first transmission device and the first transmission method of the present technology, the LDPC coding is performed on the basis of the parity check matrix of the LDPC code with the code length N of 17280 bits and the coding rate r of 13/16. The LDPC code includes the information bits and parity bits, the parity check matrix includes the information matrix portion corresponding to the information bits and the parity matrix portion corresponding to the parity bits, the information matrix portion is represented by the parity check matrix initial value table, and the parity check matrix initial value table is a table representing positions of elements of 1 of the information matrix portion for every 360 columns, and is 225 274 898 916 1020 1055 1075 1179 1185 1343 1376 1569 1828 1972 2852 2957 3183

548 602 628 928 1077 1474 1557 1598 1935 1981 2110 2472 2543 2594 2721 2884 2981

59 69 518 900 1158 1325 1367 1480 1744 2069 2119 2406 2757 2883 2914 2966 3232

1330 1369 1712 2133 2206 2487 2596 2606 2612 2666 2726 2733 2754 2811 2948 3030

391 542 689 748 810 1716 1927 2006 2296 2340 2357 2514 2797 2887 2896 3226

256 410 799 1126 1377 1409 1518 1619 1829 2037 2303 2324 2472 2475 2874 2992

862 1522 1905

809 842 945

561 1001 2857

2132 2592 2905

217 401 1894

11 30 1860

210 1188 2418

1372 2273 2455

407 2537 2962

939 2401 2677

2521 3077 3173

1374 2250 2423

23 188 1320

472 714 2144

2727 2755 2887

1814 2824 2852

148 1695 1845

595 1059 2702

1879 2480 2578

17 411 559

146 783 2154

951 1391 1979

1507 1613 3106

642 882 2356

1008 1324 3125

196 1794 2474

1129 1544 2931

765 1681 2591

1550 1936 3048

1596 1607 2794

156 1053 2926

1246 1996 3179

348 752 1943.

A first reception device/reception method of the present technology is a reception device/reception method including: a decoding unit/step of decoding an LDPC code with a code length N of 17280 bits and a coding rate r of 13/16, the LDPC code being obtained from data transmitted by a transmission method including an encoding step of performing LDPC coding on the basis of a parity check matrix of the LDPC code, in which the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 225 274 898 916 1020 1055 1075 1179 1185 1343 1376 1569 1828 1972 2852 2957 3183

548 602 628 928 1077 1474 1557 1598 1935 1981 2110 2472 2543 2594 2721 2884 2981

59 69 518 900 1158 1325 1367 1480 1744 2069 2119 2406 2757 2883 2914 2966 3232

1330 1369 1712 2133 2206 2487 2596 2606 2612 2666 2726 2733 2754 2811 2948 3030

391 542 689 748 810 1716 1927 2006 2296 2340 2357 2514 2797 2887 2896 3226

256 410 799 1126 1377 1409 1518 1619 1829 2037 2303 2324 2472 2475 2874 2992

862 1522 1905

809 842 945

561 1001 2857

2132 2592 2905

217 401 1894

11 30 1860

210 1188 2418

1372 2273 2455

407 2537 2962

939 2401 2677

2521 3077 3173

1374 2250 2423

23 188 1320

472 714 2144

2727 2755 2887

1814 2824 2852

148 1695 1845

595 1059 2702

1879 2480 2578

17 411 559

146 783 2154

951 1391 1979

1507 1613 3106

642 882 2356

1008 1324 3125

196 1794 2474

1129 1544 2931

765 1681 2591

1550 1936 3048

1596 1607 2794

156 1053 2926

1246 1996 3179

348 752 1943.

In the first reception device and the first reception method of the present technology, the LDPC code obtained from the data transmitted by the first transmission method is decoded.

A second transmission device/transmission method of the present technology is a transmission device/transmission method including: an encoding unit/step of performing LDPC coding on the basis of a parity check matrix of an LDPC code with a code length N of 17280 bits and a coding rate r of 14/16, in which the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 337 376 447 504 551 864 872 975 1136 1225 1254 1271 1429 1478 1870 2122

58 121 163 365 515 534 855 889 1083 1122 1190 1448 1476 1635 1691 1954

247 342 395 454 479 665 674 1033 1041 1198 1300 1484 1680 1941 2096 2121

80 487 500 513 661 970 1038 1095 1109 1133 1416 1545 1696 1992 2051 2089
32 101 205 413 568 712 714 944 1329 1669 1703 1826 1904 1908 2014 2097
142 201 491 838 860 954 960 965 997 1027 1225 1488 1502 1521 1737 1804
453 1184 1542
10 781 1709
497 903 1546
1080 1640 1861
1198 1616 1817
771 978 2089
369 1079 1348
980 1788 1987
1495 1900 2015
27 540 1070
200 1771 1962
863 988 1329
674 1321 2152
807 1458 1727
844 867 1628
227 546 1027
408 926 1413
361 982 2087
1247 1288 1392
1051 1070 1281
325 452 467
1116 1672 1833
21 236 1267
504 856 2123
398 775 1912
1056 1529 1701
143 930 1186
553 1029 1040
303 653 1308
877 992 1174
1083 1134 1355
298 404 709
970 1272 1799
296 1017 1873
105 780 1418
682 1247 1867.

In the second transmission device and the second transmission method of the present technology, the LDPC coding is performed on the basis of the parity check matrix of the LDPC code with the code length N of 17280 bits and the coding rate r of 14/16. The LDPC code includes the information bits and parity bits, the parity check matrix includes the information matrix portion corresponding to the information bits and the parity matrix portion corresponding to the parity bits, the information matrix portion is represented by the parity check matrix initial value table, and the parity check matrix initial value table is a table representing positions of elements of 1 of the information matrix portion for every 360 columns, and is 337 376 447 504 551 864 872 975 1136 1225 1254 1271 1429 1478 1870 2122
58 121 163 365 515 534 855 889 1083 1122 1190 1448 1476 1635 1691 1954
247 342 395 454 479 665 674 1033 1041 1198 1300 1484 1680 1941 2096 2121
80 487 500 513 661 970 1038 1095 1109 1133 1416 1545 1696 1992 2051 2089
32 101 205 413 568 712 714 944 1329 1669 1703 1826 1904 1908 2014 2097
142 201 491 838 860 954 960 965 997 1027 1225 1488 1502 1521 1737 1804
453 1184 1542
10 781 1709
497 903 1546
1080 1640 1861
1198 1616 1817
771 978 2089
369 1079 1348
980 1788 1987
1495 1900 2015
27 540 1070
200 1771 1962
863 988 1329
674 1321 2152
807 1458 1727
844 867 1628
227 546 1027
408 926 1413
361 982 2087
1247 1288 1392
1051 1070 1281
325 452 467
1116 1672 1833
21 236 1267
504 856 2123
398 775 1912
1056 1529 1701
143 930 1186
553 1029 1040
303 653 1308
877 992 1174
1083 1134 1355
298 404 709
970 1272 1799
296 1017 1873
105 780 1418
682 1247 1867.

A second reception device/reception method of the present technology is a reception device/reception method including: a decoding unit/step of decoding an LDPC code with a code length N of 17280 bits and a coding rate r of 14/16, the LDPC code being obtained from data transmitted by a transmission method including an encoding step of performing LDPC coding on the basis of a parity check matrix of the LDPC code, in which the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 337 376 447 504 551 864 872 975 1136 1225 1254 1271 1429 1478 1870 2122
58 121 163 365 515 534 855 889 1083 1122 1190 1448 1476 1635 1691 1954
247 342 395 454 479 665 674 1033 1041 1198 1300 1484 1680 1941 2096 2121
80 487 500 513 661 970 1038 1095 1109 1133 1416 1545 1696 1992 2051 2089
32 101 205 413 568 712 714 944 1329 1669 1703 1826 1904 1908 2014 2097
142 201 491 838 860 954 960 965 997 1027 1225 1488 1502 1521 1737 1804
453 1184 1542
10 781 1709
497 903 1546

1080 1640 1861
1198 1616 1817
771 978 2089
369 1079 1348
980 1788 1987
1495 1900 2015
27 540 1070
200 1771 1962
863 988 1329
674 1321 2152
807 1458 1727
844 867 1628
227 546 1027
408 926 1413
361 982 2087
1247 1288 1392
1051 1070 1281
325 452 467
1116 1672 1833
21 236 1267
504 856 2123
398 775 1912
1056 1529 1701
143 930 1186
553 1029 1040
303 653 1308
877 992 1174
1083 1134 1355
298 404 709
970 1272 1799
296 1017 1873
105 780 1418
682 1247 1867.

In the second reception device and the second reception method of the present technology, the LDPC code obtained from the data transmitted by the second transmission method is decoded.

Note that the transmission device and the reception device may be independent devices or may be internal blocks configuring one device.

Effects of the Invention

According to the present technology, good communication quality can be secured in data transmission using an LDPC code.

Note that effects described here are not necessarily limited, and any of effects described in the present disclosure may be exhibited.

BRIEF DESCRIPTION OF DRAWINGS

FIG. 3 is a diagram illustrating an example of a parity check matrix of an LDPC code.

FIG. 13 is a diagram for describing a parity check matrix of an LDPC code defined in the standard of DVB-T.2.

FIG. 15 is a diagram illustrating examples of a parity matrix $H_T$ having a step structure and a Tanner graph corresponding to the parity matrix $H_T$.

FIG. 30 is a diagram illustrating an example of a parity check matrix initial value table of a type A code with N=17280 bits and r=2/16.

FIG. 31 is a diagram illustrating an example of a parity check matrix initial value table of a type A code with N=17280 bits and r=3/16.

FIG. 32 is a diagram illustrating an example of a parity check matrix initial value table of a type A code with N=17280 bits and r=4/16.

FIG. 33 is a diagram illustrating an example of a parity check matrix initial value table of a type A code with N=17280 bits and r=5/16.

FIG. 34 is a diagram illustrating an example of a parity check matrix initial value table of a type A code with N=17280 bits and r=6/16.

FIG. 35 is a diagram illustrating an example of a parity check matrix initial value table of a type A code with N=17280 bits and r=7/16.

FIG. 36 is a diagram illustrating an example of a parity check matrix initial value table of a type B code with N=17280 bits and r=7/16.

FIG. 37 is a diagram illustrating an example of a parity check matrix initial value table of a type B code with N=17280 bits and r=8/16.

FIG. 38 is a diagram illustrating an example of a parity check matrix initial value table of a type B code with N=17280 bits and r=9/16.

FIG. 39 is a diagram illustrating an example of a parity check matrix initial value table of a type B code with N=17280 bits and r=10/16.

FIG. 40 is a diagram illustrating an example of a parity check matrix initial value table of a type B code with N=17280 bits and r=11/16.

FIG. 41 is a diagram illustrating an example of a parity check matrix initial value table of a type B code with N=17280 bits and r=12/16.

FIG. 42 is a diagram illustrating an example of a parity check matrix initial value table of a type B code with N=17280 bits and r=13/16.

FIG. 43 is a diagram illustrating an example of a parity check matrix initial value table of a type B code with N=17280 bits and r=14/16.

FIG. 47 is a diagram for describing parity check matrices by the type A method.

FIG. 49 is a diagram for describing parity check matrices by the type B method.

FIG. 50 is a diagram illustrating examples of a coordinate of a signal point of UC in a case where a modulation method is QPSK.

FIG. 51 is a diagram illustrating examples of a coordinate of a signal point of 2D-NUC in a case where the modulation method is 16QAM.

FIG. 52 is a diagram illustrating examples of a coordinate of a signal point of 1D-NUC in a case where the modulation method is 1024QAM.

FIG. 53 is a diagram illustrating a relationship between a symbol y of 1024QAM and a position vector u.

FIG. 54 is a diagram illustrating examples of a coordinate $z_q$ of a signal point of QPSK-UC.

FIG. 55 is a diagram illustrating examples of a coordinate $z_q$ of a signal point of QPSK-UC.

FIG. 56 is a diagram illustrating examples of a coordinate $z_q$ of a signal point of 16QAM-UC.

FIG. 57 is a diagram illustrating examples of a coordinate $z_q$ of a signal point of 16QAM-UC.

FIG. 58 is a diagram illustrating examples of a coordinate $z_q$ of a signal point of 64QAM-UC.

FIG. 59 is a diagram illustrating examples of a coordinate $z_q$ of a signal point of 64QAM-UC.

FIG. 60 is a diagram illustrating examples of a coordinate $z_q$ of a signal point of 256QAM-UC.

FIG. 61 is a diagram illustrating examples of a coordinate $z_q$ of a signal point of 256QAM-UC.

FIG. 62 is a diagram illustrating examples of a coordinate $z_q$ of a signal point of 1024QAM-UC.

FIG. 63 is a diagram illustrating examples of a coordinate $z_q$ of a signal point of 1024QAM-UC.

FIG. 64 is a diagram illustrating examples of a coordinate $z_q$ of a signal point of 4096QAM-UC.

FIG. 65 is a diagram illustrating examples of a coordinate $z_q$ of a signal point of 4096QAM-UC.

FIG. 66 is a diagram illustrating examples of a coordinate $z_s$ of a signal point of 16QAM-2D-NUC.

FIG. 67 is a diagram illustrating examples of a coordinate $z_s$ of a signal point of 64QAM-2D-NUC.

FIG. 68 is a diagram illustrating examples of a coordinate $z_s$ of a signal point of 256QAM-2D-NUC.

FIG. 69 is a diagram illustrating examples of a coordinate $z_s$ of a signal point of 256QAM-2D-NUC.

FIG. 70 is a diagram illustrating examples of a coordinate $z_s$ of a signal point of 1024QAM-1D-NUC.

FIG. 71 is a diagram illustrating a relationship between a symbol y of 1024QAM and a position vector u.

FIG. 72 is a diagram illustrating examples of a coordinate $z_s$ of a signal point of 4096QAM-1D-NUC.

FIG. 73 is a diagram illustrating a relationship between a symbol y of 4096QAM and a position vector u.

FIG. 74 is a diagram illustrating a relationship between a symbol y of 4096QAM and a position vector u.

FIG. 76 is a diagram for describing block interleaving performed by a block interleaver 25.

FIG. 78 is a diagram illustrating an example of a GW pattern for an LDPC code with a code length N of 69120 bits.

MODE FOR CARRYING OUT THE INVENTION

Hereinafter, an embodiment of the present technology will be described. Before the description of the embodiment, an LDPC code will be described.

<LDPC Code>

Note that the LDPC code is a linear code and is not necessarily binary. However, description will be given on the assumption that the LDPC code is binary.

An LDPC code is most characterized in that a parity check matrix defining the LDPC code is sparse. Here, a sparse matrix is a matrix in which the number of "1"s of matrix elements is very small (a matrix in which most elements are 0).

Figure 1:
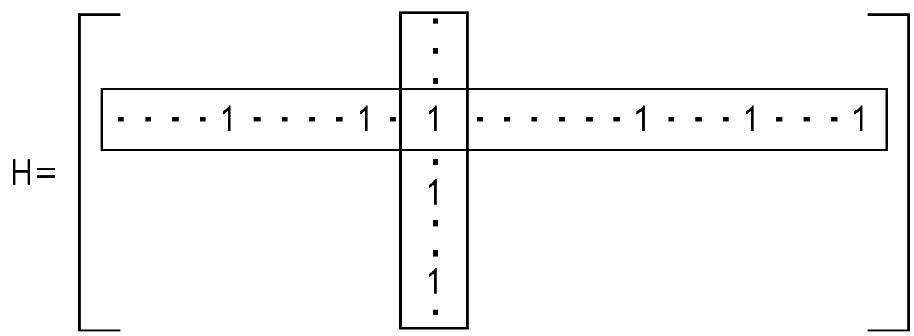
FIG. 1 is a diagram for describing a parity check matrix H of an LDPC code.

FIG. 1 is a diagram illustrating a parity check matrix H of the LDPC code.

In the parity check matrix H in FIG. 1, a weight of each column (column weight) (the number of "1"s) (weight) is "3", and a weight of each row (row weight) is "6".

In coding with an LDPC code (LDPC coding), a codeword (LDPC code) is generated by generating a generator matrix G on the basis of the parity check matrix H and multiplying binary information bits by the generator matrix G, for example.

Specifically, a coding device for performing the LDPC coding first calculates the generator matrix G that holds an expression $GH^T=0$ with a transposed matrix $H^T$ of the parity check matrix H. Here, in a case where the generator matrix G is a K×N matrix, the coding device multiplies the generator matrix G by a bit string (vector u) of information bits including K bits and generates a codeword c (=uG) including N bits. The codeword (LDPC code) generated by the coding device is received at a reception side via a predetermined communication path.

Decoding of the LDPC code can be performed by an algorithm called probabilistic decoding proposed by Gallager, which is a message passing algorithm according to belief propagation on a so-called Tanner graph including a variable node (also called message node) and a check node. Here, as appropriate, the variable node and the check node are hereinafter also simply referred to as nodes.

Figure 2:
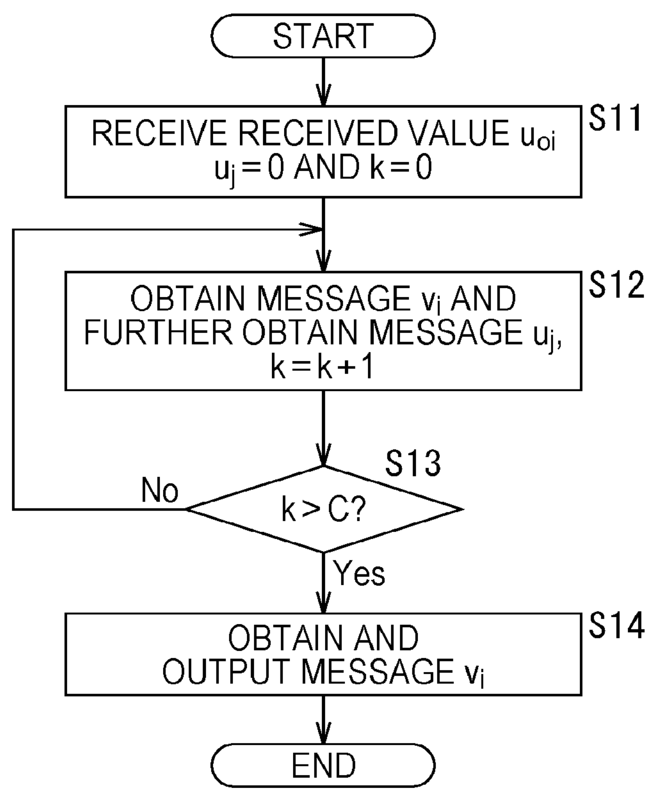
FIG. 2 is a flowchart for describing a procedure of decoding an LDPC code.

FIG. 2 is a flowchart illustrating a procedure of decoding an LDPC code.

Note that, hereinafter, a real value (received LLR) expressing "0" likeliness of a value of an i-th code bit of the LDPC code (1 codeword) received on the reception side, using a log likelihood ratio, is also referred to as a received value $u_{01}$ as appropriate. Furthermore, a message output from the check node is $u_j$ and a message output from the variable node is $v_i$.

First, in decoding the LDPC code, as illustrated in FIG. 2, in step S11, the LDPC code is received, a message (check node message) $u_j$ is initialized to "0", a variable k that is an integer as a counter for repeated processing is initialized to "0", and the processing proceeds to step S12. In step S12, a message (variable node message) $v_i$ is obtained by performing an operation (variable node operation) illustrated in the expression (1) on the basis of the received value $u_{0i}$ obtained by receiving the LDPC code, and moreover, the message $u_j$ is obtained by performing an operation (check node operation) illustrated in the expression (2) on the basis of the message $v_i$.

[Math. 1]

$$v_i = u_{0i} + \sum_{j=1}^{d_v-1} u_j \tag{1}$$

[Math. 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ in the expressions (1) and (2) are arbitrarily selectable parameters respectively indicating the numbers of "1"s in a vertical direction (column) and a cross direction (row) of the parity check matrix H. For example, in the case of the LDPC code ((3, 6) LDPC code) for the parity check matrix H with the column weight of 3 and the row weight of 6 as illustrated in FIG. 1, $d_v=3$ and $d_c=6$.

Note that, in each of the variable node operation in the expression (1) and the check node operation in the expression (2), a message input from an edge (a line connecting the variable node and the check node) that is about to output a message is not an object for the operation. Therefore, an operation range is 1 to $d_v-1$ or 1 to $d_c-1$. Furthermore, the check node operation in the expression (2) is performed by, in practice, creating a table of a function R ($v_1$, $v_2$) illustrated in the expression (3) defined by one output for two inputs $v_1$ and $v_2$, in advance, and continuously (recursively) using the table as illustrated in the expression (4).

[Math. 3]

$$x=2\tan h^{-1}\{\tan h(v_1/2)\tan h(v_2/2)\}=R(v_1,v_2) \tag{3}$$

[Math. 4]

$$u_j=R(v_1,R(v_2,R(v_3, \ldots R(v_{d_c-2},v_{d_c-1})))) \tag{4}$$

In step S12, the variable k is further incremented by "1", and the processing proceeds to step S13. In step S13, whether or not the variable k is larger than a predetermined number of repetitive decoding times C is determined. In a case where the variable k is determined not to be larger than C in step S13, the processing returns to step S12 and hereinafter similar processing is repeated.

Furthermore, in a case where the variable k is determined to be larger than C in step S13, the processing proceeds to step S14, the operation illustrated in the expression (5) is performed to obtain the message $v_i$ as a decoding result to be finally output and the message $v_i$ is output, and the decoding processing for the LDPC code is terminated.

[Math. 5]

$$v_i = u_{0i} + \sum_{j=1}^{d_v} u_j \tag{5}$$

Here, the operation in the expression (5) is performed using messages $u_j$ from all the edges connected to the variable node, differently from the variable node operation in the expression (1).

FIG. 3 is a diagram illustrating an example of the parity check matrix H of a (3, 6) LDPC code (a coding rate of ½ and a code length of 12).

In the parity check matrix H in FIG. 3, as in FIG. 1, the column weight is 3 and the row weight is 6.

Figure 4:
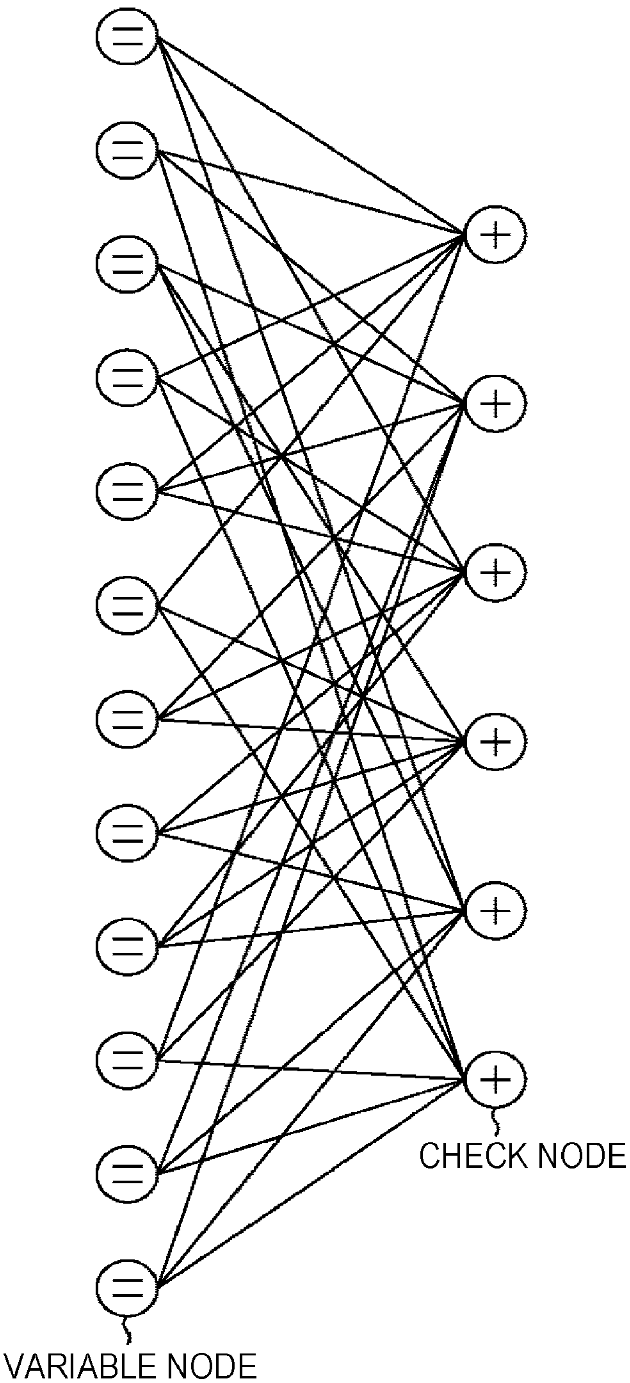
FIG. 4 is a diagram illustrating an example of a Tanner graph of the parity check matrix.

FIG. 4 is a diagram illustrating a Tanner graph of the parity check matrix H in FIG. 3.

Here, in FIG. 4, the check node is represented by plus "+", and the variable node is represented by equal "=". The check node and variable node correspond to a row and a column of the parity check matrix H, respectively. A connection between the check node and the variable node is an edge and corresponds to "1" of an element of the parity check matrix.

In other words, in a case where an element of the j-th row and the i-th column of the parity check matrix is 1, the i-th variable node from the top ("=" node) and the j-th check node from the top ("+" node) are connected by an edge in FIG. 4. The edge indicates that a code bit corresponding to the variable node has a constraint corresponding to the check node.

In a sum product algorithm that is a decoding method of an LDPC code, the variable node operation and the check node operation are repeatedly performed.

Figure 5:
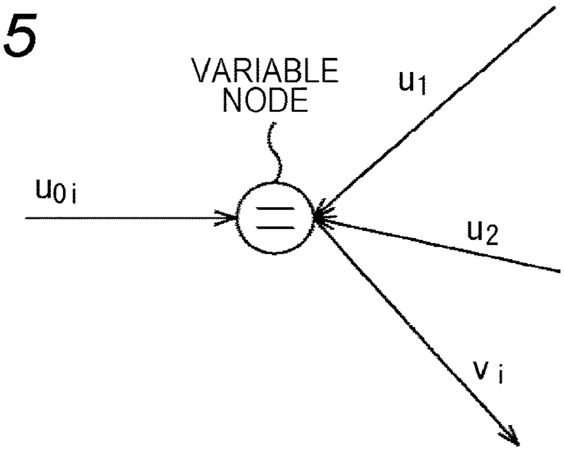
FIG. 5 is a diagram illustrating an example of a variable node.

FIG. 5 is a diagram illustrating the variable node operation performed in the variable node.

In the variable node, the message $v_i$ corresponding to the edge to be calculated is obtained by the variable node operation in the expression (1) using messages $u_1$ and $u_2$ from the remaining edges connected to the variable node and the received value $u_{01}$. Messages corresponding to other edges are similarly obtained.

Figure 6:
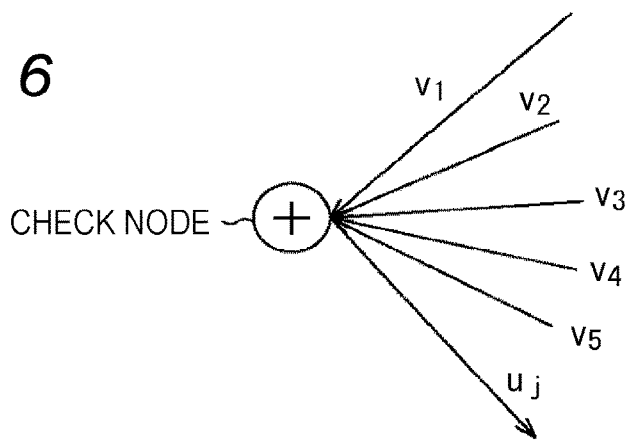
FIG. 6 is a diagram illustrating an example of a check node.

FIG. 6 is a diagram illustrating the check node operation performed in the check node.

Here, the check node operation in the expression (2) can be rewritten to the expression (6), using a relationship of an expression a×b=exp{ln(|a|)+ln(|b|)}×sign (a)×sign (b). Note that sign (x) is 1 when x≥0 and −1 when x<0.

[Math. 6]

$$u_j = 2\tanh^{-1}\left(\prod_{i=1}^{d_c-1}\tanh\left(\frac{v_i}{2}\right)\right) = 2\tanh^{-1}\left[\exp\left\{\sum_{i=1}^{d_c-1}\ln\left(\left|\tanh\left(\frac{v_i}{2}\right)\right|\right)\right\}\times\prod_{i=1}^{d_c-1}\text{sign}\left(\tanh\left(\frac{v_i}{2}\right)\right)\right] = 2\tanh^{-1}\left[\exp\left\{-\left(\sum_{i=1}^{d_c-1}-\ln\left(\tanh\left(\frac{|v_i|}{2}\right)\right)\right)\right\}\right]\times\prod_{i=1}^{d_c-1}\text{sign}(v_i) \tag{6}$$

When the function φ(x) is defined as an expression φ(x)=ln(tan h(x/2)) when x≥0, an expression $\varphi^{-1}(x)=2\tan h^{-1}(e^{-x})$ holds and thus the expression (6) can be deformed into the expression (7).

[Math. 7]

$$u_j = \phi^{-1}\left(\sum_{i=1}^{d_c-1}\phi(|v_i|)\right)\times\prod_{i=1}^{d_c-1}\text{sign}\ (v_i) \tag{7}$$

In the check node, the check node operation in the expression (2) is performed according to the expression (7).

In other words, in the check node, the message $u_j$ corresponding to the edge to be calculated is obtained by the check node operation in the expression (7) using messages $v_1$, $v_2$, $v_3$, $v_4$, and $v_5$ from the remaining edges connected to the check node, as illustrated in FIG. 6. Messages corresponding to other edges are similarly obtained.

Note that the function φ(x) in the expression (7) can be expressed by the expression $\varphi(x)=\ln((e^x+1)/(e^x-1))$, and $\varphi(x)=\varphi^{-1}(x)$ holds when x>0. When the functions φ(x) and $\varphi^{-1}(x)$ are implemented in hardware, the functions may be implemented using look up tables (LUTs), and the LUTs are the same.

<Configuration Example of Transmission System to which Present Technology is Applied>

Figure 7:
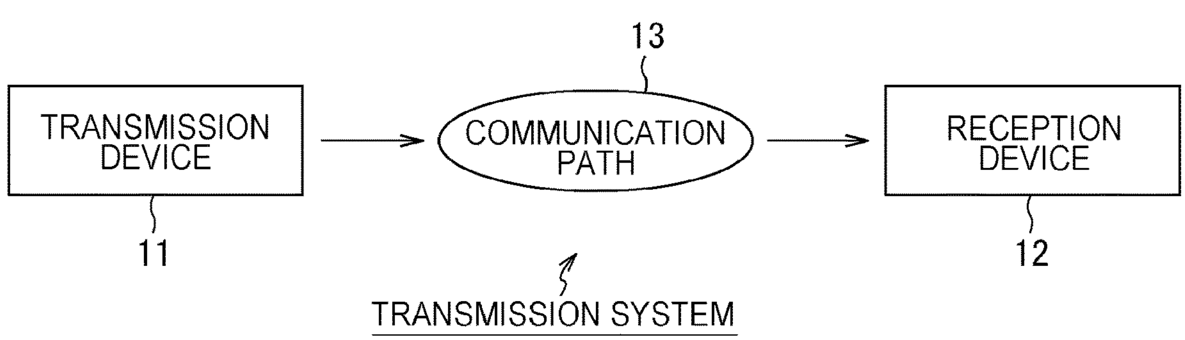
FIG. 7 is a diagram illustrating a configuration example of an embodiment of a transmission system to which the present technology is applied.

FIG. 7 is a diagram illustrating a configuration example of an embodiment of a transmission system (a system refers to a group of a plurality of logically gathered devices, and whether or not the devices of configurations are in the same casing is irrelevant) to which the present technology is applied.

The transmission system in FIG. 7 is configured by a transmission device 11 and a reception device 12.

The transmission device 11 performs transmission (broadcasting) of, for example, a television broadcast program or the like. In other words, the transmission device 11 encodes target data to be transmitted, such as image data and audio data as a program, into an LDPC code, and transmits the LDPC code via a communication path 13 such as a satellite line, a ground wave, or a cable (wired line), for example.

The reception device 12 receives the LDPC code transmitted from the transmission device 11 via the communication path 13, decodes the LDPC code to the target data, and outputs the target data.

Here, it is known that the LDPC code used in the transmission system in FIG. 7 exhibits extremely high capability in an additive white Gaussian noise (AWGN) communication path.

Meanwhile, in the communication path 13, burst errors and erasures may occur. For example, in particular, in a case where the communication path 13 is a ground wave, power of a certain symbol becomes zero (erasure) in some cases according to a delay of an echo (a path other than a main path) in a multipath environment where a desired to undesired ratio (D/U) is 0 dB (power of undesired=echo is equal to power of desired=main path) in an orthogonal frequency division multiplexing (OFDM) system.

Furthermore, power of the entire symbols of OFDM at a specific time may become zero (erasure) due to a Doppler frequency in the case where D/U is 0 dB even in a flutter (a communication path in which a delay is 0 and to which an echo with Doppler frequency is added).

Moreover, a burst error may occur due to a wiring condition from a receiving unit (not illustrated) on the reception device 12 side such as an antenna that receives a signal from the transmission device 11 to the reception device 12, or power supply instability of the reception device 12.

Meanwhile, in decoding the LDPC code, the variable node operation in the expression (1) with addition of (the received value $u_{0i}$ of) the code bit of the LDPC code is performed, as illustrated in FIG. 5, at a column of the parity check matrix H and thus at the variable node corresponding to the code bit of the LDPC code. Therefore, if an error occurs in the code bit used in the variable node operation, the accuracy of an obtained message decreases.

Then, in decoding the LDPC code, the check node operation in the expression (7) is performed in the check node using the messages obtained at the variable nodes connected to the check node. Therefore, if the number of check nodes in which (the code bits of the LDPC codes corresponding to) a plurality of connected variable nodes becomes error (including erasure) at the same time is large, the performance of the decoding deteriorates.

In other words, for example, if two or more of the variable nodes connected to the check node become erasures at the same time, for example, the check node returns a message informing that a probability of a value being 0 and a probability of a value being 1 are equal to all the variable nodes. In this case, the check node returning the equal probability message will not contribute to one decoding processing (a set of the variable node operation and the check node operation). As a result, a large number of repetitions of the decoding processing is required, resulting in deterioration of the performance of the decoding and an increase in the power consumption of the reception device 12 for decoding the LDPC code.

Therefore, in the transmission system in FIG. 7, improvement of resistance to burst errors and erasure is possible while maintaining the performance in the AWGN communication path (AWGN channel).

<Configuration Example of Transmission Device 11>

Figure 8:
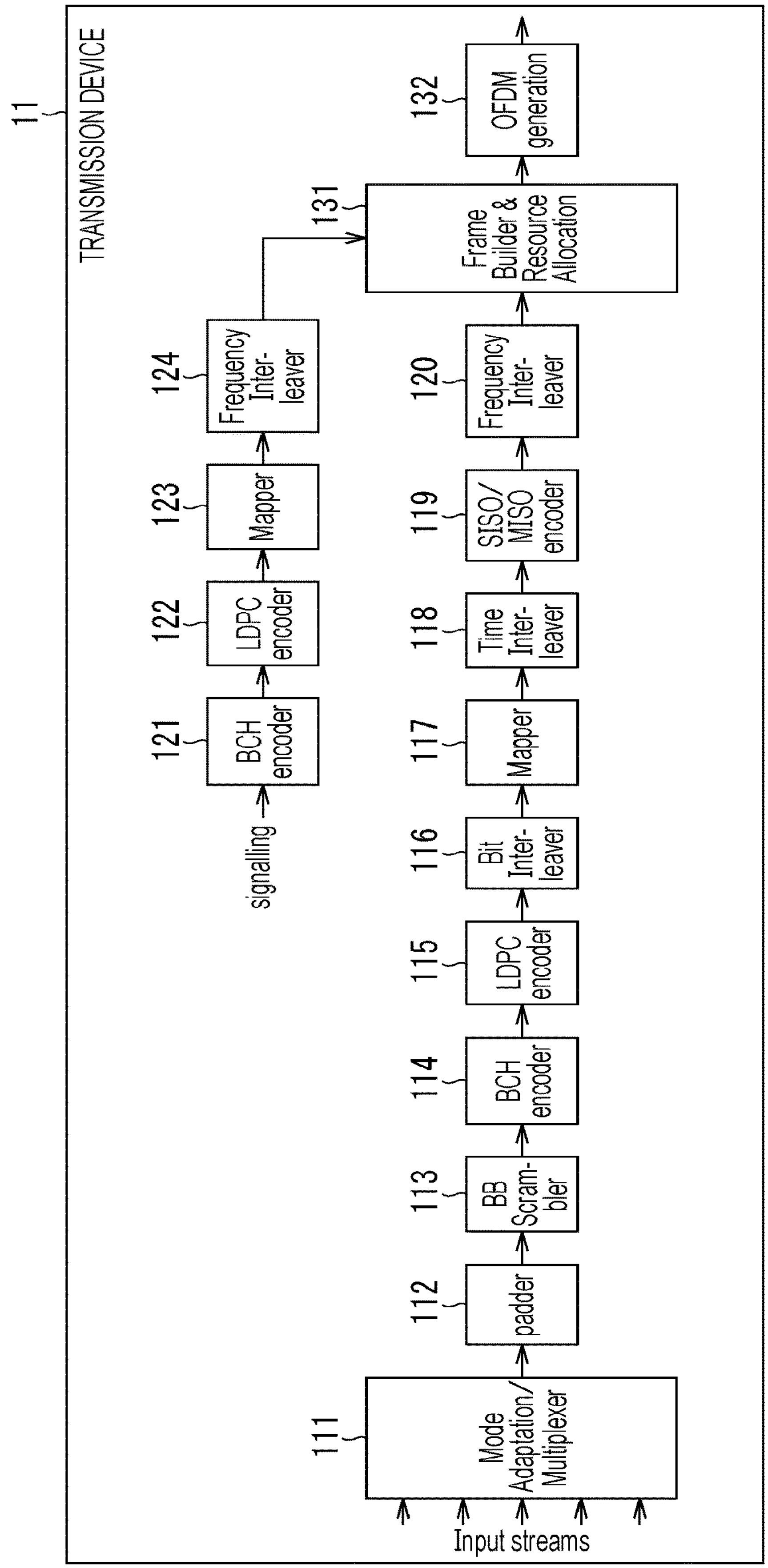
FIG. 8 is a block diagram illustrating a configuration example of a transmission device 11.

FIG. 8 is a block diagram illustrating a configuration example of the transmission device 11 in FIG. 7.

In the transmission device 11, one or more input streams as the target data are supplied to a mode adaptation/multiplexer 111.

The mode adaptation/multiplexer 111 performs processing such as mode selection and multiplexing of the one or more input streams supplied thereto as necessary, and supplies resulting data to a padder 112.

The padder 112 performs necessary zero padding (insertion of null) to the data from the mode adaptation/multiplexer 111, and supplies resulting data to a base band (BB) scrambler 113.

The BB scrambler 113 applies BB scramble to the data from the padder 112, and supplies resulting data to a BCH encoder 114.

The BCH encoder 114 performs BCH coding for the data from the BB scrambler 113, and supplies resultant data to an LDPC encoder 115 as LDPC target data to be LDPC encoded.

The LDPC encoder 115 (encoding unit) performs, for the LDPC target data from the BCH encoder 114, LDPC coding according to a parity check matrix and the like in which a parity matrix that is a portion corresponding to a parity bit of the LDPC code has a step (dual diagonal) structure, and outputs an LDPC code having the LDPC target data as information bits, for example.

In other words, the LDPC encoder 115 performs LDPC coding for coding the LDPC target data to an LDPC code (corresponding to the parity check matrix) defined in a predetermined standard such as DVB-S.2, DVB-T.2, DVB-C.2, or ATSC 3.0 or to another LDPC code, for example, and outputs a resulting LDPC code.

Here, the LDPC code defined in the standard of DVB-S.2 or ATSC 3.0 is an irregular repeat accumulate (IRA) code, and (a part or all of) the parity matrix in the parity check matrix of the LDPC code has a step structure. The parity matrix and the step structure will be described below. Furthermore, the IRA code is described in, for example, "Irregular Repeat-Accumulate Codes," H. Jin, A. Khandekar, and R. J. McEliece, in Proceedings of 2nd International Symposium on Turbo codes and Related Topics, pp. 1-8, September 2000.

The LDPC code output by the LDPC encoder 115 is supplied to a bit interleaver 116.

The bit interleaver 116 performs bit interleaving described below for the LDPC code from the LDPC encoder 115, and supplies the LDPC code after the bit interleaving to a mapper (Mapper) 117.

The mapper 117 maps the LDPC code from the bit interleaver 116 to a signal point representing one symbol of quadrature modulation in units of code bits of one bit or more (in units of symbols) of the LDPC code and performs quadrature modulation (multiple value modulation).

In other words, the mapper 117 maps the LDPC code from the bit interleaver 116 into signal points determined by a modulation method for performing the quadrature modulation of an LDPC code, on a constellation that is an IQ plane defined with an I axis representing an I component in phase with a carrier and a Q axis representing a Q component orthogonal to the carrier, and performs the quadrature modulation.

In a case where the number of constellation signal points used in the modulation method of the quadrature modulation performed by the mapper 117 is $2^m$, the mapper 117 maps the LDPC code from the bit interleaver 116 into signal points representing symbols, of $2^m$ signal points, in units of symbols, where m-bit code bits of the LDPC code are a symbol (one symbol).

Here, examples of the modulation method of the quadrature modulation performed by the mapper 117 include the modulation method defined in the standard such as DVB-S.2 or ATSC 3.0, and other modulation methods, in other words, for example, binary phase shift keying (BPSK), quadrature phase shift keying (QPSK), phase-shift keying (8PSK), amplitude phase-shift keying (16APSK), 32APSK, quadrature amplitude modulation (16QAM), 16QAM, 64QAM, 256QAM, 1024QAM, 4096QAM, and pulse amplitude modulation (4PAM). Which modulation method of the quadrature modulation is used in the mapper 117 is set in advance according to an operation of an operator of the transmission device 11, for example.

Data obtained by the processing in the mapper 117 (the mapping result of mapped symbols at the signal points) is supplied to a time interleaver 118.

The time interleaver 118 performs time interleaving (interleaving in a time direction) in units of symbols, for the data from the mapper 117, and supplies resulting data to a single input single output/multiple input single output encoder (SISO/MISO encoder) 119.

The SISO/MISO encoder 119 applies space-time coding to the data from the time interleaver 118, and supplies the data to a frequency interleaver 120.

The frequency interleaver 120 performs frequency interleaving (interleaving in a frequency direction) in units of symbols, for the data from the SISO/MISO encoder 119, and supplies the data to a frame builder/resource allocation unit 131.

Meanwhile, control data (signalling) for transmission control such as base band (BB) signalling (BB header) is supplied to a BCH encoder 121, for example.

The BCH encoder 121 performs BCH coding for the control data supplied thereto, similarly to the BCH encoder 114, and supplies resulting data to an LDPC encoder 122.

The LDPC encoder 122 performs LDPC coding for the data from the BCH encoder 121 as LDPC target data, similarly to the LDPC encoder 115, and supplies a resulting LDPC code to a mapper 123.

The mapper 123 maps the LDPC code from the LDPC encoder 122 to a signal point representing one symbol of quadrature modulation in units of code bits of one bit or more (in units of symbols) of the LDPC code and performs quadrature modulation, similarly to the mapper 117, and supplies resulting data to a frequency interleaver 124.

The frequency interleaver 124 performs frequency interleaving in in units of symbols, for the data from the mapper 123, similarly to the frequency interleaver 120, and supplies resulting data to a frame builder/resource allocation unit 131.

The frame builder/resource allocation unit 131 inserts pilot symbols into necessary positions of the data (symbols) from the frequency interleavers 120 and 124, and configures a frame by a predetermined number of symbols (for example, a physical layer (PL) frame, a T2 frame, a C2 frame, or the like) from resulting data (symbols), and supplies the frame to an OFDM generation unit 132.

The OFDM generation unit 132 generates an OFDM signal corresponding to the frame from the frame builder/resource allocation unit 131, and transmits the OFDM signal via the communication path 13 (FIG. 7).

Note that the transmission device 11 can be configured without including part of the blocks illustrated in FIG. 8, such as the time interleaver 118, the SISO/MISO encoder 119, the frequency interleaver 120, and the frequency interleaver 124, for example.

<Configuration Example of Bit Interleaver 116>

Figure 9:
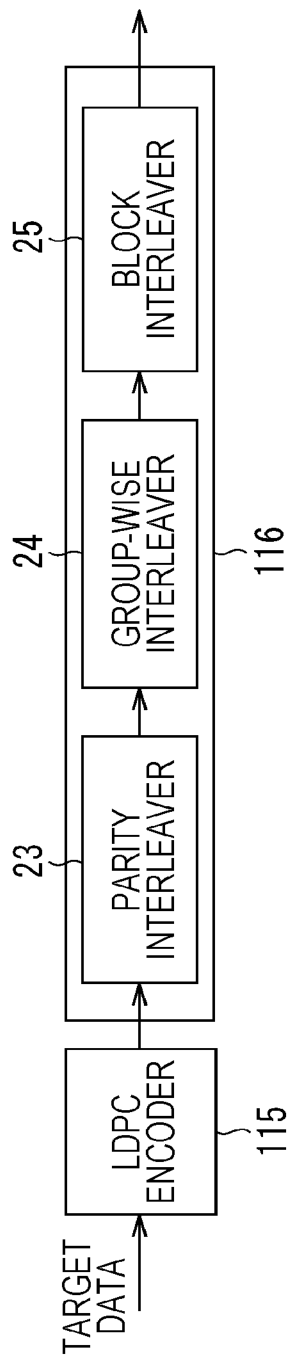
FIG. 9 is a block diagram illustrating a configuration example of a bit interleaver 116.

FIG. 9 is a block diagram illustrating a configuration example of the bit interleaver 116 in FIG. 8.

The bit interleaver 116 has a function to interleave data, and is configured by a parity interleaver 23, a group-wise interleaver 24, and a block interleaver 25.

The parity interleaver 23 performs parity interleaving to interleave the position of another parity bit with the parity bit of the LDPC code from the LDPC encoder 115, and supplies the LDPC code after the parity interleaving to the group-wise interleaver 24.

The group-wise interleaver 24 performs group-wise interleaving for the LDPC code from the parity interleaver 23, and supplies the LDPC code after the group-wise interleaving to the block interleaver 25.

Here, in the group-wise interleaving, the LDPC code from the parity interleaver 23 is interleaved in units of bit groups, where 360 bits of one section is set as a bit group, the one section being obtained by dividing the LDPC code of one code from the head of the LDPC code into sections in units of 360 bits, the unit being equal to a parallel factor P to be described below, and taking one of the divided sections as the one section.

In a case of performing the group-wise interleaving, an error rate can be improved as compared with a case of not performing the group-wise interleaving. As a result, favorable communication quality can be secured in data transmission.

The block interleaver 25 performs block interleaving for demultiplexing the LDPC code from the group-wise interleaver 24 to symbolize the LDPC code of one code into an m-bit symbol that is a unit of mapping, and supplies the symbol to the mapper 117 (FIG. 8), for example.

Here, in the block interleaving, for example, the LDPC code from the group-wise interleaver 24 is written in a column (vertical) direction and is read in a row (cross) direction with respect to a storage region in which columns as storage regions each storing a predetermined bit length in the column direction are arranged in the row direction by the number of bit length m of the symbol, whereby the LDPC code is symbolized into the m-bit symbol.

<Parity Check Matrix of LDPC Code>

Figure 10:
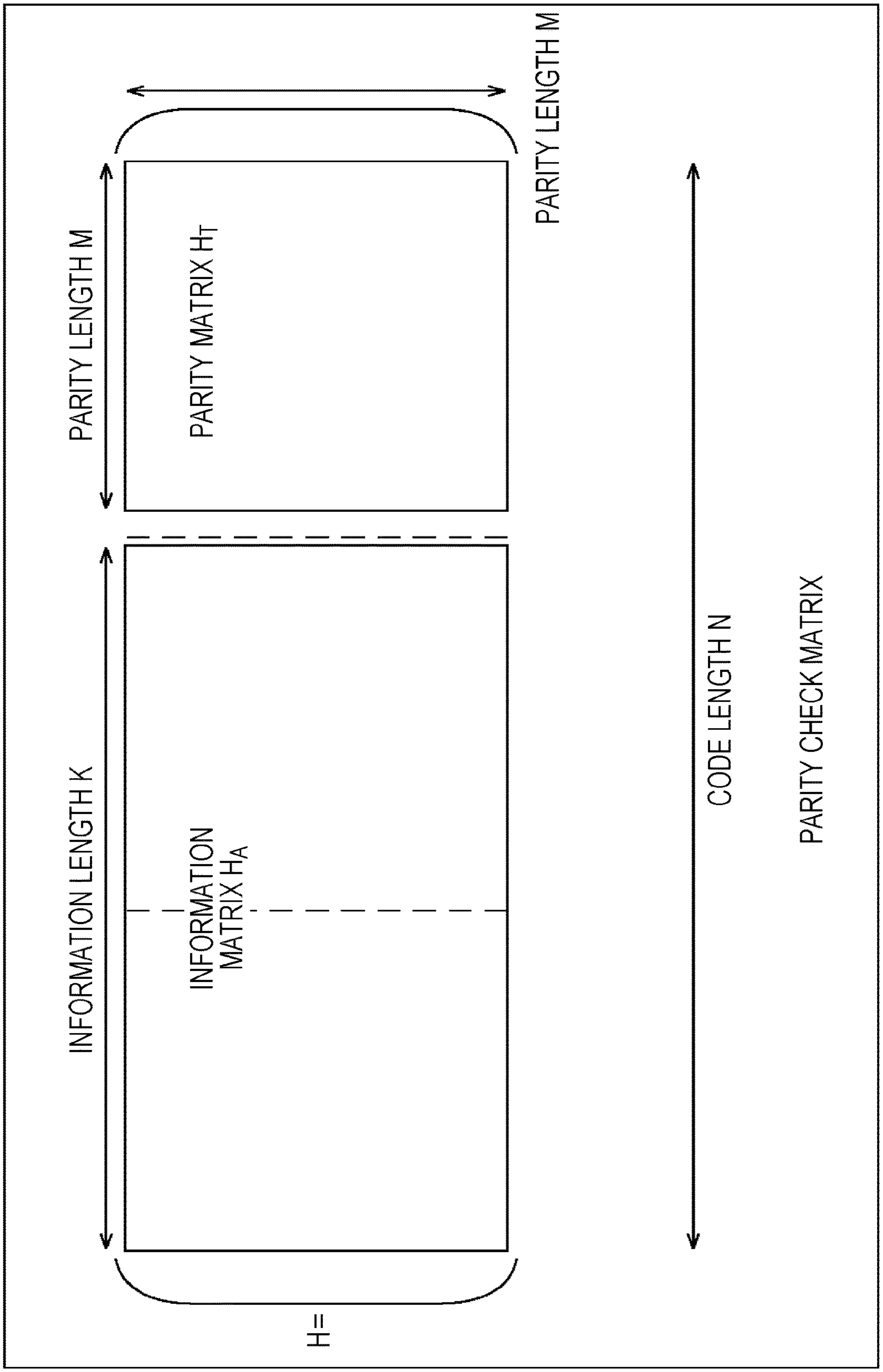
FIG. 10 is a diagram illustrating an example of a parity check matrix.

FIG. 10 is a diagram illustrating an example of the parity check matrix H used for LDPC coding in the LDPC encoder 115 in FIG. 8.

The parity check matrix H has a low-density generation matrix (LDGM) structure and can be expressed as an expression $H=[H_A|H_T]$ (elements of the information matrix $H_A$ are on the left side and elements of the parity matrix $H_T$ are on the right side) using an information matrix $H_A$ of a portion corresponding to the information bits and a parity matrix $H_T$ corresponding to the parity bits, of the code bits of the LDPC code.

Here, the bit length of the information bits and the bit length of the parity bits, of the code bits of the LDPC code of one code (one codeword), are respectively referred to as an information length K and a parity length M, and the bit length of the code bits of one (one codeword) LDPC code is referred to as code length N (=K+M).

The information length K and the parity length M of the LDPC code of a given code length N are determined by a coding rate. Furthermore, the parity check matrix H is a matrix of M×N in rows x columns (M-row N-column matrix). Then, the information matrix $H_A$ is an M×K matrix, and the parity matrix $H_T$ is an M×M matrix.

Figure 11:
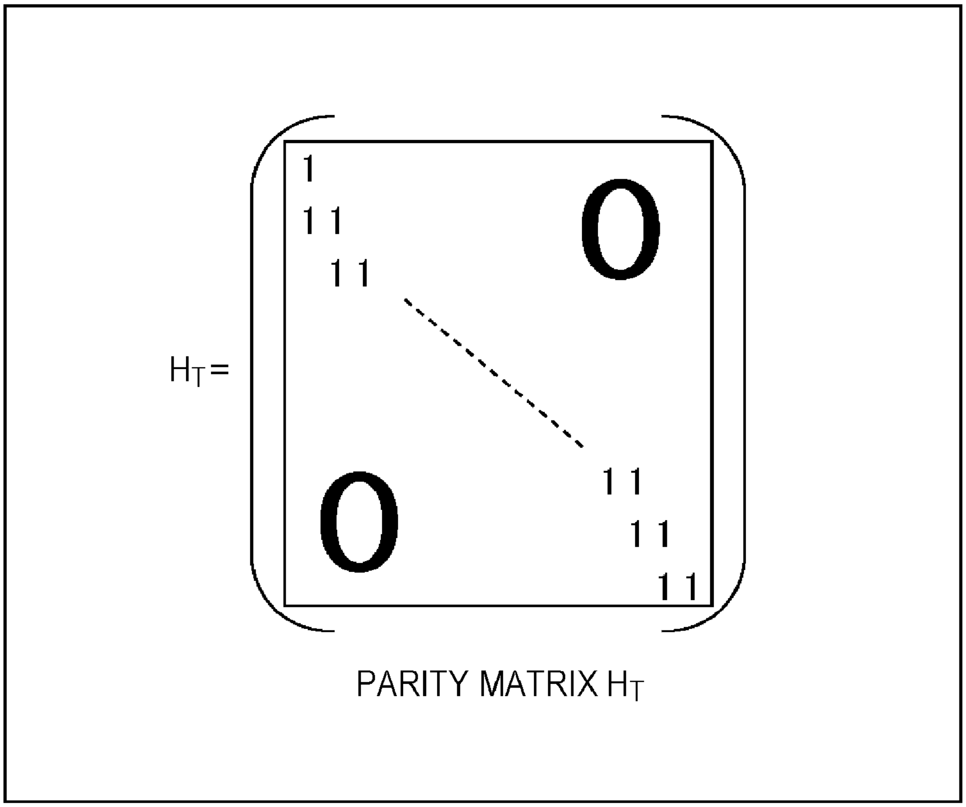
FIG. 11 is a diagram illustrating an example of a parity matrix.

FIG. 11 is a diagram illustrating an example of the parity matrix $H_T$ of the parity check matrix H used for LDPC coding in the LDPC encoder 115 in FIG. 8.

As the parity matrix $H_T$ of the parity check matrix H used for LDPC coding in the LDPC encoder 115, a parity matrix $H_T$ similar to the parity check matrix H of the LDPC code defined in the standard such as DVB-T.2 can be adopted, for example.

The parity matrix $H_T$ of the parity check matrix H of the LDPC code defined in the standard such as DVB-T.2 is a matrix having a step structure (lower bidiagonal matrix) in which elements of 1 are arranged in a step-like manner, as illustrated in FIG. 11. The row weight of the parity matrix $H_T$ is 1 in the 1st row and 2 in all the remaining rows. Furthermore, the column weight is 1 in the last one column and 2 in all the remaining columns.

As described above, the LDPC code of the parity check matrix H in which the parity matrix $H_T$ has the step structure can be easily generated using the parity matrix H.

In other words, the LDPC code (one codeword) is expressed with a row vector c, and a column vector obtained by transposing the row vector thereof is represented as $c^T$. Furthermore, a portion of the information bits, of the row vector c that is the LDPC code, is expressed with a row vector A, and a portion of the parity bits, of the row vector c, is expressed with a row vector T.

In this case, the row vector c can be expressed as an expression $c=[A|T]$ (elements of the row vector A are on the left side and elements of the row vector T are on the right side) using the row vector A as the information bits and the row vector T as the parity bits.

The parity check matrix H and the row vector $c=[A|T]$ as the LDPC code need to satisfy an expression $Hc^T=0$, and the row vector T as the parity bits constituting the row vector $c=[A|T]$ satisfying the expression $Hc^T=0$ can be sequentially obtained (in order) by sequentially setting the element of each row to 0 from the element in the 1st row of the column vector $Hc^T$ in the expression $Hc^T=0$ in a case where the parity matrix $H_T$ of the parity check matrix $H=[H_A|H_T]$ has the step structure illustrated in FIG. 11.

Figure 12:
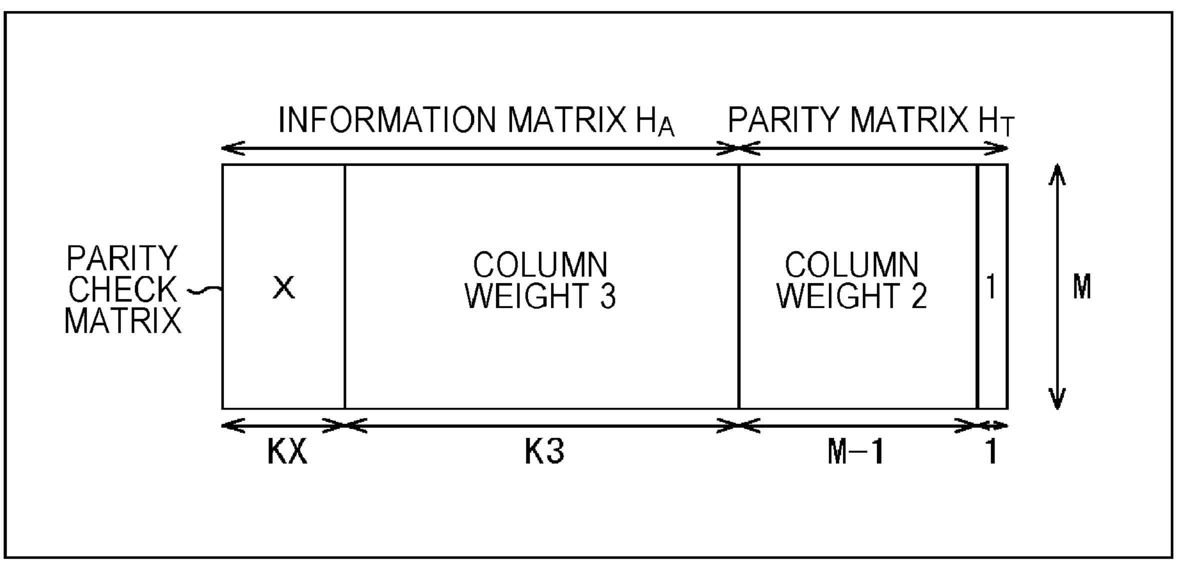
FIG. 12 is a diagram for describing a parity check matrix of an LDPC code defined in the standard of DVB-T.2.

FIG. 12 is a diagram for describing the parity check matrix H of the LDPC code defined in the standard such as DVB-T.2.

In the parity check matrix H of the LDPC code defined in the standard such as DVB-T.2, the column weight is X in KX columns from the 1st column, 3 in following K3 columns, 2 in following M−1 columns, and 1 in the last one column.

Here, KX+K3+M−1+1 is equal to the code length N.

FIG. 13 is a diagram illustrating the numbers of columns KX, K3, and M, and the column weight X for each coding rate r of the LDPC code defined in the standard such as DVB-T.2.

In the standard such as DVB-T.2, LDPC codes having code lengths N of 64800 bits and 16200 bits are defined.

Then, eleven coding rates (nominal rates) of 1/4, 1/3, 2/5, 1/2, 3/5, 2/3, 3/4, 4/5, 5/6, 8/9, and 9/10 are defined for the LDPC code with the code length N of 64800 bits. Ten coding rates of 1/4, 1/3, 2/5, 1/2, 3/5, 2/3, 3/4, 4/5, 5/6, and 8/9 are defined for the LDPC code with the code length N of 16200 bits.

Here, the code length N of 64800 bits is also referred to as 64 k bits and the code length N of 16200 bits is also referred to as 16 k bits.

In regard to the LDPC code, code bits corresponding to a column having a larger column weight of the parity check matrix H tend to have a lower error rate.

In the parity check matrix H defined in the standard such as DVB-T.2 illustrated in FIGS. 12 and 13, the column weight tends to be larger in columns on the head side (left side), and therefore the code bits on the head side tend to be more resistant to errors and end code bits tend to be more susceptible to errors in the LDPC code corresponding to the parity check matrix H.

<Parity Interleaving>

The parity interleaving by the parity interleaver 23 in FIG. 9 will be described with reference to FIGS. 14 to 16.

Figure 14:
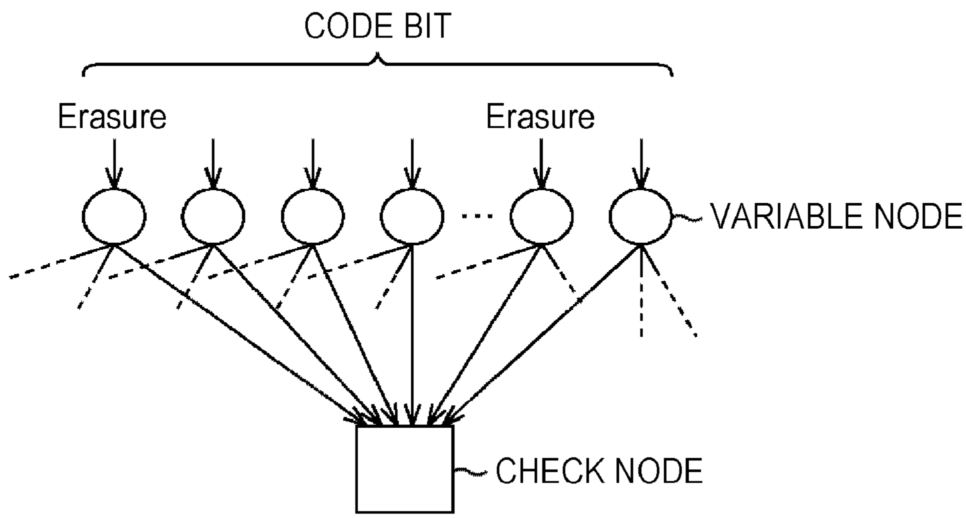
FIG. 14 is a diagram illustrating an example of a Tanner graph regarding decoding of an LDPC code.

FIG. 14 is a diagram illustrating an example of (a part of) a Tanner graph of the parity check matrix of the LDPC code.

As illustrated in FIG. 14, when two or more of (the code bits corresponding to) the variable nodes connected to the check node become errors such as erasures at the same time, the check node returns a message informing that a probability of a value being 0 and a probability of a value being 1 are equal to all the variable nodes connected to the check node. Therefore, if a plurality of variable nodes connected to the same check node becomes erasures or the like at the same time, the performance of the decoding will deteriorate.

By the way, the LDPC code output from the LDPC encoder 115 in FIG. 8 is an IRA code, similarly to the LDPC code defined in the standard such as DVB-T.2, for example, and the parity matrix $H_T$ of the parity check matrix H has a step structure, as illustrated in FIG. 11.

FIG. 15 is a diagram illustrating examples of the parity matrix $H_T$ having the step structure, as illustrated in FIG. 11, and a Tanner graph corresponding to the parity matrix $H_T$.

A in FIG. 15 illustrates an example of the parity matrix $H_T$ having a step structure, and B in FIG. 15 illustrates a Tanner graph corresponding to the parity matrix $H_T$ in A in FIG. 15.

In the parity matrix $H_T$ having a step structure, elements of 1 are adjacent (except the 1st row) in rows. Therefore, in the Tanner graph of the parity matrix $H_T$, two adjacent variable nodes corresponding to columns of the two adjacent elements where values of the parity matrix $H_T$ are 1 are connected to the same check node.

Therefore, when the parity bits corresponding to the above two adjacent variable nodes become errors at the same time due to burst errors, erasures, or the like, the check node connected to the two variable nodes corresponding to the two error parity bits (variable nodes seeking a message using the parity bits) returns the message informing that a probability of a value being 0 and a probability of a value being 1 are equal to the variable nodes connected to the check node. Therefore, the performance of the decoding deteriorates. Then, when a burst length (the bit length of the parity bits that become error in succession) becomes large, the number of check nodes returning the message of equal probability increases, and the performance of the decoding further deteriorates.

Therefore, the parity interleaver 23 (FIG. 9) performs parity interleaving to interleave the positions of other parity bits with the parity bits of the LDPC code from the LDPC encoder 115 in order to prevent deterioration of the performance of the decoding.

Figure 16:
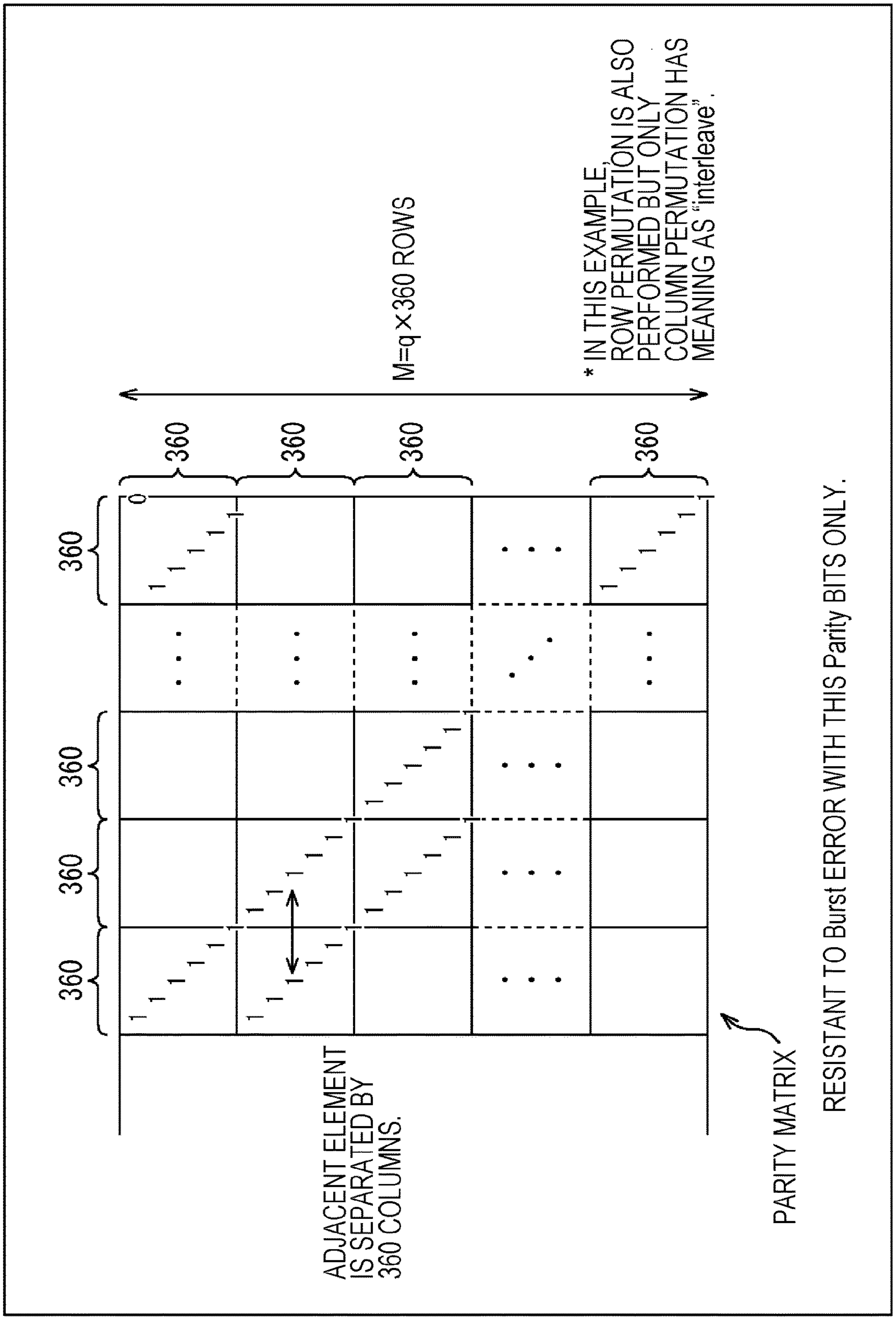
FIG. 16 is a diagram illustrating the parity matrix $H_T$ of the parity check matrix H corresponding to the LDPC code after parity interleaving.

FIG. 16 is a diagram illustrating the parity matrix $H_T$ of the parity check matrix H corresponding to the LDPC code after the parity interleaving performed by the parity interleaver 23 in FIG. 9.

Here, the information matrix $H_A$ of the parity check matrix H corresponding to the LDPC code output by the LDPC encoder 115 has a cyclic structure, similarly to the information matrix of the parity check matrix H corresponding to the LDPC code defined in the standard such as DVB-T.2.

The cyclic structure is a structure in which a certain column matches a cyclically shifted another column, and includes, for example, a structure in which, for each P columns, positions of 1 of rows of the P columns become positions cyclically shifted in the column direction by a predetermined value such as a value proportional to a value q obtained by dividing the first column of the P columns by the parity length M. Hereinafter, the P columns in the cyclic structure are referred to as a parallel factor, as appropriate.

As the LDPC code defined in the standard such as DVB-T.2, there are two types of LDPC codes with the code lengths N of 64800 bits and 16200 bits as described in FIGS. 12 and 13. For both the two types of LDPC codes, the parallel factor P is defined as 360, which is one of divisors of the parity length M except 1 and M.

Furthermore, the parity length M is a value other than a prime number represented by an expression M=q×P=q×360, using a value q that varies depending on the coding rate. Therefore, similarly to the parallel factor P, the value q is also another one of the divisors of the parity length M except 1 and M, and is obtained by dividing the parity length M by the parallel factor P (a product of P and q, which are the divisors of the parity length M, becomes the parity length M).

As described above, the parity interleaver 23 interleaves the position of (K+Py+x+1)th code bit with (K+qx+y+1)th code bit of code bits of an N-bit LDPC code, as the parity interleaving, where the information length is K, an integer from 0 to P, exclusive of P, is x, and an integer from 0 to q, exclusive of q, is y.

Since both the (K+qx+y+1)th code bit and the (K+Py+x+1)th code bit are subsequent code bits of (K+1)th code bit and thus are parity bits, the positions of the parity bits of the LDPC code are moved according to the parity interleaving.

According to such parity interleaving, (the parity bits corresponding to) the variable nodes connected to the same check node are separated by the parallel factor P, in other words, 360 bits. Therefore, in a case where the burst length is less than 360 bits, a situation where a plurality of variable nodes connected to the same check node becomes error at the same time can be avoided, and as a result, the resistance to the burst errors can be improved.

Note that the LDPC code after the parity interleaving to interleave the position of the (K+Py+x+1)th code bit with the (K+qx+y+1)th code bit matches the LDPC code of the parity check matrix (hereinafter also referred to as a transformed parity check matrix) that is obtained by performing column permutation to permutate the (K+qx+y+1)th column of the original parity check matrix H with the (K+Py+x+1)th column.

Furthermore, a pseudo cyclic structure having P columns (360 columns in FIG. 16) as a unit appears in the parity matrix of the transformed parity check matrix, as illustrated in FIG. 16.

Here, the pseudo cyclic structure means a structure having a cyclic structure excluding a part.

A transformed parity check matrix obtained by applying column permutation corresponding to the parity interleaving to the parity check matrix of the LDPC code defined in the standard such as DVB-T.2 lacks one element of 1 (has an element of 0) in a portion (a shift matrix to be described below) of 360 rows×360 columns in an upper right corner portion of the transformed parity check matrix, and thus has a so-called pseudo cyclic structure, rather than a (complete) cyclic structure on that regard.

A transformed parity check matrix for the parity check matrix of the LDPC code output by the LDPC encoder 115 has a pseudo cyclic structure, similarly to the transformed parity check matrix for the parity check matrix of the LDPC code defined in the standard such as DVB-T.2, for example.

Note that the transformed parity check matrix in FIG. 16 is a matrix obtained by applying the column permutation corresponding to the parity interleaving to the original parity check matrix H, and applying permutation for rows (row permutation) so as to configure the transformed parity check with configuration matrices to be described below.

Figure 17:
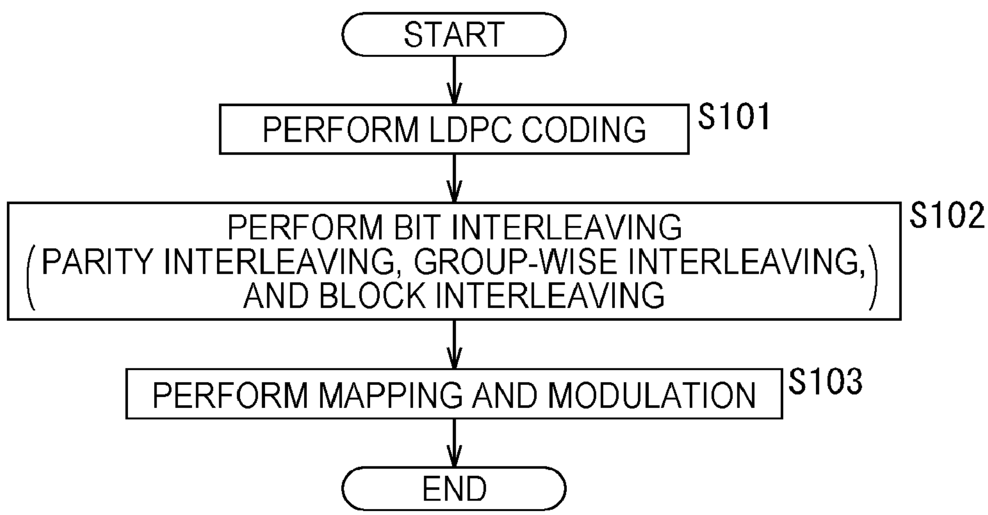
FIG. 17 is a flowchart for describing an example of processing performed by a bit interleaver 116 and a mapper 117.

FIG. 17 is a flowchart for describing processing performed by the LDPC encoder 115, the bit interleaver 116, and the mapper 117 in FIG. 8.

The LDPC encoder 115 waits for supply of the LDPC target data from the BCH encoder 114. In step S101, the LDPC encoder 115 encodes the LDPC target data into the LDPC code, and supplies the LDPC code to the bit interleaver 116. The processing proceeds to step S102.

In step S102, the bit interleaver 116 performs the bit interleaving for the LDPC code from the LDPC encoder 115, and supplies the symbol obtained by the bit interleaving to the mapper 117. The processing proceeds to step S103.

In other words, in step S102, in the bit interleaver 116 (FIG. 9), the parity interleaver 23 performs the parity interleaving for the LDPC code from the LDPC encoder 115, and supplies the LDPC code after the parity interleaving to the group-wise interleaver 24.

The group-wise interleaver 24 performs the group-wise interleaving for the LDPC code from the parity interleaver 23, and supplies the LDPC code to the block interleaver 25.

The block interleaver 25 performs the block interleaving for the LDPC code after the group-wise interleaving by the group-wise interleaver 24, and supplies a resulting m-bit symbol to the mapper 117.

In step S103, the mapper 117 maps the symbol from the block interleaver 25 to any of $2^m$ signal points determined by the modulation method of the quadrature modulation performed by the mapper 117 and performs the quadrature modulation, and supplies resulting data to the time interleaver 118.

As described above, by performing the parity interleaving and the group-wise interleaving, the error rate of the case where a plurality of code bits of the LDPC code is transmitted as one symbol can be improved.

Here, in FIG. 9, for convenience of description, the parity interleaver 23 as a block for performing the parity interleaving and the group-wise interleaver 24 as a block for performing the group-wise interleaving are separately configured. However, the parity interleaver 23 and the group-wise interleaver 24 can be integrally configured.

In other words, both the parity interleaving and the group-wise interleaving can be performed by writing and reading code bits with respect to a memory, and can be expressed by a matrix for converting an address for writing code bits (write address) into an address for reading code bits (read address).

Therefore, by obtaining a matrix obtained by multiplying a matrix expressing the parity interleaving and a matrix expressing the group-wise interleaving, the parity interleaving is performed by converting code bits by these matrices, and further the group-wise interleaving is performed for the LDPC code after the parity interleaving, whereby a result can be obtained.

Furthermore, the block interleaver 25 can also be integrally configured in addition to the parity interleaver 23 and the group-wise interleaver 24

In other words, the block interleaving performed by the block interleaver 25 can also be expressed by the matrix converting the write address of the memory for storing the LDPC code into the read address.

Therefore, by obtaining a matrix obtained by multiplying the matrix expressing the parity interleaving, the matrix expressing the group-wise interleaving, and the matrix expressing the block interleaving, the parity interleaving, the group-wise interleaving, and the block interleaving can be collectively performed by the matrices.

Note that one or the amount of the parity interleaving and the group-wise interleaving may not be performed.

<Configuration Example of LDPC Encoder 115>

Figure 18:
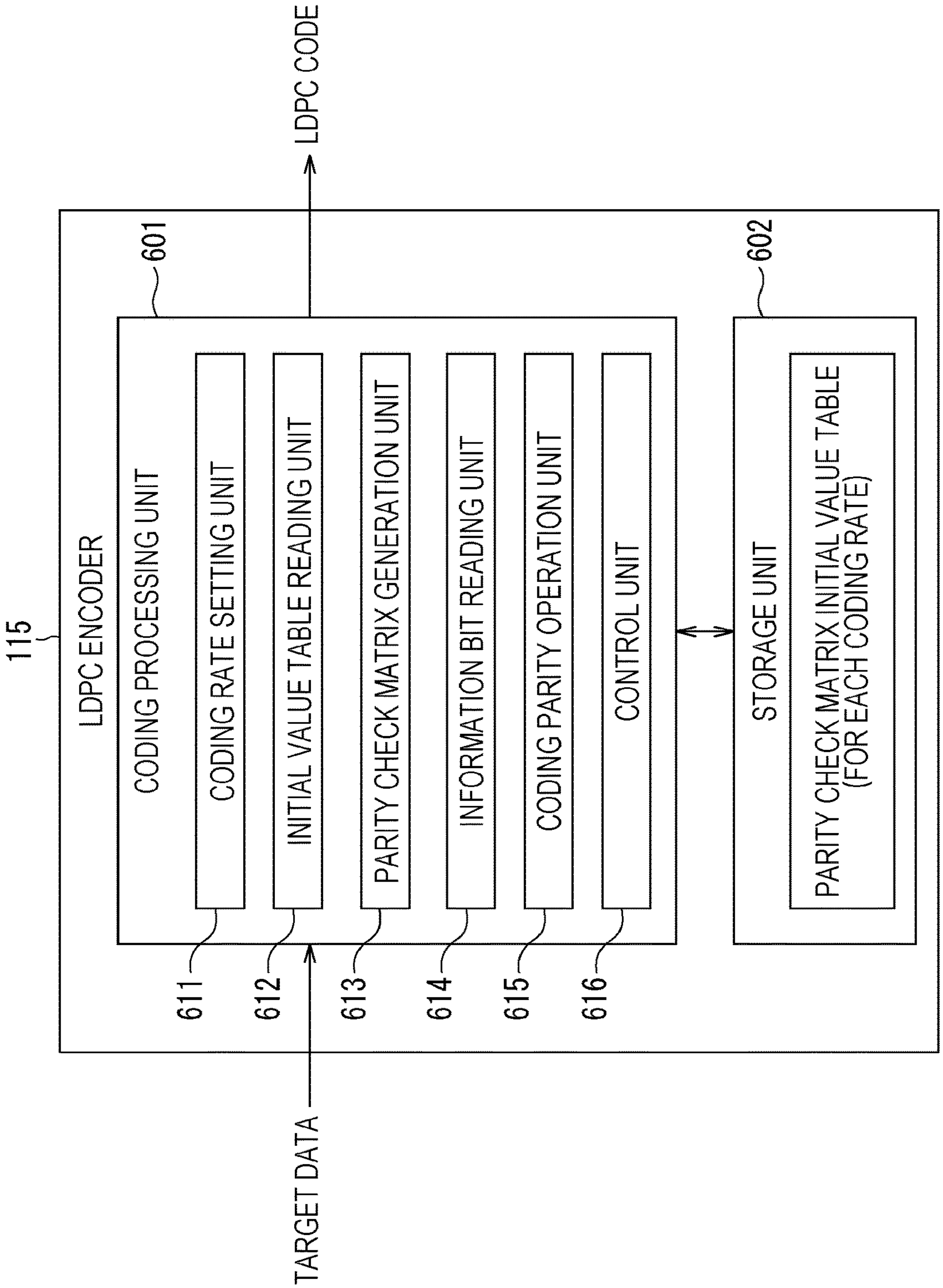
FIG. 18 is a block diagram illustrating a configuration example of an LDPC encoder 115.

FIG. 18 is a block diagram illustrating a configuration example of the LDPC encoder 115 in FIG. 8.

Note that the LDPC encoder 122 in FIG. 8 is similarly configured.

As described in FIGS. 12 and 13, in the standard such as DVB-T.2, LDPC codes having two types of code lengths N of 64800 bits and 16200 bits are defined.

Then, the eleven coding rates of 1/4, 1/3, 2/5, 1/2, 3/5, 2/3, 3/4, 4/5, 5/6, 8/9, and 9/10 are defined for the LDPC code with the code length N of 64800 bits. The ten coding rates of 1/4, 1/3, 2/5, 1/2, 3/5, 2/3, 3/4, 4/5, 5/6, and 8/9 are defined for the LDPC code with the code length N of 16200 bits (FIGS. 12 and 13).

The LDPC encoder 115 can perform, for example, such coding (error correction coding) of the LDPC codes with the code lengths N of 64800 bits and 16200 bits and the coding rates according to the parity check matrix H prepared for each code length N and each coding rate.

Furthermore, the LDPC encoder 115 can perform LDPC coding according to the parity check matrix H of an LDPC code with a code length N of 17280 bits or another arbitrary code length N and a coding rate of 2/16, 3/16, 4/16, 5/16, 6/16, 7/16, 8/16, 9/16, 10/16, 11/16, 12/16, 13/16, or 14/16 or another arbitrary coding rate r.

The LDPC encoder 115 is configured by a coding processing unit 601 and a storage unit 602.

The coding processing unit 601 is configured by a coding rate setting unit 611, an initial value table reading unit 612, a parity check matrix generation unit 613, an information bit reading unit 614, a coding parity operation unit 615, and a control unit 616. The coding processing unit 601 performs the LDPC coding for the LDPC target data supplied to the LDPC encoder 115, and supplies a resulting LDPC code to the bit interleaver 116 (FIG. 8).

In other words, the coding rate setting unit 611 sets the code length N and the coding rate r of the LDPC code, and in addition, specific information specifying the LDPC code, according to the operation of the operator, for example.

The initial value table reading unit 612 reads, from the storage unit 602, a parity check matrix initial value table to be described below, expressing the parity check matrix of the LDPC code specified with the specific information set by the coding rate setting unit 611.

The parity check matrix generation unit 613 generates the parity check matrix H on the basis of the parity check matrix initial value table read by the initial value table reading unit 612, and stores the parity check matrix H in the storage unit 602. For example, the parity check matrix generation unit 613 arranges the elements of 1 of the information matrix $H_A$ corresponding to the information length K (=the code length N−the parity length M) according to the code length N and the coding rate r set by the coding rate setting unit 611 with a period of every 360 columns (parallel factor P) in the column direction to generate the parity check matrix H, and stores the parity check matrix H in the storage unit 602.

The information bit reading unit 614 reads (extracts) the information bits of the information length K from the LDPC target data supplied to the LDPC encoder 115.

The coding parity operation unit 615 reads the parity check matrix H generated by the parity check matrix generation unit 613 from the storage unit 602, and calculates the parity bits for the information bits read by the information bit reading unit 614 on the basis of a predetermined expression using the parity check matrix H, thereby generating the codeword (LDPC code).

The control unit 616 controls the blocks constituting the coding processing unit 601.

The storage unit 602 stores, for example, a plurality of parity check matrix initial value tables respectively corresponding to the plurality of coding rates and the like illustrated in FIGS. 12 and 13 for the respective code lengths N such as 64800 bits and 16200 bits, parity check matrix initial value tables respectively corresponding to the coding rates of 2/16, 3/16, 4/16, 5/16, 6/16, 7/16, 8/16, 9/16, 10/16, 11/16, 12/16, 13/16, and 14/16 for the code length N of 17280 bits, and a parity check matrix initial value table of the parity check matrix H of the LDPC code with an arbitrary code length N and an arbitrary coding rate r. Furthermore, the storage unit 602 temporarily stores data necessary for the processing of the coding processing unit 601.

Figures 19, 20:
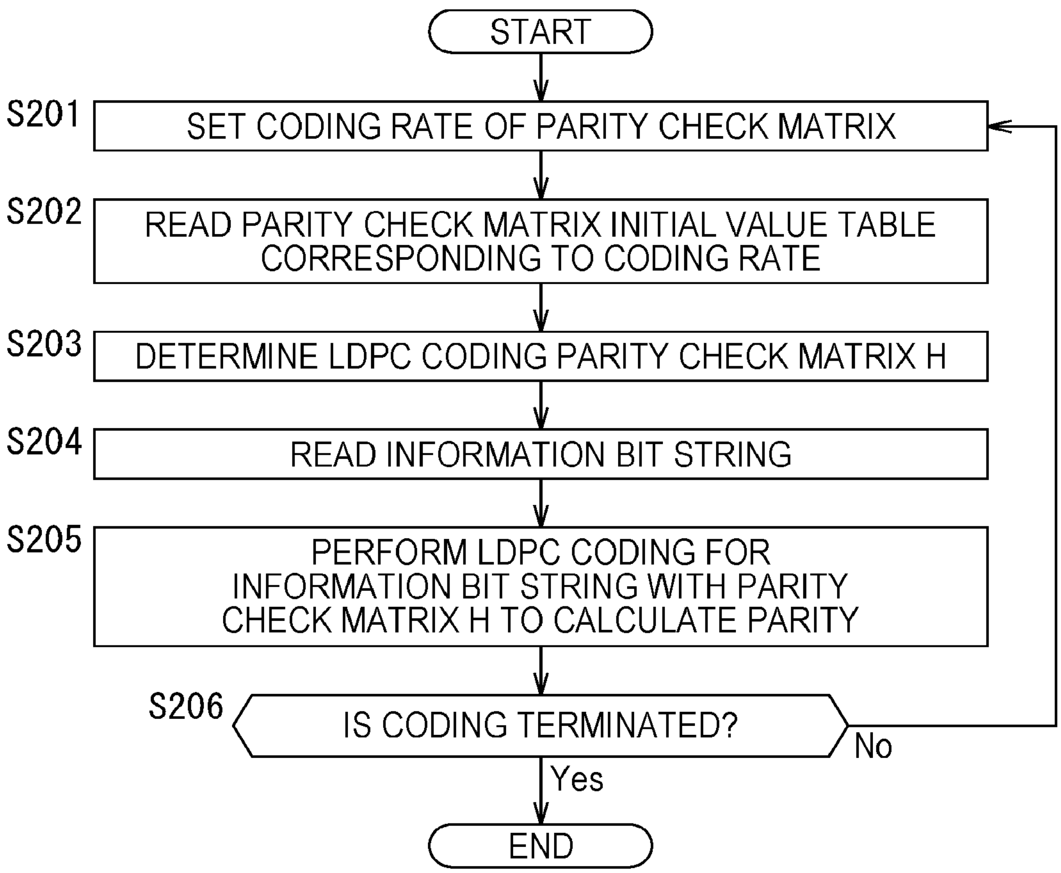
FIG. 19 is a flowchart for describing an example of processing of the LDPC encoder 115.
FIG. 20 is a diagram illustrating an example of a parity check matrix initial value table with a coding rate of 1/4 and a code length of 16200.

FIG. 19 is a flowchart for describing an example of the processing of the LDPC encoder 115 in FIG. 18.

In step S201, the coding rate setting unit 611 sets the code length N and the coding rate r for performing the LDPC coding, and in addition, the specific information specifying the LDPC code.

In step S202, the initial value table reading unit 612 reads, from the storage unit 602, the predetermined parity check matrix initial value table specified with the code length N, the coding rate r, and the like as the specific information set by the coding rate setting unit 611.

In step S203, the parity check matrix generation unit 613 obtains (generates) the parity check matrix H of the LDPC code with the code length N and the coding rate r set by the coding rate setting unit 611, using the parity check matrix initial value table read from the storage unit 602 by the initial value table reading unit 612, and supplies and stores the parity check matrix H in the storage unit 602.

In step S204, the information bit reading unit 614 reads the information bits of the information length K (=N×r) corresponding to the code length N and the coding rate r set by the coding rate setting unit 611 from the LDPC target data supplied to the LDPC encoder 115, and reads the parity check matrix H obtained by the parity check matrix generation unit 613 from the storage unit 602, and supplies the information bits and the parity check matrix H to the coding parity operation unit 615.

In step S205, the coding parity operation unit 615 sequentially operates the parity bit of the codeword c that satisfies the expression (8), using the information bits and the parity check matrix H from the information bit reading unit 614.

$$Hc^T=0 \tag{8}$$

In the expression (8), c represents the row vector as the codeword (LDPC code), and $c^T$ represents transposition of the row vector c.

Here, as described above, in the case of expressing the portion of the information bits, of the row vector c as the LDPC code (one codeword), with the row vector A, and the portion of the parity bits, of the row vector c, with the row vector T, the row vector c can be expressed as the expression c=[A|T] using the row vector A as the information bits and the row vector T as the parity bits.

The parity check matrix H and the row vector c=[A|T] as the LDPC code need to satisfy the expression $Hc^T=0$, and the row vector T as the parity bits constituting the row vector c=[A|T] satisfying the expression $Hc^T=0$ can be sequentially obtained by sequentially setting the element of each row to 0 from the element in the 1st row of the column vector $Hc^T$ in the expression $Hc^T=0$ in the case where the parity matrix $H_T$ of the parity check matrix $H=[H_A|H_T]$ has the step structure illustrated in FIG. 11.

The coding parity operation unit 615 obtains the parity bits T for the information bits A from the information bit reading unit 614, and outputs the codeword c=[A|T] expressed with the information bits A and the parity bits T as an LDPC coding result of the information bits A.

Thereafter, in step S206, the control unit 616 determines whether or not to terminate the LDPC coding. In a case where it is determined in step S206 that the LDPC coding is not terminated, in other words, in a case where there is still LDPC target data to be LDPC-encoded, the processing returns to step S201 (or step S204), and hereinafter the processing from step S201 (or step S204) to step S206 is repeated, for example.

Furthermore, in step S206, in a case where it is determined that the LDPC coding is terminated, in other words, for example, in a case where there is no LDPC target data to be LDPC-encoded, the LDPC encoder 115 terminates the processing.

In regard to the LDPC encoder 115, the parity check matrix initial value table (expressing the parity check matrix) of the LDPC codes of various code lengths N and coding rates r can be prepared in advance. The LDPC encoder 115 can perform the LDPC coding for the LDPC codes of various code lengths N and coding rates r, using the parity check matrix H generated from the parity check matrix initial value table prepared in advance.

<Example of Parity Check Matrix Initial Value Table>

For example, the parity check matrix initial value table is a table representing the positions of the elements of 1 of the information matrix $H_A$ (FIG. 10) corresponding to the information length K according to the code length N and the coding rate r of the LDPC code (the LDPC code defined by the parity check matrix H) of the parity check matrix H in every 360 columns (parallel factor P), and is created in advance for each parity check matrix H of each code length N and each coding rate r.

In other words, the parity check matrix initial value table represents at least the positions of the elements of 1 of the information matrix $H_A$ in every 360 columns (parallel factor P).

Furthermore, as the parity check matrix H, there are a parity check matrix in which the entire parity matrix $H_T$ has a step structure, and a parity check matrix in which a part of the parity matrix $H_T$ has a step structure and the remaining part is a diagonal matrix (identity matrix).

Hereinafter, an expression method for the parity check matrix initial value table representing the parity check matrix in which a part of the parity matrix $H_T$ has a step structure and the remaining part is a diagonal matrix is also referred to as type A method. Furthermore, an expression method for the parity check matrix initial value table representing the parity check matrix in which the entire parity matrix $H_T$ has a step structure is also referred to as type B method.

Furthermore, the LDPC code for the parity check matrix represented by the parity check matrix initial value table by the type A method is also referred to as type A code, and the LDPC code for the parity check matrix represented by the parity check matrix initial value table by the type B method is also referred to as type B code.

The designations "type A" and "type B" are designations in accordance with the standard of ATSC 3.0. For example, in ATSC 3.0, both the type A code and type B code are adopted.

Note that, in DVB-T.2 and the like, the type B code is adopted.

FIG. 20 is a diagram illustrating an example of the parity check matrix initial value table by the type B method.

In other words, FIG. 20 illustrates the parity check matrix initial value table (representing the parity check matrix H) of the type B code with the code length N of 16200 bits and the coding rate r (coding rate on the notation of DVB-T.2) of ¼ defined in the standard of DVB-T.2.

The parity check matrix generation unit 613 (FIG. 18) obtains the parity check matrix H as follows using the parity check matrix initial value table by the type B method.

Figure 21:
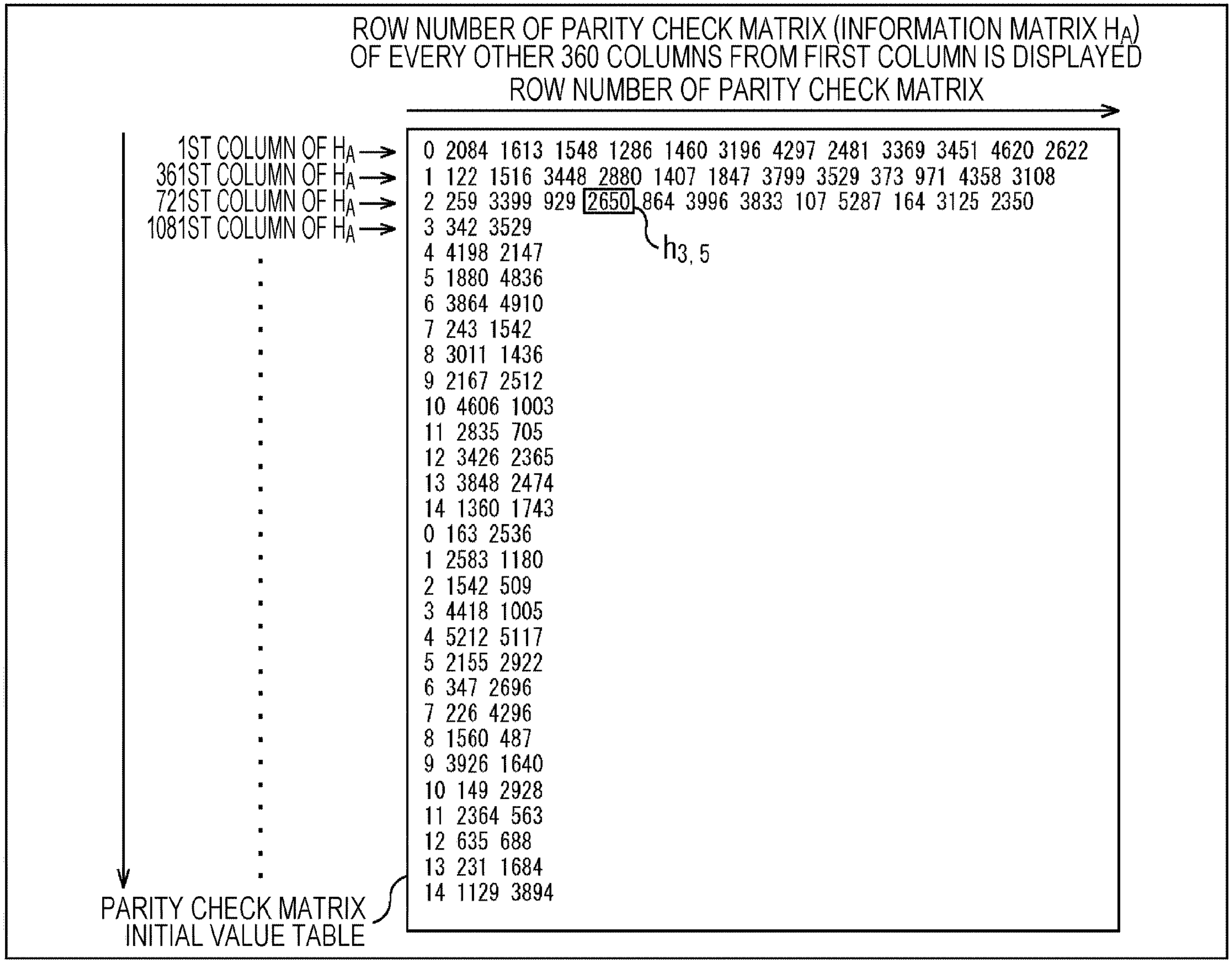
FIG. 21 is a diagram for describing a method of obtaining the parity check matrix H from the parity check matrix initial value table.

FIG. 21 is a diagram for describing a method of obtaining the parity check matrix H from the parity check matrix initial value table by the type B method.

In other words, FIG. 21 illustrates the parity check matrix initial value table of the type B code with the code length N of 16200 bits and the coding rate r of ⅔ defined in the standard of DVB-T.2.

The parity check matrix initial value table by the type B method is a table representing the positions of the elements of 1 of the entire information matrix $H_A$ corresponding to the information length K according to the code length N and the coding rate r of the LDPC code in every 360 columns (parallel factor P). In the i-th row, row numbers of the elements of 1 of the (1+360×(i−1))th column of the parity check matrix H (row numbers of when the row number of the 1st row of the parity check matrix H is counted as 0) are arranged by the number of the column weights of the (1+360×(i−1))th column. Here, since the parity matrix $H_T$ (FIG. 10) corresponding to the parity length M of the parity check matrix H by the type B method has the step structure as illustrated in FIG. 15, the parity check matrix H can be obtained if the information matrix $H_A$ (FIG. 10) corresponding to the information length K can be obtained according to the parity check matrix initial value table.

The number of rows k+1 of the parity check matrix initial value table by the type B method differs depending on the information length K.

The relationship of the expression (9) holds between the information length K and the number of rows k+1 of the parity check matrix initial value table.

$$K=(k+1)\times 360 \tag{9}$$

Here, 360 in the expression (9) is the parallel factor P described in FIG. 16.

In the parity check matrix initial value table in FIG. 21, thirteen numerical values are arranged in the 1st to 3rd rows, and three numerical values are arranged in the 4th to (k+1)th rows (30th row in FIG. 21).

Therefore, the column weight of the parity check matrix H obtained from the parity check matrix initial value table in FIG. 21 is 13 from the 1st to (1+360×(3−1)−1)th columns, and 3 from the (1+360×(3−1))th to K-th columns.

The 1st row of the parity check matrix initial value table in FIG. 21 is 0, 2084, 1613, 1548, 1286, 1460, 3196, 4297, 2481, 3369, 3451, 4620, and 2622, which indicates that, in the 1st column of the parity check matrix H, the elements of the rows with the row numbers of 0, 2084, 1613, 1548, 1286, 1460, 3196, 4297, 2481, 3369, 3451, 4620, and 2622 are 1 (and the other elements are 0).

Furthermore, the 2nd row of the parity check matrix initial value table in FIG. 21 is 1, 122, 1516, 3448, 2880, 1407, 1847, 3799, 3529, 373, 971, 4358, and 3108, which indicates that, in the 361st (=1+360×(2−1))th column of the parity check matrix H, the elements of the rows with the row numbers of 1, 122, 1516, 3448, 2880, 1407, 1847, 3799, 3529, 373, 971, 4358, and 3108 are 1.

As described above, the parity check matrix initial value table represents the positions of the elements of 1 of the information matrix $H_A$ of the parity check matrix H in every 360 columns.

The columns other than the (1+360×(i−1))th column of the parity check matrix H, in other words, the (2+360×(i−1))th to (360×i)th columns are obtained by cyclically shifting and arranging the elements of 1 of the (1+360×(i−1))th column determined by the parity check matrix initial value table downward (downward of the columns) according to the parity length M.

In other words, for example, the (2+360×(i−1))th column is obtained by cyclically shifting the (1+360×(i−1))th column downward by M/360 (=q). The next (3+360×(i−1))th column is obtained by cyclically shifting the (1+360×(i−1))th column downward by 2×M/360 (=2×q) (by cyclically shifting the (2+360×(i−1))th column downward by M/360 (=q)).

Now, in a case where the numerical value of the j-th column (j-th from the left) in the i-th row (i-th from the top) of the parity check matrix initial value table is represented as $h_{i,j}$ and the row number of the element of j-th of 1 of the w-th column of the parity check matrix H is represented as $H_{w-j}$, the row number $H_{w-j}$ of the element of 1 of the w-th column that is a column other than the (1+360×(i−1))th column of the parity check matrix H can be obtained by the expression (10).

$$H_{w-j}=\mathrm{mod}\{h_{i,j}+\mathrm{mod}((w-1),P)\times q,M\} \tag{10}$$

Here, mod (x, y) means the remainder of dividing x by y.

Furthermore, P is the above-described parallel factor, and in the present embodiment, P is 360 as in the standard of DVB-T.2 or the like and ATSC 3.0, for example. Moreover, q is a value M/360 obtained by dividing the parity length M by the parallel factor P (=360).

The parity check matrix generation unit 613 (FIG. 18) specifies the row number of the element of 1 in the (1+360×(i−1))th column of the parity check matrix H using the parity check matrix initial value table.

Moreover, the parity check matrix generation unit 613 (FIG. 18) calculates the row number $H_{w-j}$ of the element of 1 in the w-th column that is a column other than the (1+360×(i−1))th column of the parity check matrix H according to the expression (10), and generates the parity check matrix H in which the elements of the row numbers obtained as described above are 1.

Figures 22, 23:
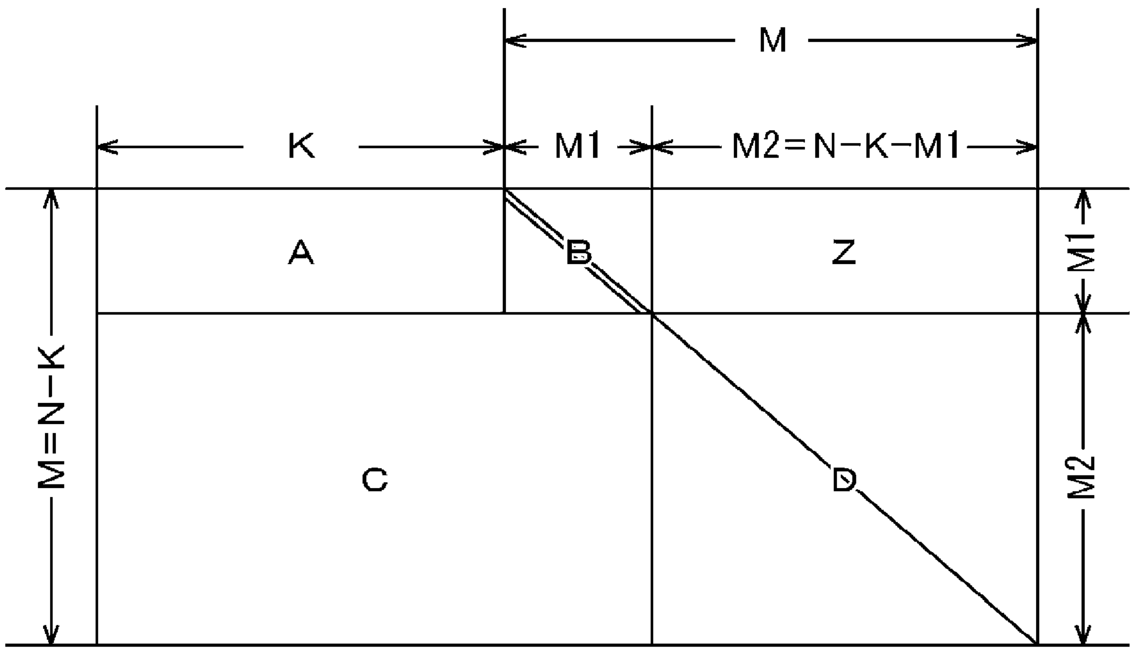
FIG. 22 is a diagram illustrating a structure of a parity check matrix.
FIG. 23 is a diagram illustrating an example of a parity check matrix initial value table.

FIG. 22 is a diagram illustrating a structure of the parity check matrix H by the type A method.

The parity check matrix by the type A method is configured by an A matrix, a B matrix, a C matrix, a D matrix, and a Z matrix.

The A matrix is an upper left matrix in the parity check matrix H, of M1 rows and K columns expressed by a predetermined value M1 and the information length K=the code length N×the coding rate r of the LDPC code.

The B matrix is a matrix of M1 rows and M1 columns having a step structure adjacent to the right of the A matrix.

The C matrix is a matrix of N−K−M1 rows and K+M1 columns adjacent to below the A matrix and the B matrix.

The D matrix is an identity matrix of N−K−M1 rows and N−K−M1 columns adjacent to the right of the C matrix.

The Z matrix is a zero matrix (0 matrix) of M1 rows and N−K−M1 columns adjacent to the right of the B matrix.

In the parity check matrix H by the type A method configured by the above A matrix to D matrix and Z matrix, the A matrix and a part of the C matrix constitute the information matrix, and the B matrix, the rest of the C matrix, the D matrix, and the Z matrix constitute the parity matrix.

Note that, since the B matrix is a matrix with a step structure and the D matrix is an identity matrix, a part (the part of the B matrix) of the parity matrix of the parity check matrix H by the type A method has the step structure and the remaining part (the part of the D matrix) is a diagonal matrix (identity matrix).

The A matrix and the C matrix have a cyclic structure of every parallel factor P columns (for example, 360 columns), similarly to the information matrix of the parity check matrix H by type B method, and the parity check matrix initial value table by the type A method represents the positions of the elements of 1 of the A matrix and the C matrix in every 360 columns.

Here, as described above, since the A matrix and a part of the C matrix constitute the information matrix, the parity check matrix initial value table by the type A method representing the positions of the elements of 1 of the A matrix and the C matrix in every 360 columns can be said to represent at least the positions of the elements of 1 of the information matrix in every 360 columns.

Note that, since the parity check matrix initial value table by the type A method represents the positions of the elements of 1 of the A matrix and the C matrix in every 360 columns, the parity check matrix initial value table can also be said to represent the positions of the elements of 1 of a part (the remaining part of the C matrix) of the parity check matrix in every 360 columns.

FIG. 23 is a diagram illustrating an example of the parity check matrix initial value table by the type A method.

In other words, FIG. 23 illustrates an example of the parity check matrix initial value table representing the parity check matrix H with the code length N of 35 bits and the coding rate r of 2/7.

The parity check matrix initial value table by the type A method is a table representing the positions of the elements of 1 of the A matrix and the C matrix in every parallel factor P. In the i-th row, row numbers of the elements of 1 of the (1+P×(i−1))th column of the parity check matrix H (the row numbers of when the row number of the 1st row of the parity check matrix H is counted as 0) are arranged by the number of the column weight of the (1+P×(i−1))th column.

Note that, here, to simplify the description, the parallel factor P is 5, for example.

The parity check matrix H by the type A method has M1, M2, Q1, and Q2 as parameters.

M1 (FIG. 22) is a parameter for determining the size of the B matrix, and takes a value that is a multiple of the parallel factor P. By adjusting M1, the performance of the LDPC code changes, and M1 is adjusted to a predetermined value when determining the parity check matrix H. Here, it is assumed that 15 is adopted as M1, which is three times the parallel factor P=5.

M2 (FIG. 22) takes a value M−M1 obtained by subtracting M1 from the parity length M.

Here, since the information length K is N×r=35×2/7=10 and the parity length M is N−K=35−10=25, M2 is M−M1=25−15=10.

Q1 is obtained according to an expression Q1=M1/P, and represents the number of shifts (the number of rows) of cyclic shift in the A matrix.

In other words, the columns other than the (1+P×(i−1))th column of the A matrix of the parity check matrix H by the type A method, that is, the (2+P×(i−1))th to (P×i)th columns are obtained by cyclically shifting and arranging the elements of 1 of the (1+P×(i−1))th column determined by the parity check matrix initial value table downward (downward of the columns), and Q1 represents the number of shifts of the cyclic shift in the A matrix.

Q2 is obtained according to an expression Q2=M2/P, and represents the number of shifts (the number of rows) of cyclic shift in the C matrix.

In other words, the columns other than the (1+P×(i−1))th column of the C matrix of the parity check matrix H by the type A method, that is, the (2+P×(i−1))th to (P×i)th columns are obtained by cyclically shifting and arranging the elements of 1 of the (1+P×(i−1))th column determined by the parity check matrix initial value table downward (downward of the columns), and Q2 represents the number of shifts of the cyclic shift in the C matrix.

Here, Q1 is M1/P=15/5=3, and Q2 is M2/P=10/5=2.

In the parity check matrix initial value table in FIG. 23, three numerical values are arranged in the 1st and 2nd rows, and one numerical value is arranged in the 3rd to 5th rows. According to the arrangement of the numerical values, the column weights of the A matrix and the C matrix of the parity check matrix H obtained from the parity check matrix initial value table in FIG. 23 are 3 from 1st=(1+5×(1−1))th column to 10th=(5×2)th column, and 1 from the 11th=(1+5×(3−1))th column to 25th=(5×5)th column.

In other words, the 1st row of the parity check matrix initial value table in FIG. 23 is 2, 6, and 18, which represents that, in the 1st column of the parity check matrix H, the elements of the rows with the row numbers of 2, 6, and 18 are 1 (and the other elements are 0).

Here, in this case, since the A matrix (FIG. 22) is a matrix of 15 rows and 10 columns (M1 rows and K columns), and the C matrix (FIG. 22) is a matrix of 10 rows and 25 columns (N−K−M1 rows and K+M1 columns), the rows with the row numbers 0 to 14 of the parity check matrix H are rows of the A matrix, and the rows with the row numbers 15 to 24 of the parity check matrix H are rows of the C matrix.

Therefore, rows #2 and #6 of the rows with the row numbers 2, 6, and 18 (hereinafter described as rows #2, #6, and #18) are rows of the A matrix, and the row #18 is a row of the C matrix.

The 2nd row of the parity check matrix initial value table in FIG. 23 is 2, 10, and 19, which represents that, in the 6th (=(1+5×(2−1))th) column of the parity check matrix H, the elements of the rows #2, #10, and #19 are 1.

Here, in the 6th (=(1+5×(2−1))th) column of the parity check matrix H, the rows #2 and #10 of the rows #2, #10, and #19 are rows of the A matrix, and the row #19 is a row of the C matrix.

The 3rd row of the parity check matrix initial value table in FIG. 23 is 22, which represents that, in the 11th (=(1+5×(3−1))th) column of the parity check matrix H, the element of the row #22 is 1.

Here, the row #22 is a row of the C matrix in the 11th (=(1+5×(3−1))th) column of the parity check matrix H.

Similarly, 19 in the 4th row of the parity check matrix initial value table in FIG. 23 represents that the element of the row #19 is 1 in the 16th (=(1+5×(4−1))th) column of the parity check matrix H. 15 in the fifth row of the parity check matrix initial value table in FIG. 23 represents that the element of the row #15 is 1 in the 21st (=(1+5×(5−1))th) column of the parity check matrix H.

As described above, the parity check matrix initial value table represents the positions of the elements of 1 of the A matrix and the C matrix of the parity check matrix H in every parallel factor P=5 columns.

The columns other than the (1+5×(i−1))th column of the A matrix and the C matrix of the parity check matrix H, that is, the (2+5×(i−1))th to (5×i)th columns are obtained by cyclically shifting and arranging the elements of 1 of the (1+5×(i−1))th column determined by the parity check matrix initial value table downward (downward of the columns) according to the parameters Q1 and Q2.

In other words, for example, the (2+5×(i−1))th column of the A matrix is obtained by cyclically shifting the (1+5×(i−1))th column downward by Q1 (=3). The next (3+5×(i−1))th column is obtained by cyclically shifting the (1+5×(i−1))th column downward by 2×Q1 (=2×3) (by cyclically shifting the (2+5×(i−1))th column downward by Q1).

Furthermore, for example, the (2+5×(i−1))th column of the C matrix is obtained by cyclically shifting the (1+5×(i−1))th column downward by Q2 (=2). The next (3+5×(i−1))th column is obtained by cyclically shifting the (1+5×(i−1))th column downward by 2×Q2 (=2×2) (by cyclically shifting the (2+5×(i−1))th column downward by Q2).

Figure 24:
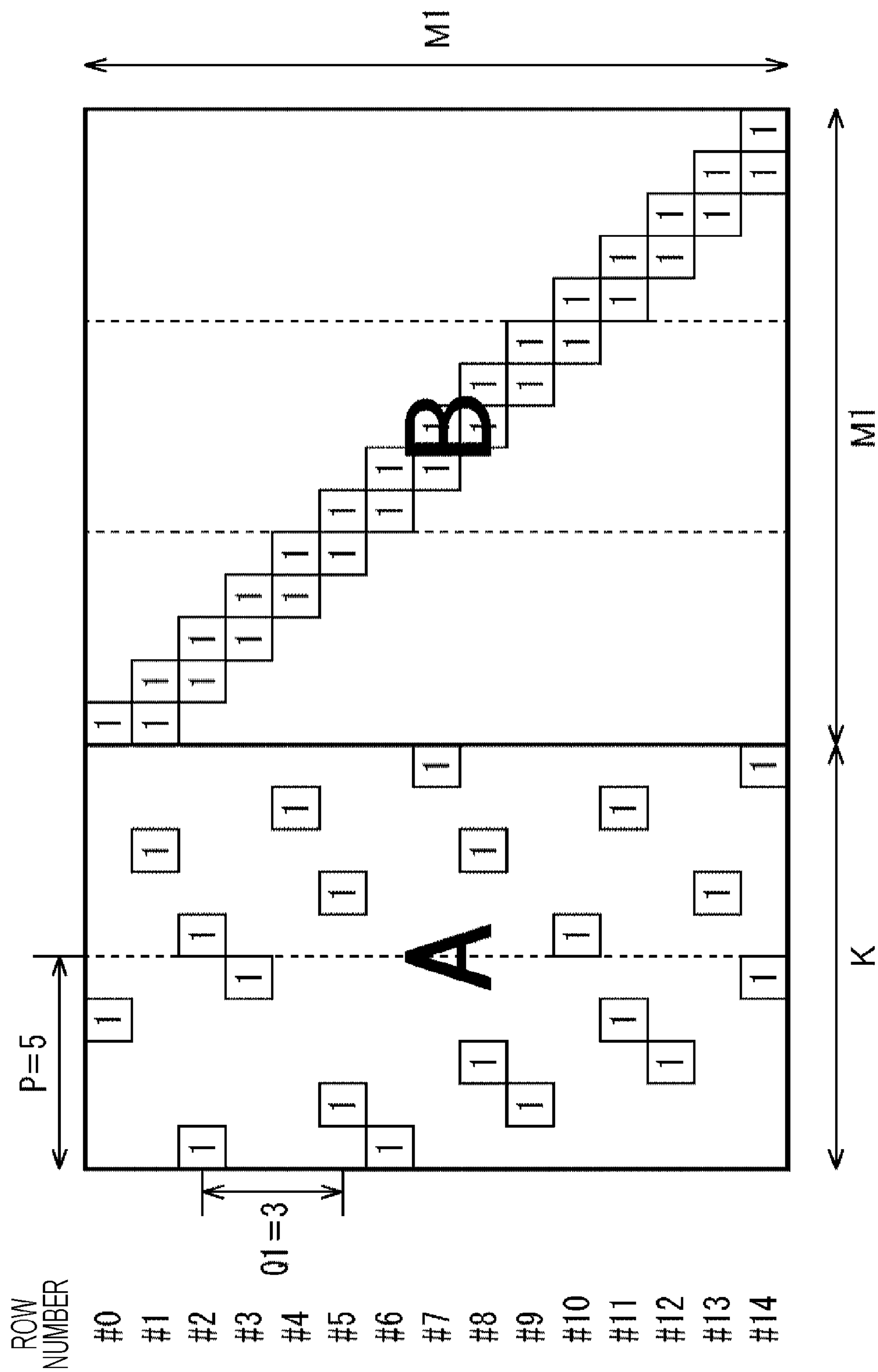
FIG. 24 is a diagram illustrating an A matrix generated from the parity check matrix initial value table.

FIG. 24 is a diagram illustrating the A matrix generated from the parity check matrix initial value table in FIG. 23.

In the A matrix in FIG. 24, the elements of the rows #2 and #6 of the 1st (=(1+5×(1−1))th) column are 1 according to the 1st row of the parity check matrix initial value table in FIG. 23.

Then, the columns from the 2nd (=(2+5×(1−1))th) to 5th (=(5+5×(1−1))th) columns are obtained by cyclically shifting the previous columns downward by Q1=3.

Moreover, in the A matrix in FIG. 24, the elements of the rows #2 and #10 of the 6th (=(1+5×(2−1))th) column are 1 according to the 2nd row of the parity check matrix initial value table in FIG. 23.

Then, the columns from the 7th (=(2+5×(2−1))th) to 10th (=(5+5×(2−1))th) columns are obtained by cyclically shifting the previous columns downward by Q1=3.

Figure 25:
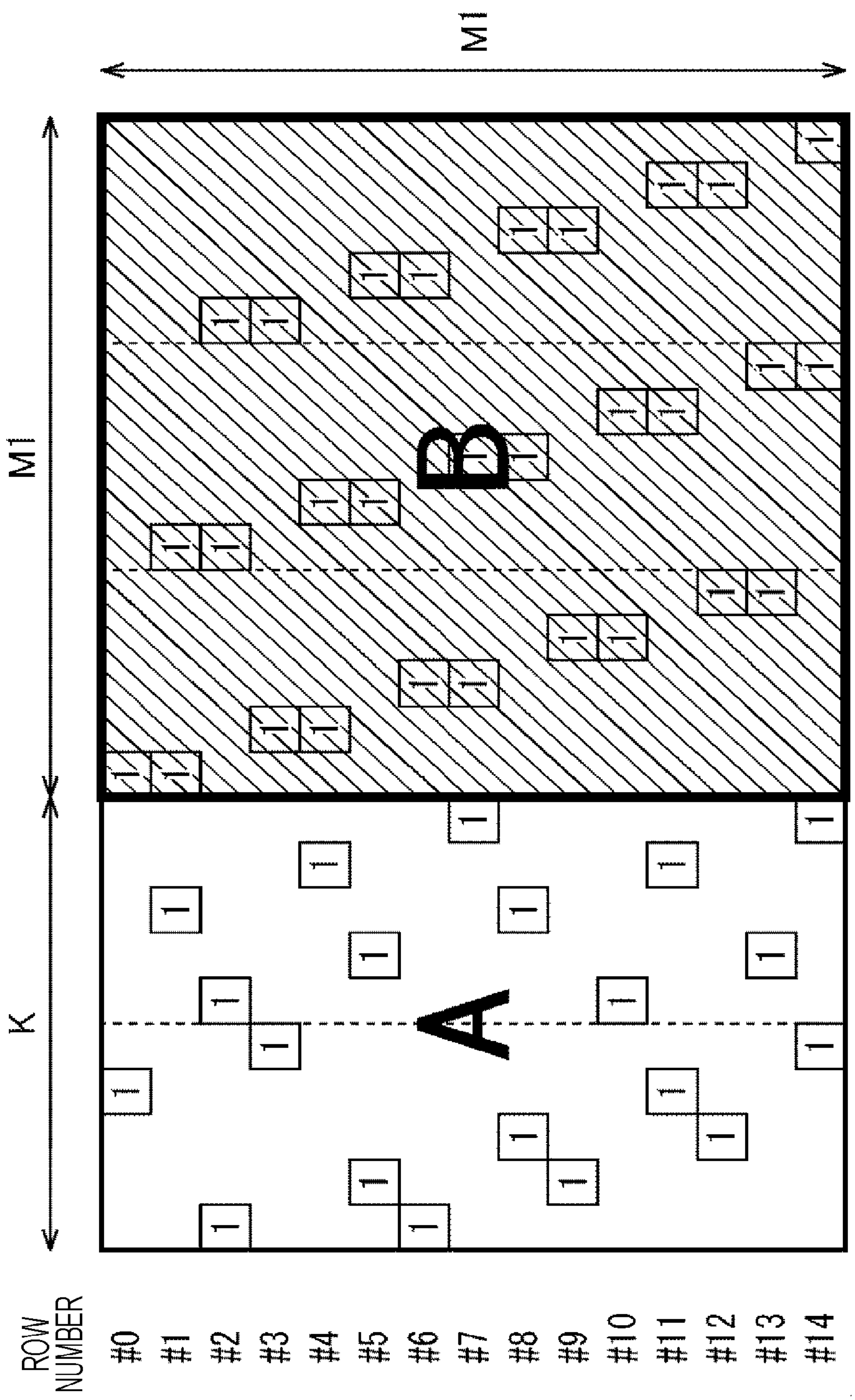
FIG. 25 is a diagram for describing parity interleaving of a B matrix.

FIG. 25 is a diagram illustrating parity interleaving of the B matrix.

The parity check matrix generation unit 613 (FIG. 18) generates the A matrix using the parity check matrix initial value table, and arranges the B matrix having a step structure adjacent to the right of the A matrix. Then, the parity check matrix generation unit 613 treats the B matrix as a parity matrix, and performs parity interleaving such that adjacent elements of 1 of the B matrix having step structure are separated in the row direction by the parallel factor P=5.

FIG. 25 illustrates the A matrix and the B matrix after the parity interleaving of the B matrix in FIG. 24.

Figure 26:
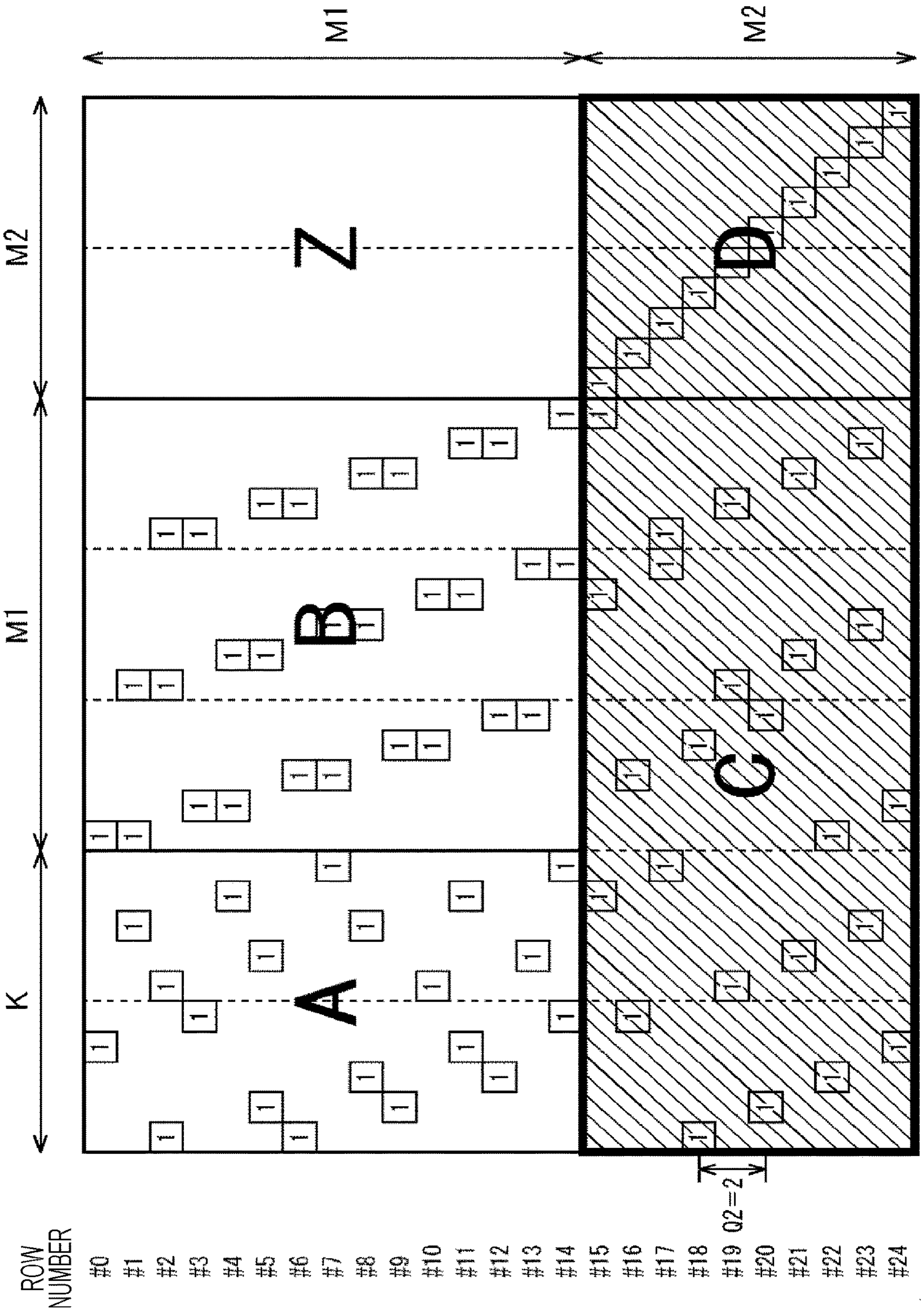
FIG. 26 is a diagram for describing a C matrix generated from the parity check matrix initial value table.

FIG. 26 is a diagram illustrating the C matrix generated from the parity check matrix initial value table in FIG. 23.

In the C matrix in FIG. 26, the element of the row #18 of the 1st (=(1+5×(1−1))th) column of the parity check matrix H is 1 according to the 1st row of the parity check matrix initial value table in FIG. 23.

Then, the columns from the 2nd (=(2+5×(1−1))th) to 5th (=(5+5×(1−1))th) columns of the C matrix are obtained by cyclically shifting the previous columns downward by Q2=2.

Moreover, in the C matrix in FIG. 26, according to the 2nd to 5th rows of the parity check matrix initial value table in FIG. 23, the elements of the row #19 of the 6th (=(1+5×(2−1))th) column, the row #22 of the 11th (=(1+5×(3−1))th) column, the row #19 of the 16th (=(1+5×(4−1))th) column, and the row #15 of the 21st (=(1+5×(5−1))th) columns, of the parity check matrix H, are 1.

Then, columns from the 7th (=(2+5×(2−1))th) to the 10th (=(5+5×(2−1))th) columns, columns from the 12th (=(2+5×(3−1))th) to 15th (=(5+5×(3−1))th) columns, columns from the 17th (=(2+5×(4−1))th) to 20th (=(5+5×(4−1))th) columns, and columns from the 22nd (=(2+5×(5−1))th) to the 25th (=(5+5×(5−1))th) columns are obtained by cyclically shifting the previous columns downward by Q2=2.

The parity check matrix generation unit 613 (FIG. 18) generates the C matrix using the parity check matrix initial value table and arranges the C matrix below the A matrix and the B matrix (after parity interleaving).

Moreover, the parity check matrix generation unit 613 arranges the Z matrix adjacent to the right of the B matrix and arranges the D matrix adjacent to the right of the C matrix to generate the parity check matrix H illustrated in FIG. 26.

Figure 27:
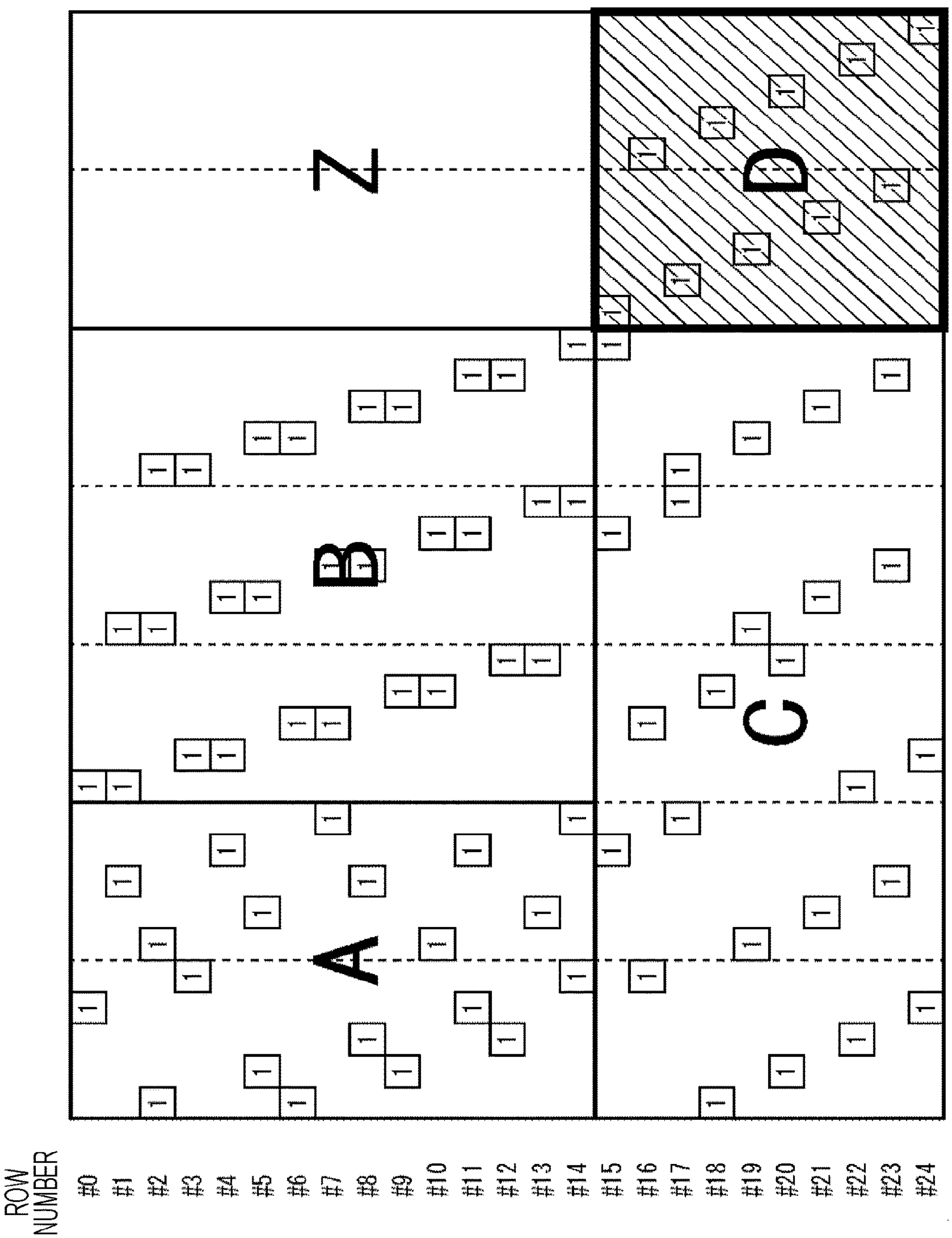
FIG. 27 is a diagram for describing parity interleaving of a D matrix.

FIG. 27 is a diagram for describing parity interleaving of the D matrix.

The parity check matrix generation unit 613 treats the D matrix after generating the parity check matrix H in FIG. 26 as a parity matrix, and performs parity interleaving (of only the D matrix) such that the elements of 1 of the odd rows and the next even rows of the D matrix as an identity matrix are separated by the parallel factor P=5 in the row direction.

FIG. 27 illustrates the parity check matrix H after performing the parity interleaving of the D matrix for the parity check matrix H in FIG. 26.

(The coding parity operation unit 615 (FIG. 18) of) the LDPC encoder 115 performs LDPC coding (generates an LDPC code) using the parity check matrix H in FIG. 27, for example.

Here, the LDPC code generated using the parity check matrix H in FIG. 27 is an LDPC code for which parity interleaving has been performed. Therefore, it is not necessary to perform the parity interleaving in the parity interleaver 23 (FIG. 9) for the LDPC code generated using the parity check matrix H in FIG. 27. In other words, the LDPC code generated using the parity check matrix H after the parity interleaving of the D matrix is performed is the LDPC code for which the parity interleaving has been performed. Therefore, the parity interleaving in the parity interleaver 23 is skipped for the LDPC code.

Figure 28:
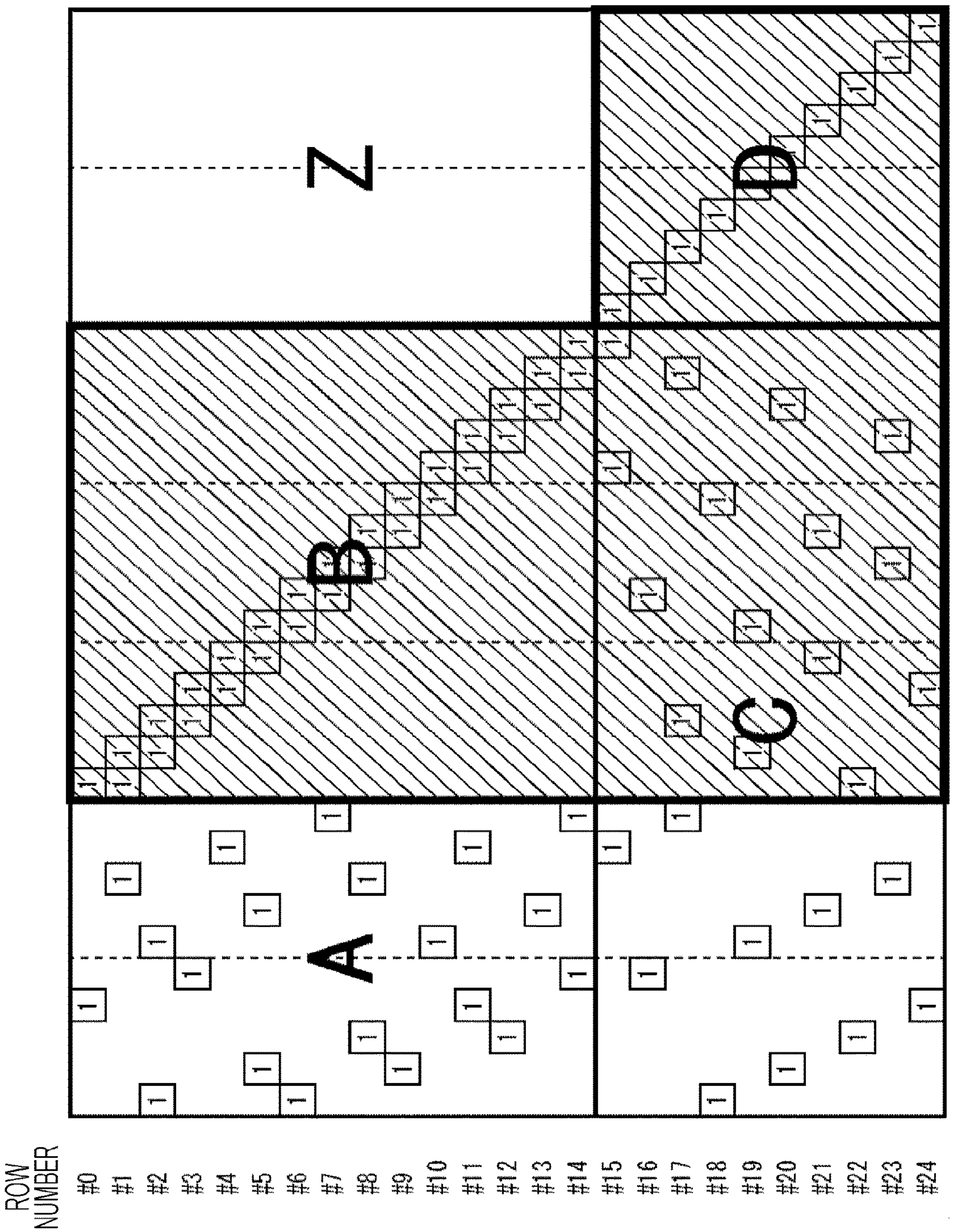
FIG. 28 is a diagram illustrating a parity check matrix in which column permutation as parity deinterleaving for restoring parity interleaving is performed.

FIG. 28 illustrates a parity check matrix H in which column permutation as parity deinterleaving for restoring the parity interleaving is performed for the B matrix, a part of the C matrix (a portion of the C matrix arranged below the B matrix), and the D matrix of the parity check matrix H in FIG. 27.

The LDPC encoder 115 can perform LDPC coding (generates an LDPC code) using the parity check matrix H in FIG. 28.

In a case of performing the LDPC coding using the parity check matrix H in FIG. 28, an LDPC code for which parity interleaving is not performed can be obtained according to the LDPC coding. Therefore, in a case of performing the LDPC coding using the parity check matrix H in FIG. 28, the parity interleaving is performed in the parity interleaver 23 (FIG. 9).

Figure 29:
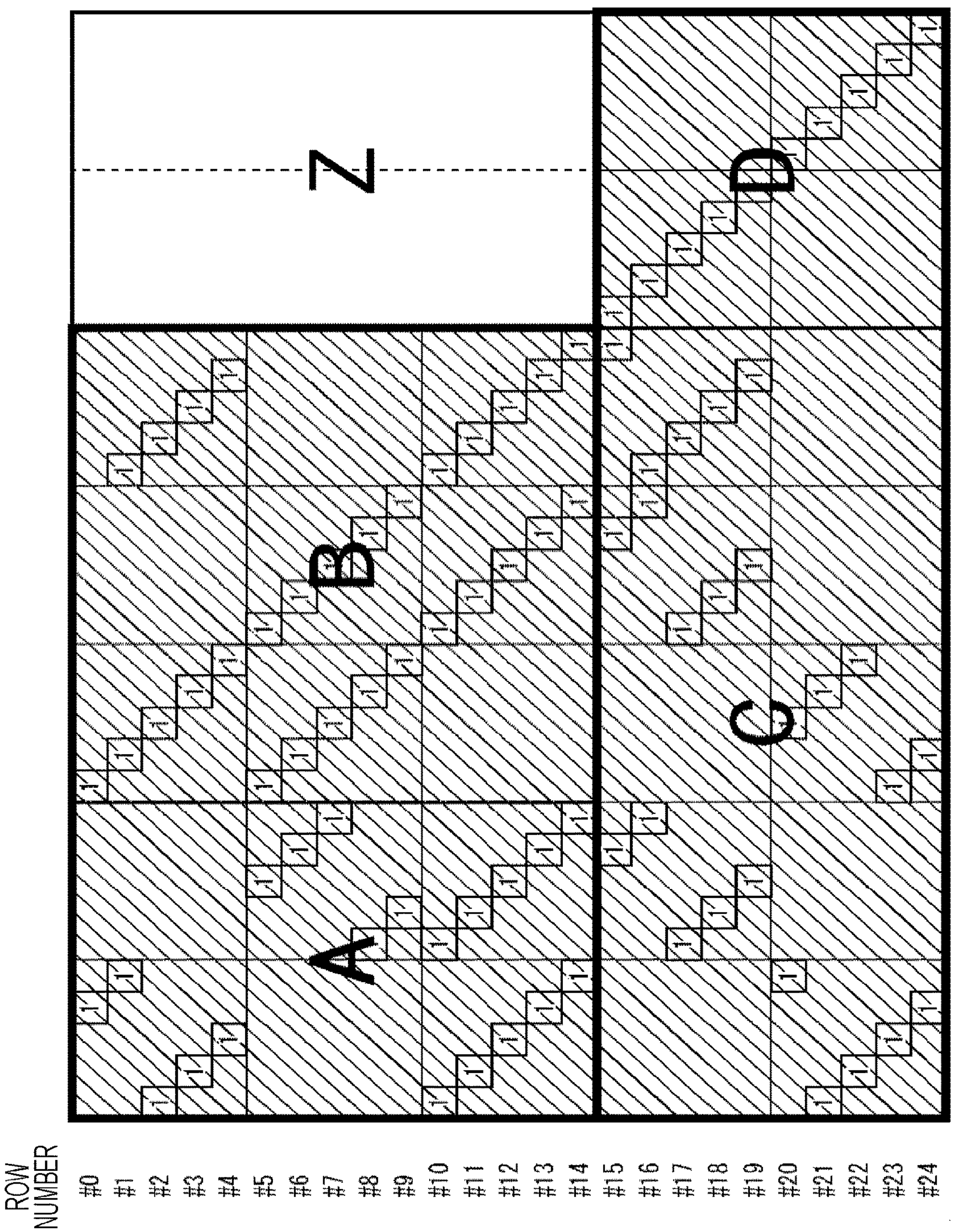
FIG. 29 is a diagram illustrating a transformed parity check matrix obtained by performing row permutation for the parity check matrix.

FIG. 29 is a diagram illustrating a transformed parity check matrix H obtained by performing row permutation for the parity check matrix H in FIG. 27.

The transformed parity check matrix is, as described below, a matrix represented by a combination of a P×P identity matrix, a quasi identity matrix in which one or more of 1s in the identity matrix are 0, a shift matrix obtained by cyclically shifting the identity matrix or the quasi identity matrix, a sum matrix that is a sum of two or more of the identity matrix, the quasi identity matrix, and the shift matrix, and a P×P zero matrix.

By using the transformed parity check matrix for decoding the LDPC code, architecture of performing P check node operations and variable node operations at the same time can be adopted in decoding the LDPC code, as described below.

<New LDPC Code>

One of methods of securing favorable communication quality in data transmission using an LDPC code, there is a method using an LDPC code with high performance.

Hereinafter, a new LDPC code with high performance (hereinafter also referred to as a new LDPC code) will be described.

As the new LDPC code, for example, the type A code or the type B code corresponding to the parity check matrix H having a cyclic structure with the parallel factor P of 360 similar to that of DVB-T.2, ATSC 3.0, or the like, can be adopted.

The LDPC encoder 115 (FIGS. 8 and 18) can perform LDPC coding to obtain an LDPC code, using (a parity check matrix H obtained from) a parity check matrix initial value table of the LDPC code with the code length N of 69120 bits, for example, which is longer than 64 k bits, and the coding rate r of any of 2/16, 3/16, 4/16, 5/16, 6/16, 7/16, 8/16, 9/16, 10/16, 11/16, 12/16, 13/16, or 14/16, for example.

Furthermore, the LDPC encoder 115 can perform LDPC coding to obtain a new LDPC code, using (a parity check matrix H obtained from) a parity check matrix initial value table of the new LDPC code with the code length N of 17280 bits (17 k bits), for example, which is shorter than 64 k bits, and the coding rate r of any of 2/16, 3/16, 4/16, 5/16, 6/16, 7/16, 8/16, 9/16, 10/16, 11/16, 12/16, 13/16, or 14/16, for example.

In the case of performing the LDPC coding to the new LDPC code with the code length N of 17280 bits, a parity check matrix initial value table of the new LDPC code is stored in the storage unit 602 of the LDPC encoder 115 (FIG. 8).

FIG. 30 is a diagram illustrating an example of a parity check matrix initial value table (of the type A method) representing the parity check matrix H of the type A code (hereinafter also referred to as the type A code with r=2/16) as a new LDPC code with the code length N of 17280 bits and the coding rate r of 2/16.

FIG. 31 is a diagram illustrating an example of a parity check matrix initial value table representing the parity check matrix H of the type A code (hereinafter also referred to as the type A code with r=3/16) as a new LDPC code with the code length N of 17280 bits and the coding rate r of 3/16.

FIG. 32 is a diagram illustrating an example of a parity check matrix initial value table representing the parity check matrix H of the type A code (hereinafter also referred to as the type A code with r=4/16) as a new LDPC code with the code length N of 17280 bits and the coding rate r of 4/16.

FIG. 33 is a diagram illustrating an example of a parity check matrix initial value table representing the parity check matrix H of the type A code (hereinafter also referred to as the type A code with r=5/16) as a new LDPC code with the code length N of 17280 bits and the coding rate r of 5/16.

FIG. 34 is a diagram illustrating an example of a parity check matrix initial value table representing the parity check matrix H of the type A code (hereinafter also referred to as the type A code with r=6/16) as a new LDPC code with the code length N of 17280 bits and the coding rate r of 6/16.

FIG. 35 is a diagram illustrating an example of a parity check matrix initial value table representing the parity check matrix H of the type A code (hereinafter also referred to as the type A code with r=7/16) as a new LDPC code with the code length N of 17280 bits and the coding rate r of 7/16.

FIG. 36 is a diagram illustrating an example of a parity check matrix initial value table (of the type B method) representing the parity check matrix H of the type B code (hereinafter also referred to as the type B code with r=7/16) as a new LDPC code with the code length N of 17280 bits and the coding rate r of 7/16.

FIG. 37 is a diagram illustrating an example of a parity check matrix initial value table representing the parity check matrix H of the type B code (hereinafter also referred to as the type B code with r=8/16) as a new LDPC code with the code length N of 17280 bits and the coding rate r of 8/16.

FIG. 38 is a diagram illustrating an example of a parity check matrix initial value table representing the parity check matrix H of the type B code (hereinafter also referred to as the type B code with r=9/16) as a new LDPC code with the code length N of 17280 bits and the coding rate r of 9/16.

FIG. 39 is a diagram illustrating an example of a parity check matrix initial value table representing the parity check matrix H of the type B code (hereinafter also referred to as the type B code with r=10/16) as a new LDPC code with the code length N of 17280 bits and the coding rate r of 10/16.

FIG. 40 is a diagram illustrating an example of a parity check matrix initial value table representing the parity check matrix H of the type B code (hereinafter also referred to as the type B code with r=11/16) as a new LDPC code with the code length N of 17280 bits and the coding rate r of 11/16.

FIG. 41 is a diagram illustrating an example of a parity check matrix initial value table representing the parity check matrix H of the type B code (hereinafter also referred to as the type B code with r=12/16) as a new LDPC code with the code length N of 17280 bits and the coding rate r of 12/16.

FIG. 42 is a diagram illustrating an example of a parity check matrix initial value table representing the parity check matrix H of the type B code (hereinafter also referred to as the type B code with r=13/16) as a new LDPC code with the code length N of 17280 bits and the coding rate r of 13/16.

FIG. 43 is a diagram illustrating an example of a parity check matrix initial value table representing the parity check matrix H of the type B code (hereinafter also referred to as the type B code with r=14/16) as a new LDPC code with the code length N of 17280 bits and the coding rate r of 14/16.

The new LDPC code is an LDPC code with high performance.

Here, the LDPC code with high performance is an LDPC code obtained from an appropriate parity check matrix H.

The appropriate parity check matrix H is, for example, a parity check matrix that satisfies a predetermined condition that makes a bit error rate (BER) (and a frame error rate (FER)) smaller when the LDPC code obtained from the parity check matrix H is transmitted at low $E_s/N_0$ or $E_b/N_o$ (signal power to noise power ratio per bit).

The appropriate parity check matrix H can be obtained by, for example, performing a simulation to measure BERs of when LDPC codes obtained from various parity check matrices satisfying the predetermined condition are transmitted at low $E_s/N_o$.

Examples of the predetermined condition to be satisfied by the appropriate parity check matrix H include a good analysis result obtained by an analysis method of performance of code called density evolution, absence of a loop of the elements of 1, called cycle 4, and the like.

Here, it is known that the decoding performance of the LDPC code is degraded if the elements of 1 are densely packed in the information matrix $H_A$ as in the cycle 4, and therefore, absence of the cycle 4 is desirable in the parity check matrix H.

In the parity check matrix H, a minimum value of the length of a loop (loop length) configured by the elements of 1 is called girth. The absence of the cycle 4 means that the girth is greater than 4.

Note that the predetermined condition to be satisfied by the appropriate parity check matrix H can be appropriately determined from the viewpoints of improvement of the decoding performance of the LDPC code, facilitation (simplification) of the decoding processing for the LDPC code, and the like.

Figure 44:
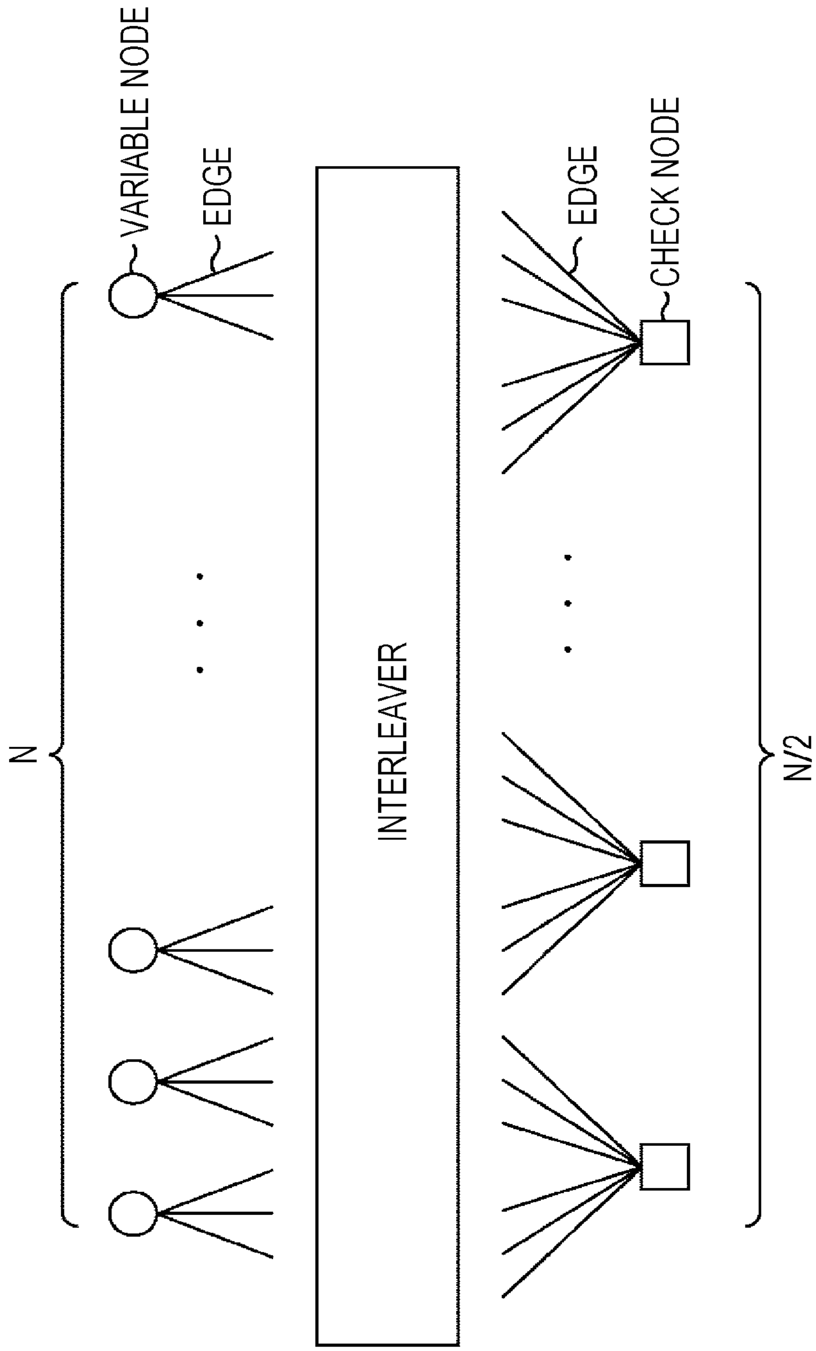
FIG. 44 is a diagram illustrating an example of a Tanner graph of an ensemble of degree sequence with a column weight of 3 and a row weight of 6.
Figure 45:
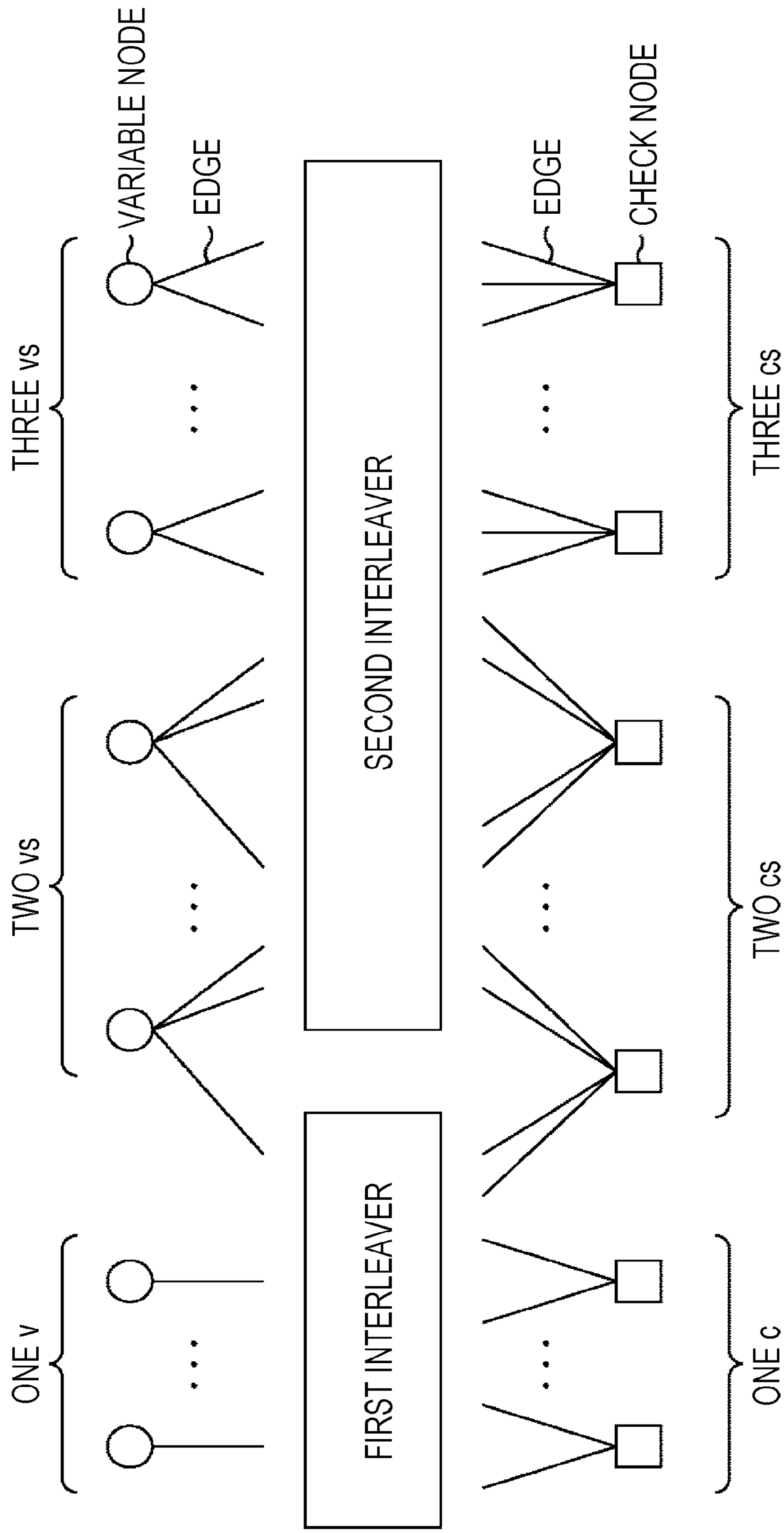
FIG. 45 is a diagram illustrating an example of a Tanner graph of a multi-edge type ensemble.

FIGS. 44 and 45 are diagrams for describing density evolution by which an analysis result as the predetermined condition to be satisfied by the appropriate parity check matrix H can be obtained.

The density evolution is a code analysis method of calculating an expected value of an error probability for the entire LDPC code (ensemble) with the code length N of characterized by a degree sequence to be described below.

For example, when increasing a variance of noise from 0 on an AWGN channel, the expected value of the error probability of an ensemble is initially 0, but the expected value becomes not 0 when the variance of noise becomes a certain threshold or greater.

According to the density evolution, good or bad of the performance of the ensemble (appropriateness of the parity check matrix) can be determined by comparing the threshold of the variance of noise (hereinafter also referred to as performance threshold) at which the expected value of the error probability becomes not 0.

Note that, for a specific LDPC code, an ensemble to which the LDPC code belongs is determined, and the density evolution is performed for the ensemble, whereby rough performance of the LDPC code can be predicted.

Therefore, if an ensemble with high performance is found, the LDPC code with high performance can be found from LDPC codes belonging to the ensemble.

Here, the above-described degree sequence indicates what ratio the variable nodes and check nodes having weights of respective values exist to the code length N of the LDPC code.

For example, a regular (3, 6) LDPC code with the coding rate of ½ belongs to an ensemble characterized by a degree sequence indicating that the weights (column weights) of all the variable nodes are 3 and the weights (row weights) of all the check nodes are 6.

FIG. 44 illustrates a Tanner graph of such an ensemble.

In the Tanner graph in FIG. 44, N variable nodes illustrated by the circles (○) in FIG. 44 exist, the number N being equal to the code length N, and N/2 check nodes illustrated by the squares (□) in FIG. 44 exist, the number N/2 being equal to a multiplication value obtained by multiplying the code length N by the coding rate of ½.

Three edges with an equal column weight are connected to each variable node. Therefore, there are a total of 3N edges connected to the N variable nodes.

Furthermore, six edges with an equal row weight are connected to each check node. Therefore, there are a total of 3N edges connected to the N/2 check nodes.

Moreover, in the Tanner graph in FIG. 44, there is one interleaver.

The interleaver randomly rearranges the 3N edges connected to the N variable nodes and connects each edge after the rearrangement to any of the 3N edges connected to the N/2 check nodes.

The number of patterns for rearranging the 3N edges connected to the N variable nodes in the interleaver is (3N)! (=(3N)×(3N−1)× . . . ×1). Therefore, the ensemble characterized by the degree sequence indicating that the weights of all the variable nodes are 3 and the weights of all the check nodes are 6 is a set of (3N)! LDPC codes.

In the simulation for finding the LDPC code with high performance (appropriate parity check matrix), a multi-edge type ensemble has been used in the density evolution.

In the multi-edge type ensemble, the interleaver which the edges connected to the variable nodes and the edges connected to the check nodes go through is divided into multi edges, whereby characterization of the ensemble is more strictly performed.

FIG. 45 illustrates an example of a Tanner graph of a multi-edge type ensemble.

In the Tanner graph in FIG. 45, there are two interleavers: a first interleaver and a second interleaver.

Furthermore, in the Tanner graph in FIG. 45, v1 variable nodes each having one edge connected to the first interleaver and 0 edges connected to the second interleaver, v2 variable nodes each having one edge connected to the first interleaver and two edges connected to the second interleaver, and v3 variable nodes each having 0 edges connected to the first interleaver and two edges connected to the second interleaver exist.

Moreover, in the Tanner graph in FIG. 45, c1 check nodes each having two edges connected to the first interleaver and 0 edges connected to the second interleaver, c2 check nodes each having two edges connected to the first interleaver and two edges connected to the second interleaver, and c3 check nodes each having 0 edges connected to the first interleaver and three edges connected to the second interleaver exist.

Here, the density evolution and its implementation are described in, for example, "On the Design of Low-Density Parity-Check Codes within 0.0045 dB of the Shannon Limit", S. Y. Chung, C. D. Forney, T. J. Richardson, R. Urbanke, IEEE Communications Leggers, VOL. 5, NO. 2, February 2001.

In the simulation for finding (the parity check matrix of) the new LDPC code, an ensemble in which the performance threshold that is $E_b/N_0$ (signal power to noise power ratio per bit) at which BER starts to drop (starts to become small) becomes a predetermined value or less has been found by the multi-edge type density evolution, and the LDPC code that makes BER in a case of using one or more quadrature modulations such as QPSK small has been selected from among the LDPC codes belonging to the ensemble, as the LDPC code with high performance.

(The parity check matrix initial value table representing the parity check matrix of) the new LDPC code has been obtained by the above simulation.

Therefore, according to the new LDPC code, favorable communication quality can be secured in data transmission.

Figure 46:
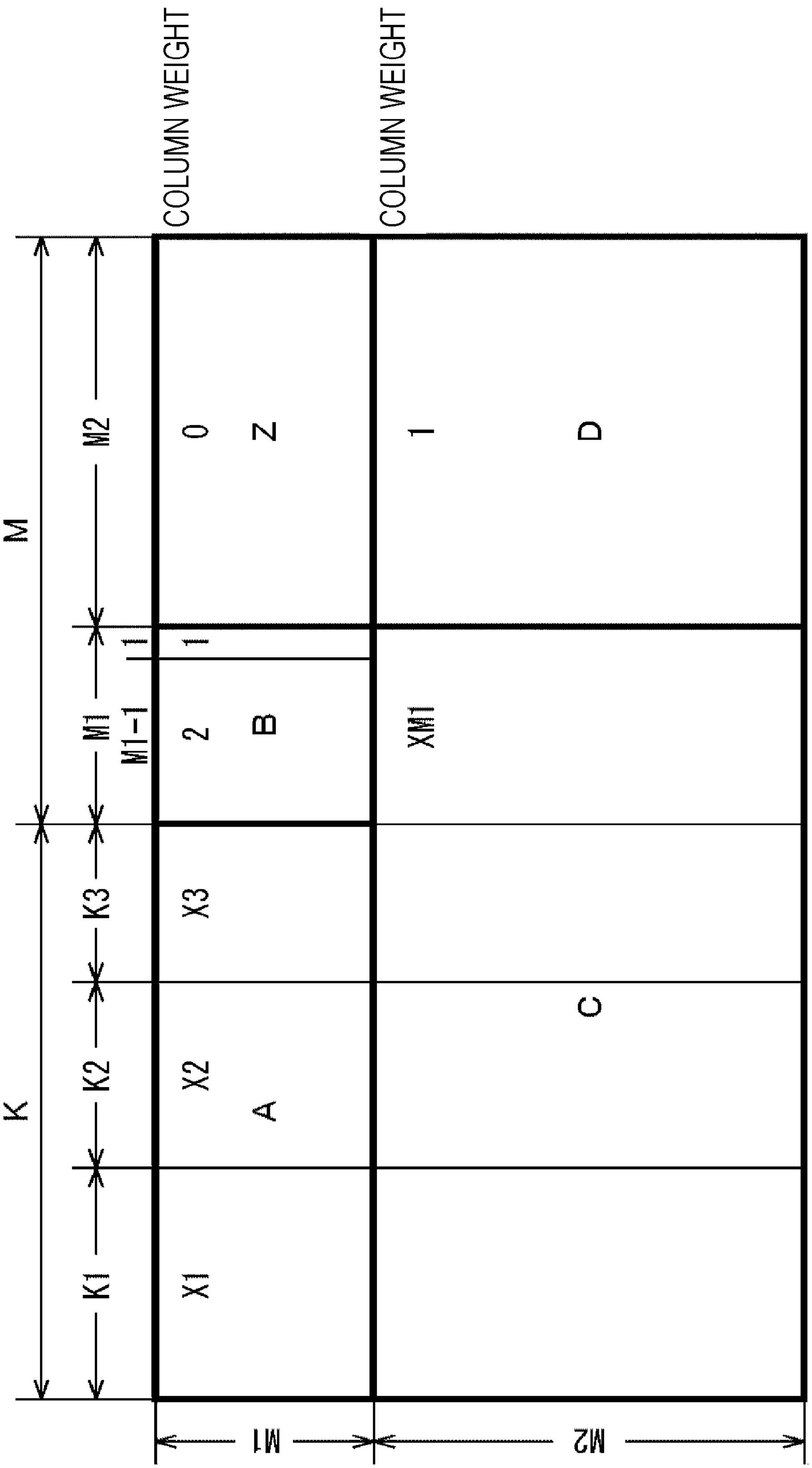
FIG. 46 is a diagram for describing a parity check matrix by a type A method.

FIG. 46 is a diagram for describing the column weights of the parity check matrix H of the type A code as the new LDPC code.

In regard to the parity check matrix H of the type A code, as illustrated in FIG. 46, the column weight of K1 columns from the 1st column of the A matrix and the C matrix is represented as X1, the column weight of the following K2 columns of the A matrix and the C matrix is represented as X2, the column weight of the following K3 columns of the A matrix and the C matrix is represented as X3, and the column weight of the following M1 columns of the C matrix is represented as XM1.

Note that K1+K2+K3 is equal to the information length K, and M1+M2 is equal to the parity length M. Therefore, K1+K2+K3+M1+M2 is equal to the code length N=17280 bits.

Furthermore, in regard to the parity check matrix H of the type A code, the column weight of M1−1 columns from the 1st column of the B matrix is 2, and the column weight of the M1-th column (last column) of the B matrix is 1. Moreover, the column weight of the D matrix is 1 and the column weight of the Z matrix is 0.

FIG. 47 is a diagram illustrating parameters of parity check matrices H of the type A codes (represented by the parity check matrix initial value tables) in FIGS. 30 to 35.

K, X1, K1, X2, K2, X3, K3, XM1, M1, and M2 as parameters of the parity check matrices H of the type A codes of r=2/16, 3/16, 4/16, 5/16, 6/16, and 7/16 are as illustrated in FIG. 47.

The parameters X1, K1, X2, K2, X3, K3, XM1, M1 (or M2) are set to further improve the performance (for example, the error rate or the like) of the LDPC codes.

Figure 48:
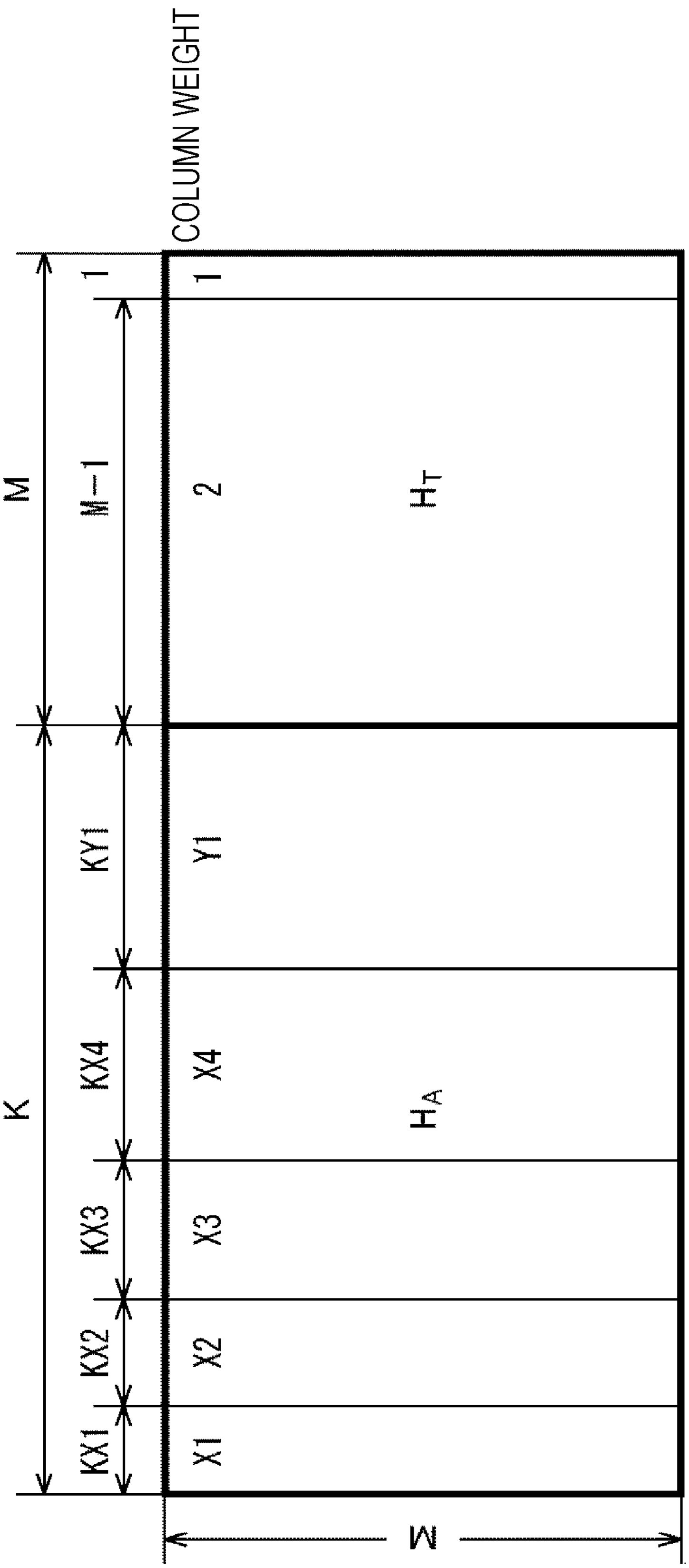
FIG. 48 is a diagram for describing a parity check matrix by a type B method.

FIG. 48 is a diagram for describing the column weights of the parity check matrix H of the type B code as the new LDPC code.

In regard to the parity check matrix H of the type B code, as illustrated in FIG. 48, the column weight of KX1 columns from the 1st column is represented as X1, the column weight of the following KX2 columns is represented as X2, the column weight of KX3 columns is represented as X3, the column weight of the following KX4 columns is represented as X4, and the column weight of the following KY1 columns is represented as Y1.

Note that KX1+KX2+KX3+KX4+KY1 is equal to the information length K, and KX1+KX2+KX3+KX4+KY1+M is equal to the code length N=17280 bits.

Furthermore, in regard to the parity check matrix H of the type B code, the column weight of M−1 columns excluding the last one column, of the last M columns, is 2, and the column weight of the last one column is 1.

FIG. 49 is a diagram illustrating parameters of parity check matrices H of the type B codes (represented by the parity check matrix initial value tables) in FIGS. 36 to 43.

K, X1, KX1, X2, KX2, X3, KX3, X4, KX4, Y1, KY1, and M as parameters of the parity check matrices H of the type B codes of r=7/16, 8/16, 9/16, 10/16, 11/16, 12/16, 13/16, and 14/16 are as illustrated in FIG. 49.

The parameters X1, KX1, X2, KX2, X3, KX3, X4, KX4, Y1, and KY1 are set so as to further improve the performance of the LDPC codes.

According to the new LDPC code, favorable BER/FER is realized, and a capacity (communication path capacity) close to the Shannon limit is realized.

<Constellation>

FIGS. 50 to 74 are diagrams illustrating examples of constellations adaptable in the transmission system in FIG. 7.

In the transmission system in FIG. 7, for example, a constellation to be used in MODCOD that is a combination of a modulation method (MODulation) and the LDPC code (CODe) can be set for the MODCOD.

One or more constellations can be set for one MODCOD.

As the constellation, there are a uniform constellation (UC) in which arrangement of signal points is uniform and a non uniform constellation (NUC) in which arrangement of signal points are not uniform.

Furthermore, as the NUC, there are a constellation called 1-dimensional ($M^2$-QAM) non-uniform constellation (1D-NUC), a constellation called 2-dimensional (QQAM) non-uniform constellation (2D-NUC), and the like, for example.

In general, the BER is further improved in the 1D-NUC than the UC, and moreover, the BER is further improved in the 2D-NUC than the 1D-NUC.

The constellation with the modulation method of QPSK is the UC. For example, the UC or the 2D-NUC can be adopted as a constellation for the modulation method of 16QAM, 64QAM, 256QAM, or the like. For example, the UC or the 1D-NUC can be adopted as a constellation for the modulation method of 1024QAM, 4096QAM, or the like.

In the transmission system in FIG. 7, for example, constellations defined in ATSC 3.0, DVB-C.2, or the like, and various other constellations that improve the error rate can be used.

In other words, in the case where the modulation method is QPSK, for example, the same UC can be used for the coding rates r of the LDPC codes.

Furthermore, in the case where the modulation method is 16QAM, 64QAM, or 256QAM, for example, the same UC can be used for the coding rates r of the LDPC codes.

Moreover, in the case where the modulation method is 16QAM, 64QAM, or 256QAM, for example, different 2D-NUCs can be used for the coding rates r of the LDPC codes, respectively.

Furthermore, in the case where the modulation method is 1024QAM, or 4096QAM, for example, the same UC can be used for each coding rate r of the LDPC code. Moreover, in the case where the modulation method is 1024QAM, or 4096QAM, for example, different 1D-NUCs can be used for the coding rates r of the LDPC codes, respectively.

Here, the UC of QPSK is also described as QPSK-UC, and the UC of $2^m$QAM is also described as $2^m$QAM-UC. Furthermore, the 1D-NUC and 2D-NUC of $2^m$QAM are also described as $2^m$QAM-1D-NUC and $2^m$QAM-2D-NUC, respectively.

Hereinafter, some of constellations defined in ATSC 3.0 will be described.

FIG. 50 is a diagram illustrating coordinates of QPSK-UC signal points used for all the coding rates of the LDPC codes defined in ATSC 3.0 in the case where the modulation method is QPSK.

In FIG. 50, "Input Data cell y" indicates a 2-bit symbol to be mapped to QPSK-UC, and "Constellation point $z_s$" indicates a coordinate of a signal point $z_s$. Note that an index s of the signal point $z_s$ (an index q of a signal point $z_q$ as described below is similar) indicates discrete time of symbols (time interval between one symbol and a next symbol).

In FIG. 50, the coordinate of the signal point $z_s$ is expressed in the form of a complex number, and j represents an imaginary unit ($\sqrt{(-1)}$).

FIG. 51 is a diagram illustrating coordinates of signal points of 16QAM-2D-NUC used for the coding rates r (CR)=2/15, 3/15, 4/15, 5/15, 6/15, 7/15, 8/15, 9/15, 10/15, 11/15, 12, 15, and 13/15 of the LDPC codes defined in ATSC 3.0 in the case where the modulation method is 16QAM.

In FIG. 51, the coordinate of the signal point $z_s$ is expressed in the form of a complex number, and j represents an imaginary unit, similarly to FIG. 50.

In FIG. 51, w#k represents a coordinate of a signal point in the first quadrant of the constellation.

In the 2D-NUC, a signal point in the second quadrant of the constellation is arranged at a position obtained by symmetrically moving a signal point in the first quadrant with respect to a Q axis, and a signal point in the third quadrant of the constellation is arranged at a position obtained by symmetrically moving a signal point in the first quadrant with respect to the origin. Then, a signal point in the fourth quadrant of the constellation is arranged at a position obtained by symmetrically moving a signal point in the first quadrant with respect to an I axis.

Here, in the case where the modulation method is $2^m$QAM, m bits are regarded as one symbol, and the one symbol is mapped to a signal point corresponding to the symbol.

The m-bit symbol can be expressed by, for example, an integer value of 0 to $2^m-1$. Now, symbols y(0), y(1), . . . , y($2^m-1$) expressed by integer values of 0 to $2^m-1$ can be classified into four groups of symbols y(0) to y(b−1), y(b) to y(2b−1), y(2b) to y(3b−1), and y(3b) to y(4b−1), where $b=2^m/4$.

In FIG. 51, the suffix k of w#k takes an integer value in a range of 0 to b−1, and w#k represents a coordinate of a signal point corresponding to a symbol y(k) in a range of symbols y(0) to y(b−1).

Then, a coordinate of a signal point corresponding to a symbol y(k+b) in a range of symbols y(b) to y(2b−1) is represented as −conj(w#k), and a coordinate of a signal point corresponding to a symbol y(k+2b) in a range of symbols y(2b) to y(3b−1) is represented as conj(w#k). Furthermore, a coordinate of a signal point corresponding to a symbol y(k+3b) in a range of symbols y(3b) to y(4b−1) is represented by −w#k.

Here, conj(w#k) represents a complex conjugate of w#k.

For example, in a case where the modulation method is 16QAM, symbols y(0), y(1), . . . , and y(15) of m=4 bits are classified into four groups of symbols y(0) to y(3), y(4) to y(7), y(8) to y(11), and y(12) to y(15), where $b=2^4/4=4$.

Then, for example, the symbol y(12), of the symbols y(0) to y(15), is a symbol y(k+3b)=y(0+3×4) in the range of symbols y(3b) to y(4b−1)) and k=0, and therefore the coordinate of the signal point corresponding to the symbol y(12) is −w#k=−w0.

Now, w0 in a case where the modulation method is 16QAM and the coding rate r is 9/15 is 0.2386+j0.5296 according to FIG. 51, where the coding rate r (CR) of the LDPC code is, for example, 9/15. Therefore, the coordinate −w0 of the signal point corresponding to the symbol y(12) is −(0.2386+j0.5296).

FIG. 52 is a diagram illustrating examples of coordinates of signal points of 1024QAM-1D-NUC used for the coding rates r (CR)=2/15, 3/15, 4/15, 5/15, 6/15, 7/15, 8/15, 9/15, 10/15, 11/15, 12, 15, and 13/15 of the LDPC codes defined in ATSC 3.0 in the case where the modulation method is 1024QAM.

In FIG. 52, u#k represents a real part Re($z_s$) and an imaginary part Im($z_s$) of the complex number as the coordinate of the signal point $z_s$ of 1D-NUC, and is a component of a vector u=(u0, u1, . . . , u#V−1) called position vector. The number V of the components u#k of the position vector u is given by an expression $V=(2^m)/2$.

FIG. 53 is a diagram illustrating a relationship between the symbol y of 1024QAM and (the component u#k of) the position vector u.

Now, it is assumed that the 10-bit symbol y of 1024QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$.

A in FIG. 53 illustrates a correspondence between the even-numbered 5 bits $y_{1,s}$, $y_{3,s}$, $y_{5,s}$, $y_{7,s}$, $y_{9,s}$ of the symbol y, and u#k representing the real part Re($z_s$) of (the coordinate) of the signal point $z_s$ corresponding to the symbol y.

B in FIG. 53 illustrates a correspondence between the odd-numbered 5 bits $y_{0,s}$, $y_{2,s}$, $y_{4,s}$, $y_{6,s}$, $y_{8,s}$ of the symbol y, and u#k representing the imaginary part Im($z_s$) of the signal point $z_s$ corresponding to the symbol y.

In a case where the 10-bit symbol y=($y_{0,s}$, $y_{1,s}$, $y_{2,s}$, $y_{3,s}$, $y_{4,s}$, $y_{5,s}$, $y_{6,s}$, $y_{7,s}$, $y_{8,s}$, $y_{9,s}$) of 1024QAM is (0,0,1,0,0,1,1,1,0,0), for example, the odd-numbered 5 bits ($y_{0,s}$, $y_{2,s}$, $y_{4,s}$, $y_{6,s}$, $y_{8,s}$) are (0, 1, 0, 1, 0) and the even-numbered 5 bits ($y_{1,s}$, $y_{3,s}$, $y_{5,s}$, $y_{7,s}$, $y_{9,s}$) are (0, 0, 1, 1, 0).

In A in FIG. 53, the even-numbered 5 bits (0, 0, 1, 1, 0) are associated with u11, and therefore the real part Re($z_s$) of the signal point $z_s$ corresponding to the symbol y=(0, 0, 1, 0, 0, 1, 1, 1, 0, 0) is u11.

In B in FIG. 53, the odd-numbered 5 bits (0, 1, 0, 1, 0) are associated with u3, and therefore the imaginary part Im($z_s$) of the signal point $z_s$ corresponding to the symbol y=(0, 0, 1, 0, 0, 1, 1, 1, 0, 0) is u3.

Meanwhile, when the coding rate r of the LDPC code is 6/15, for example, u3 is 0.1295 and u11 is 0.7196 according to FIG. 52 in regard to the 1D-NUC used in a case where the modulation method is 1024QAM and the coding rate r (CR) of the LDPC code=6/15.

Therefore, the real part Re($z_s$) of the signal point $z_s$ corresponding to the symbol y=(0, 0, 1, 0, 0, 1, 1, 1, 0, 0) is u11=0.7196 and the imaginary part Im($z_s$) is u3=0.1295. As a result, the coordinate of the signal point $z_s$ corresponding to the symbol y=(0, 0, 1, 0, 0, 1, 1, 1, 0, 0) is expressed by 0.7196+j0.1295.

Note that the signal points of the 1D-NUC are arranged in a lattice on a straight line parallel to the I axis and a straight line parallel to the Q axis in the constellation. However, the interval between signal points is not constant. Furthermore, average power of the signal points on the constellation can be normalized in transmission of (data mapped to) the signal points. Normalization can be performed by, where the root mean square of absolute values of all (the coordinates of) the signal points on the constellation is $P_{ave}$, multiplying each signal point $z_s$ on the constellation by a reciprocal $1/(\sqrt{P_{ave}})$ of the square root $\sqrt{P_{ave}}$ of the root mean square value $P_{ave}$.

The transmission system in FIG. 7 can use the constellation defined in ATSC 3.0 as described above.

FIGS. 54 to 65 illustrate coordinates of signal points of UCs defined in DVB-C.2.

In other words, FIG. 54 is a diagram illustrating a real part $Re(z_q)$ of a coordinate $z_q$ of a signal point of QPSK-UC (UC in QPSK) defined in DVB-C.2. FIG. 55 is a diagram illustrating an imaginary part $Im(z_q)$ of a coordinate $z_q$ of a signal point of QPSK-UC defined in DVB-C.2.

FIG. 56 is a diagram illustrating a real part $Re(z_q)$ of a coordinate $z_q$ of a signal point of 16QAM-UC (UC of 16QAM) defined in DVB-C.2. FIG. 57 is a diagram illustrating an imaginary part $Im(z_q)$ of a coordinate $z_q$ of a signal point of 16QAM-UC defined in DVB-C.2.

FIG. 58 is a diagram illustrating a real part $Re(z_q)$ of a coordinate $z_q$ of a signal point of 64QAM-UC (UC of 64QAM) defined in DVB-C.2. FIG. 59 is a diagram illustrating an imaginary part $Im(z_q)$ of a coordinate $z_q$ of a signal point of 64QAM-UC defined in DVB-C.2.

FIG. 60 is a diagram illustrating a real part $Re(z_q)$ of a coordinate $z_q$ of a signal point of 256QAM-UC (UC of 256QAM) defined in DVB-C.2. FIG. 61 is a diagram illustrating an imaginary part $Im(z_q)$ of a coordinate $z_q$ of a signal point of 256QAM-UC defined in DVB-C.2.

FIG. 62 is a diagram illustrating a real part $Re(z_q)$ of a coordinate $z_q$ of a signal point of 1024QAM-UC (UC of 1024QAM) defined in DVB-C.2. FIG. 63 is a diagram illustrating an imaginary part $Im(z_q)$ of a coordinate $z_q$ of a signal point of 1024QAM-UC defined in DVB-C.2.

FIG. 64 is a diagram illustrating a real part $Re(z_q)$ of a coordinate $z_q$ of a signal point of 4096QAM-UC (UC of 4096QAM) defined in DVB-C.2. FIG. 65 is a diagram illustrating an imaginary part $Im(z_q)$ of a coordinate $z_q$ of a signal point of 4096QAM-UC defined in DVB-C.2.

Note that, in FIGS. 54 to 65, $y_{i,q}$ represent the (i+1)th bit from the head of the m-bit symbol (for example, a 2-bit symbol in QPSK) of $2^m$QAM. Furthermore, average power of the signal points on the constellation can be normalized in transmission of (data mapped to) the signal points of UC. Normalization can be performed by, where the root mean square of absolute values of all (the coordinates of) the signal points on the constellation is $P_{ave}$, multiplying each signal point $z_q$ on the constellation by a reciprocal $1/(\sqrt{P_{ave}})$ of the square root $\sqrt{P_{ave}}$ of the root mean square value $P_{ave}$.

In the transmission system in FIG. 7, the UC defined in DVB-C.2 as described above can be used.

In other words, the UCs illustrated in FIGS. 54 to 65 can be used for the new LDPC codes (corresponding to the parity check matrix initial value tables) with the code length N of 17280 bits and the coding rates r of 2/16, 3/16, 4/16, 5/16, 6/16, 7/16, 8/16, 9/16, 10/16, 11/16, 12/16, 13/16, and 14/16 in FIGS. 30 to 43.

FIGS. 66 to 74 are diagrams illustrating examples of coordinates of signal points of NUC, which can be used for the new LDPC codes with the code length N of 17280 bits and the coding rates r of 2/16, 3/16, 4/16, 5/16, 6/16, 7/16, 8/16, 9/16, 10/16, 11/16, 12/16, 13/16, and 14/16 in FIGS. 30 to 43.

That is, FIG. 66 is a diagram illustrating examples of a coordinate of a signal point of 16QAM-2D-NUC that can be used for the new LDPC code.

FIG. 67 is a diagram illustrating examples of a coordinate of a signal point of 64QAM-2D-NUC that can be used for the new LDPC code.

FIGS. 68 and 69 are diagrams illustrating examples of a coordinate of a signal point of 256QAM-2D-NUC that can be used for the new LDPC code.

Note that FIG. 69 is a diagram following FIG. 68.

In FIGS. 66 to 69, the coordinate of the signal point $z_s$ is expressed in the form of a complex number, and j represents an imaginary unit, similarly to FIG. 51.

In FIGS. 66 to 69, w#k represents a coordinate of a signal point in the first quadrant of the constellation, similarly to FIG. 51.

Here, as described in FIG. 51, when the m-bit symbol can be expressed by, for example, an integer value of 0 to $2^m-1$ and $b=2^m/4$, the symbols y(0), y(1), . . . , $y(2^m-1)$ expressed by integer values of 0 to $2^m-1$ can be classified into four groups of symbols y(0) to y(b−1), y(b) to y(2b−1), y(2b) to y(3b−1), and y(3b) to y(4b−1).

In FIGS. 66 to 69, the suffix k of w#k takes an integer value in the range of 0 to b−1, and w#k represents a coordinate of a signal point corresponding to the symbol y(k) in the range of symbols y(0) to y(b−1), similarly to FIG. 51.

Moreover, in FIGS. 66 to 69, a coordinate of a signal point corresponding to the symbol y(k+3b) in the range of symbols y(3b) to y(4b−1) is represented by −w#k, similarly to FIG. 51.

Note that, in FIG. 51, a coordinate of a signal point corresponding to the symbol y(k+b) in the range of symbols y(b) to y(2b−1) is represented as −conj(w#k), and a coordinate of a signal point corresponding to the symbol y(k+2b) in the range of symbols y(2b) to y(3b−1) is represented as conj(w#k). However, the sign of conj is inverted in FIGS. 66 to 69.

In other words, in FIGS. 66 to 69, a coordinate of a signal point corresponding to the symbol y(k+b) in the range of symbols y(b) to y(2b−1) is represented as conj(w#k), and a coordinate of a signal point corresponding to the symbol y(k+2b) in the range of symbols y(2b) to y(3b−1) is represented as −conj(w#k).

FIG. 70 is a diagram illustrating examples of a coordinate of a signal point of 1024QAM-1D-NUC that can be used for the new LDPC code.

In other words, FIG. 70 is a diagram illustrating a relationship between the real part $Re(z_s)$ and the imaginary part $Im(z_s)$ of the complex number as the coordinate of the signal point $z_s$ of 1024QAM-1D-NUC and the (component u#k of) the position vector u.

FIG. 71 is a diagram illustrating the relationship between the symbol y of 1024QAM and (the component u#k of) the position vector u in FIG. 70.

In other words, now, it is assumed that the 10-bit symbol y of 1024QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$.

A in FIG. 71 illustrates a correspondence between the odd-numbered 5 bits $y_{0,s}$, $y_{2,s}$, $y_{4,s}$, $y_{6,s}$, $y_{8,s}$ from (the head of) the 10-bit symbol y, and the position vector u#k representing the real part $Re(z_s)$ of (the coordinate of) the signal point $z_s$ corresponding to the symbol y.

B in FIG. 71 illustrates a correspondence between the even-numbered 5 bits $y_{1,s}$, $y_{3,s}$, $y_{5,s}$, $y_{7,s}$, $y_{9,s}$, of the 10-bit symbol y, and the position vector u#k representing the imaginary part $Im(z_s)$ of the signal point $z_s$ corresponding to the symbol y.

Since the way of obtaining the coordinate of the signal point $z_s$ of when the 10-bit symbol y of 1024QAM is mapped to the signal point $z_s$ of 1024QAM-1D-NUC defined in FIGS. 70 and 71 is similar to the case described in FIGS. 52 and 53, description is omitted.

FIG. 72 is a diagram illustrating examples of a coordinate of a signal point of 4096QAM-1D-NUC that can be used for the new LDPC code.

In other words, FIG. 72 is a diagram illustrating a relationship between the real part $Re(z_s)$ and the imaginary part $Im(z_s)$ of the complex number as the coordinate of the signal point $z_s$ of 4096QAM-1D-NUC and the position vector u (u#k).

FIGS. 73 and 74 are diagrams illustrating the relationship between the symbol y of 4096QAM and (the component u#k of) the position vector u in FIG. 72.

In other words, now, it is assumed that the 12-bit symbol y of 4096QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, $y_{9,s}$, $y_{10,s}$, and $y_{11,s}$.

FIG. 73 illustrates a correspondence between the odd-numbered 6 bits $y_{0,s}$, $y_{2,s}$, $y_{4,s}$, $y_{6,s}y_{8,s}$, $y_{10,s}$ of the 12-bit symbol y, and the position vector u#k representing the real part $Re(z_s)$ of the signal point $z_s$ corresponding to the symbol y.

FIG. 74 illustrates a correspondence between the even-numbered 6 bits $y_{1,s}$, $y_{3,s}$, $y_{5,s}$, $y_{7,s}$, $y_{9,s}$, $y_{11,s}$ of the 12-bit symbol y, and the position vector u#k representing the imaginary part $Im(z_s)$ of the signal point $z_s$ corresponding to the symbol y.

Since the way of obtaining the coordinate of the signal point $z_s$ of when the 12-bit symbol y of 4096QAM is mapped to the signal point $z_s$ of 4096QAM-1D-NUC defined in FIGS. 72 to 74 is similar to the case described in FIGS. 52 and 53, description is omitted.

Note that average power of the signal points on the constellation can be normalized in transmission of (data mapped to) the signal points of the NUCs in FIGS. 66 to 74. Normalization can be performed by, where the root mean square of absolute values of all (the coordinates of) the signal points on the constellation is $P_{ave}$, multiplying each signal point $z_s$ on the constellation by a reciprocal $1/(\sqrt{P_{ave}})$ of the square root $\sqrt{P_{ave}}$ of the root mean square value $P_{ave}$. Furthermore, in FIG. 53 described above, the odd-numbered bits of the symbol y are associated with the position vector u#k representing the imaginary part $Im(z_s)$ of the signal point $z_s$ and the even-numbered bits of the symbol y are associated with the position vector u#k representing the real part $Re(z_s)$ of the signal point $z_s$. In FIG. 71, and FIGS. 73 and 74, conversely, the odd-numbered bits of the symbol y are associated with the position vector u#k representing the real part $Re(z_s)$ of the signal point $z_s$ and the even-numbered bits of the symbol y are associated with the position vector u#k representing the imaginary part $Im(z_s)$ of the signal point $z_s$.

<Block Interleaver 25>

Figure 75:
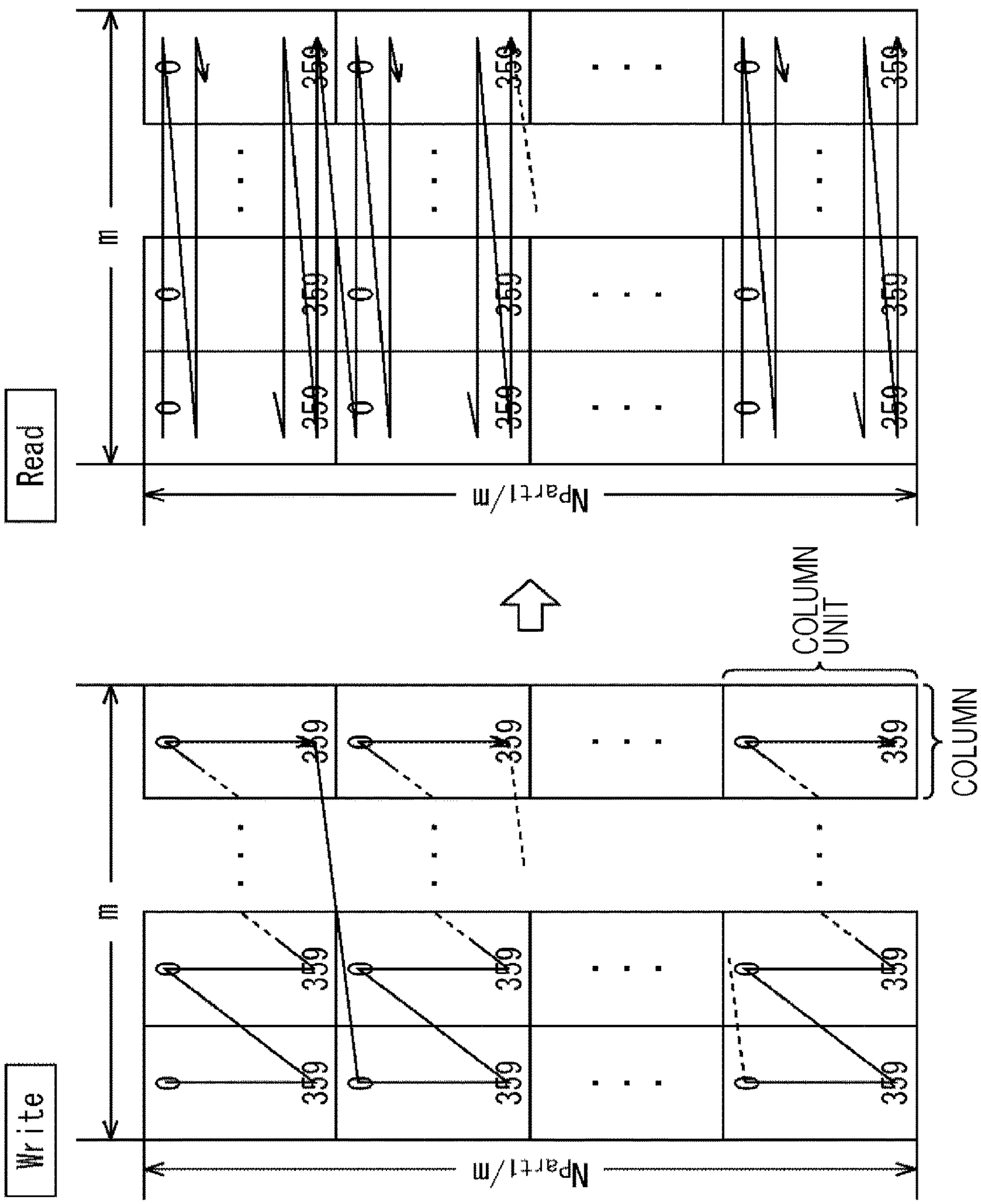
FIG. 75 is a diagram for describing block interleaving performed by a block interleaver 25.

FIG. 75 is a diagram for describing block interleaving performed by the block interleaver 25 in FIG. 9.

The block interleaving is performed by dividing the LDPC code of one codeword into a part called part 1 and a part called part 2 from the head of the LDPC code.

Npart 1+Npart 2 is equal to the code length N, where the length (bit length) of part 1 is Npart 1 and the length of part 2 is Npart 2.

Conceptually, in the block interleaving, columns as storage regions each storing Npart1/m bits in a column (vertical) direction as one direction are arranged in a row direction orthogonal to the column direction by the number m equal to the bit length m of the symbol, and each column is divided from the top into a small unit of 360 bits that is the parallel factor P. This small unit of column is also called column unit.

In the block interleaving, as illustrated in FIG. 75, writing of part 1 of the LDPC code of one codeword downward (in the column direction) from the top of the first column unit of the column is performed in the columns from left to right direction.

Then, when the writing to the first column unit of the rightmost column is completed, the writing returns to the leftmost column, and writing downward from the top of the second column unit of the column is performed in the columns from the left to right direction, as illustrated in FIG. 75. Hereinafter, writing of part 1 of the LDPC code of one codeword is similarly performed.

When the writing of part 1 of the LDPC code of one codeword is completed, part 1 of the LDPC code is read in units of m bits in the row direction from the first column of all the m columns, as illustrated in FIG. 75.

The unit of m bits of part 1 is supplied from the block interleaver 25 to the mapper 117 (FIG. 8) as the m-bit symbol.

The reading of part 1 in units of m bits is sequentially performed toward lower rows of the m columns. When the reading of part 1 is completed, part 2 is divided into units of m bits from the top and is supplied from the block interleaver 25 to the mapper 117 as the m-bit symbol.

Therefore, part 1 is symbolized while being interleaved, and part 2 is sequentially dividing into m bits and symbolized without being interleaved.

Npart1/m as the length of the column is a multiple of 360 as the parallel factor P, and the LDPC code of one codeword is divided into part 1 and part 2 so that Npart1/m becomes a multiple of 360.

FIG. 76 is a diagram illustrating examples of part 1 and part 2 of the LDPC code with the code length N of 69120 bits in the case where the modulation method is QPSK, 16QAM, 64QAM, 256QAM, 1024QAM, and 4096QAM.

In FIG. 76, part 1 is 68400 bits and part 2 is 720 bits in a case where the modulation method is 1024QAM, and part 1 is 69120 bits and part 2 is 0 bits in cases where the modulation methods are QPSK, 16QAM, 64QAM, 256QAM, and 4096QAM.

<Group-Wise Interleaving>

Figure 77:
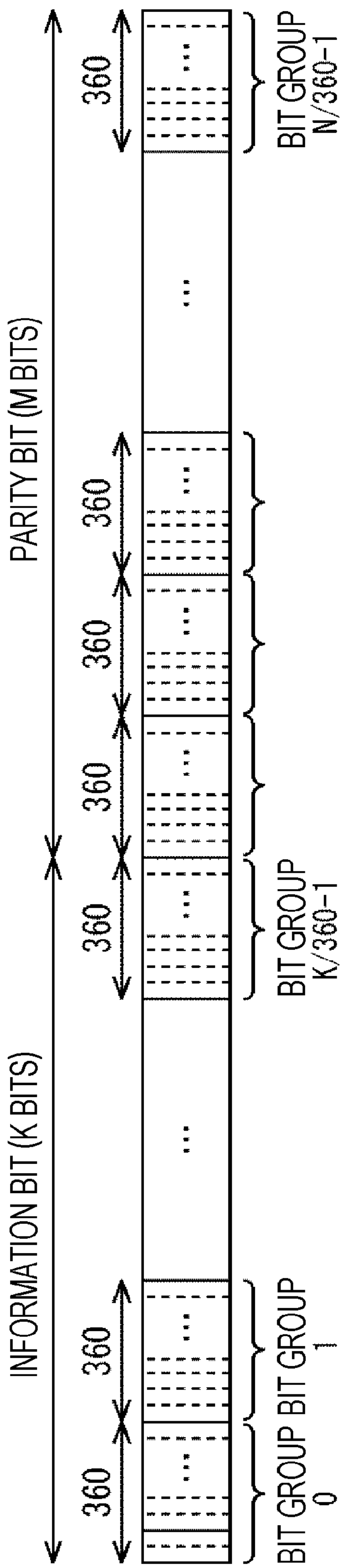
FIG. 77 is a diagram for describing group-wise interleaving performed by a group-wise interleaver 24.

FIG. 77 is a diagram for describing group-wise interleaving performed by the group-wise interleaver 24 in FIG. 9.

In the group-wise interleaving, as illustrated in FIG. 77, the LDPC code of one codeword is interleaved in units of bit groups according to a predetermined pattern (hereinafter also referred to as GW pattern) where one section of 360 bits is set as a bit group, the one section of 360 bits being obtained by dividing the LDPC code of one codeword into units of 360 bits, the unit being equal to the parallel factor P, from the head of the LDPC code.

Here, the (i+1)th bit group from the head of when the LDPC code of one codeword is divided into bit groups is hereinafter also described as bit group i.

In a case where the parallel factor P is 360, for example, an LDPC code with the code length N of 1800 bits is divided into 5 (=1800/360) bit groups of bit groups 0, 1, 2, 3, and 4. Moreover, for example, an LDPC code with the code length N of 69120 bits is divided into 192 (=69120/360) bit groups of the bit groups 0, 1, . . . , 191. Moreover, for example, an LDPC code with the code length N of 17280 bits is divided into 48 (=17280/360) bit groups of the bit groups 0, 1, . . . , 47.

Hereinafter, the GW pattern is represented by a sequence of numbers representing a bit group. For example, regarding the LDPC code of five bit groups 0, 1, 2, 3, and 4 with the code length N of 1800 bits, GW patterns 4, 2, 0, 3, and 1 represent interleaving (rearranging) a sequence of the bit groups 0, 1, 2, 3, and 4 with a sequence of the bit groups 4, 2, 0, 3, and 1, for example.

For example, now, it is assumed that the (i+1)th code bit from the head of the LDPC code with the code length N of 1800 bits is represented by $x_i$.

In this case, according to the group-wise interleaving of the GW patterns 4, 2, 0, 3, and 1, the 1800-bit LDPC code $\{x_0, x_1, \ldots, x_{1799}\}$ is interleaved with arrangement of $\{x_{1440}, x_{1441}, \ldots, x_{1799}\}$, $\{x_{720}, x_{721}, \ldots, x_{1079}\}$, $\{x_0, x_1, \ldots, x_{359}\}$, $\{x_{1080}, x_{1081}, \ldots, x_{1439}\}$, and $\{x_{360}, x_{361}, \ldots, x_{719}\}$.

The GW pattern can be set for each code length N of the LDPC code, each coding rate r, each modulation method, each constellation, or each combination of two or more of the code length N, the coding rate r, the modulation method, and the constellation.

<Example of GW Pattern for LDPC Code>

FIG. 78 is a diagram illustrating an example of the GW pattern for the LDPC code with the code length N of 69120 bits.

According to the GW pattern in FIG. 78, a sequence of bit groups 0 to 191 of the 69120-bit LDPC code is interleaved into a sequence of bit groups 191, 12, 188, 158, 173, 48, 75, 146, 113, 15, 51, 119, 132, 161, 91, 189, 142, 93, 120, 29, 156, 101, 100, 22, 165, 65, 98, 153, 127, 74, 39, 80, 38, 130, 148, 81, 13, 24, 125, 0, 174, 140, 124, 5, 68, 3, 104, 136, 63, 162, 106, 8, 25, 182, 178, 90, 96, 79, 168, 172, 128, 64, 69, 102, 45, 66, 86, 155, 163, 6, 152, 164, 108, 9, 111, 16, 177, 53, 94, 85, 72, 32, 147, 184, 117, 30, 54, 34, 70, 149, 157, 109, 73, 41, 131, 187, 185, 18, 4, 150, 92, 143, 14, 115, 20, 50, 26, 83, 36, 58, 169, 107, 129, 121, 43, 103, 21, 139, 52, 167, 19, 2, 40, 116, 181, 61, 141, 17, 33, 11, 135, 1, 37, 123, 180, 137, 77, 166, 183, 82, 23, 56, 88, 67, 176, 76, 35, 71, 105, 87, 78, 171, 55, 62, 44, 57, 97, 122, 112, 59, 27, 99, 84, 10, 134, 42, 118, 144, 49, 28, 126, 95, 7, 110, 186, 114, 151, 145, 175, 138, 133, 31, 179, 89, 46, 160, 170, 60, 154, 159, 47, 190.

<Configuration Example of Reception Device 12>

Figure 79:
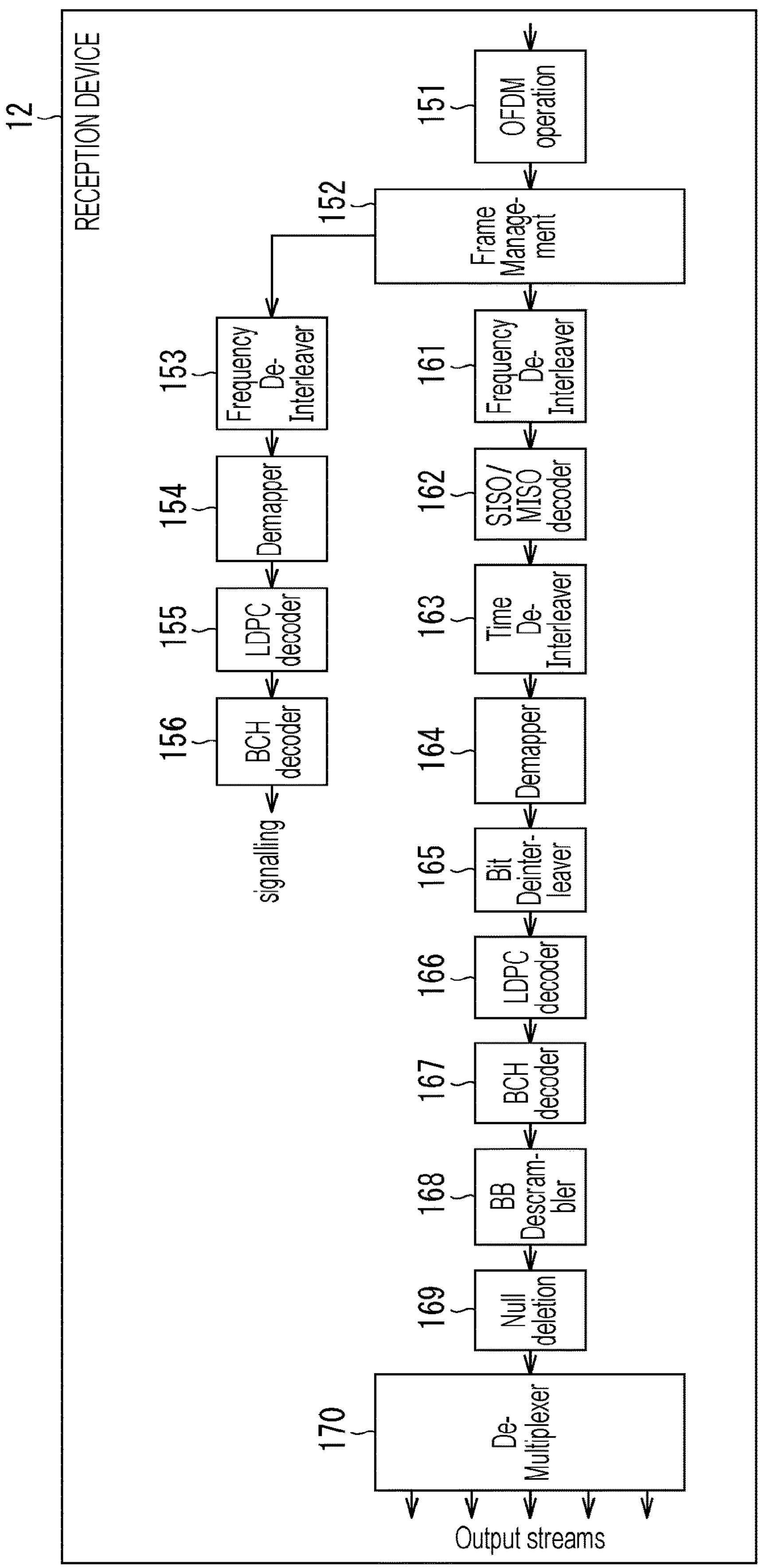
FIG. 79 is a block diagram illustrating a configuration example of a reception device 12.

FIG. 79 is a block diagram illustrating a configuration example of the reception device 12 in FIG. 7.

An OFDM processing unit (OFDM operation) 151 receives an OFDM signal from the transmission device 11 (FIG. 7) and performs signal processing for the OFDM signal. Data obtained by performing the signal processing by the OFDM processing unit 151 is supplied to a frame management unit (frame management) 152.

The frame management unit 152 processes (interprets) a frame configured by the data supplied from the OFDM processing unit 151, and supplies a signal of resulting target data and a signal of control data to frequency deinterleavers 161 and 153, respectively.

The frequency deinterleaver 153 performs frequency deinterleaving for the data from the frame management unit 152 in units of symbols, and supplies the data to a demapper 154.

The demapper 154 performs demapping (signal point arrangement decoding) and quadrature demodulation for the data (data on the constellation) from the frequency deinterleaver 153 on the basis of arrangement (constellation) of the signal points determined by the quadrature modulation performed on the transmission device 11 side, and supplies resulting data ((likelihood) of the LDPC code) to an LDPC decoder 155.

The LDPC decoder 155 (decoding unit) performs LDPC decoding for the LDPC code from the demapper 154, and supplies resulting LDPC target data (here, BCH code) to a BCH decoder 156.

The BCH decoder 156 performs BCH decoding for the LDPC target data from the LDPC decoder 155, and outputs resulting control data (signaling).

Meanwhile, the frequency deinterleaver 161 performs frequency deinterleaving in units of symbols for the data from the frame management unit 152, and supplies the data to an SISO/MISO decoder 162.

The SISO/MISO decoder 162 performs space-time decoding of the data from the frequency deinterleaver 161 and supplies the data to a time deinterleaver 163.

The time deinterleaver 163 deinterleaves the data from the SISO/MISO decoder 162 in units of symbols and supplies the data to a demapper 164.

The demapper 164 performs demapping (signal point arrangement decoding) and quadrature demodulation for the data (data on the constellation) from the time deinterleaver 163 on the basis of arrangement (constellation) of the signal points determined by the quadrature modulation performed on the transmission device 11 side, and supplies resulting data to a bit deinterleaver 165.

The bit deinterleaver 165 performs bit deinterleaving for the data from the demapper 164, and supplies (likelihood of) the LDPC code that is data after the bit deinterleaving to the LDPC decoder 166.

The LDPC decoder 166 performs LDPC decoding for the LDPC code from the bit deinterleaver 165, and supplies resulting LDPC target data (here, the BCH code) to a BCH decoder 167.

The BCH decoder 167 performs BCH decoding for the LDPC target data from the LDPC decoder 155, and supplies resulting data to a BB descrambler 168.

The BB descrambler 168 applies BB descrambling to the data from the BCH decoder 167, and supplies resulting data to a null deletion unit 169.

The null deletion unit 169 deletes the null inserted by the padder 112 in FIG. 8 from the data from the BB descrambler 168, and supplies the data to the demultiplexer 170.

The demultiplexer 170 demultiplexes each of one or more streams (target data) multiplexed into the data from the null deletion unit 169, applies necessary processing, and outputs a result as an output stream.

Note that the reception device 12 can be configured without including a part of the blocks illustrated in FIG. 79. In other words, in a case where the transmission device 11 (FIG. 8) is configured without including the time interleaver 118, the SISO/MISO encoder 119, the frequency interleaver 120, and the frequency interleaver 124, for example, the reception device 12 can be configured without including the time deinterleaver 163, the SISO/MISO decoder 162, the frequency deinterleaver 161, and the frequency deinterleaver 153 that are blocks respectively corresponding to the time interleaver 118, the SISO/MISO encoder 119, the frequency interleaver 120, and the frequency interleaver 124 of the transmission device 11.

<Configuration Example of Bit Deinterleaver 165>

Figure 80:
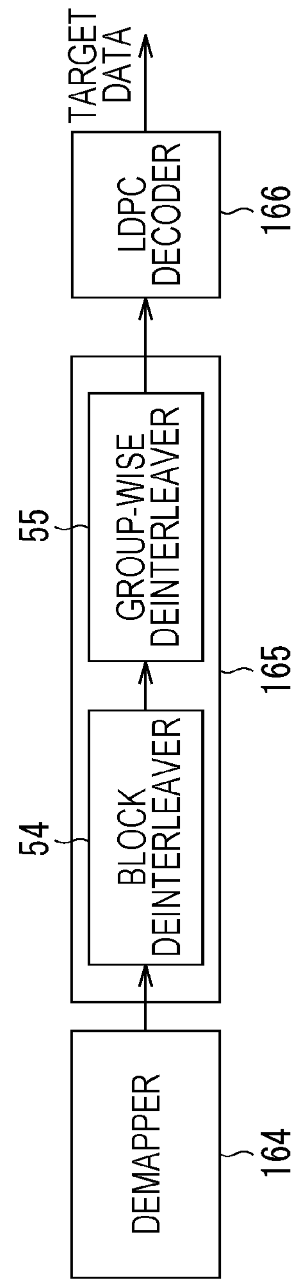
FIG. 80 is a block diagram illustrating a configuration example of a bit deinterleaver 165.

FIG. 80 is a block diagram illustrating a configuration example of the bit deinterleaver 165 in FIG. 79.

The bit deinterleaver 165 is configured by a block deinterleaver 54 and a group-wise deinterleaver 55, and performs (bit) deinterleaving of the symbol bit of the symbol that is the data from the demapper 164 (FIG. 79).

In other words, the block deinterleaver 54 performs, for the symbol bit of the symbol from demapper 164, block deinterleaving corresponding to the block interleaving performed by the block interleaver 25 in FIG. 9 (processing reverse to the block interleaving), in other words, block deinterleaving of returning the positions of (the likelihood of) the code bits of the LDPC code rearranged by the block interleaving to the original positions, and supplies a resulting LDPC code to the group-wise deinterleaver 55.

The group-wise deinterleaver 55 performs, for example, for the LDPC code from the block deinterleaver 54, group-wise deinterleaving corresponding to the group-wise interleaving performed by the group-wise interleaver 24 in FIG. 9 (processing reverse to the group-wise interleaving), in other words, group-wise deinterleaving of rearranging, in units of bit groups, the code bits of the LDPC code changed in sequence in units of bit groups by the group-wise interleaving described in FIG. 77 to the original sequence.

Here, in a case where the parity interleaving, the group-wise interleaving, and the block interleaving have been applied to the LDPC code to be supplied from the demapper 164 to the bit deinterleaver 165, the bit deinterleaver 165 can perform all of parity deinterleaving corresponding to the parity interleaving (processing reverse to the parity interleaving, in other words, parity deinterleaving of returning the code bits of the LDPC code changed in arrangement by the parity interleaving to the original arrangement), the block deinterleaving corresponding to the block interleaving, and the group-wise deinterleaving corresponding to the group-wise interleaving.

Note that the bit deinterleaver 165 in FIG. 80 is provided with the block deinterleaver 54 for performing the block deinterleaving corresponding to the block interleaving, and the group-wise deinterleaver 55 for performing the group-wise deinterleaving corresponding to the group-wise interleaving, but the bit deinterleaver 165 is not provided with a block for performing the parity deinterleaving corresponding to the parity interleaving and does not perform the parity deinterleaving.

Therefore, the LDPC code for which the block deinterleaving and the group-wise deinterleaving are performed and the parity deinterleaving is not performed is supplied from the (group-wise deinterleaver 55) of the bit deinterleaver 165 to the LDPC decoder 166.

The LDPC decoder 166 performs LDPC decoding for the LDPC code from the bit deinterleaver 165, using a transformed parity check matrix obtained by performing at least column permutation corresponding to the parity interleaving for the parity check matrix H by the type B method used for the LDPC coding by the LDPC encoder 115 in FIG. 8, or a transformed parity check matrix (FIG. 29) obtained by performing row permutation for the parity check matrix (FIG. 27) by the type A method, and outputs resulting data as a decoding result of the LDPC target data.

Figure 81:
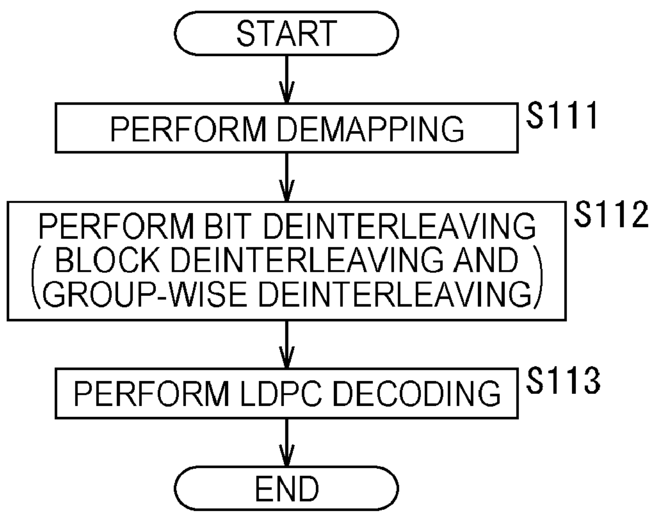
FIG. 81 is a flowchart for describing an example of processing performed by a demapper 164, a bit deinterleaver 165, and an LDPC decoder 166.

FIG. 81 is a flowchart for describing processing performed by the demapper 164, the bit deinterleaver 165, and the LDPC decoder 166 in FIG. 80.

In step S111, the demapper 164 performs demapping and quadrature demodulation for the data (the data on the constellation mapped to the signal points) from the time deinterleaver 163 and supplies the data to the bit deinterleaver 165. The processing proceeds to step S112.

In step S112, the bit deinterleaver 165 performs deinterleaving (bit deinterleaving) for the data from the demapper 164. The process proceeds to step S113.

In other words, in step S112, in the bit deinterleaver 165, the block deinterleaver 54 performs block deinterleaving for the data (symbol) from the demapper 164, and supplies code bits of the resulting LDPC code to the group-wise deinterleaver 55.

The group-wise deinterleaver 55 performs group-wise deinterleaving for the LDPC code from the block deinterleaver 54, and supplies (the likelihood) of the resulting LDPC code to the LDPC decoder 166.

In step S113, the LDPC decoder 166 performs LDPC decoding for the LDPC code from the group-wise deinterleaver 55 using the parity check matrix H used for the LDPC coding by the LDPC encoder 115 in FIG. 8, in other words, the transformed parity check matrix obtained from the parity check matrix H, for example, and supplies resulting data as a decoding result of the LDPC target data to the BCH decoder 167.

Note that, even in FIG. 80, the block deinterleaver 54 for performing the block deinterleaving and the group-wise deinterleaver 55 for performing the group-wise deinterleaving are separately configured, as in the case in FIG. 9, for convenience of description. However, the block deinterleaver 54 and the group-wise deinterleaver 55 can be integrally configured.

Furthermore, in a case where the group-wise interleaving is not performed in the transmission device 11, the reception device 12 can be configured without including the group-wise deinterleaver 55 for performing the group-wise deinterleaving.

<LDPC Decoding>

The LDPC decoding performed by the LDPC decoder 166 in FIG. 79 will be further described.

The LDPC decoder 166 in FIG. 79 performs the LDPC decoding for the LDPC code from the group-wise deinterleaver 55, for which the block deinterleaving and the group-wise deinterleaving have been performed and the parity deinterleaving has not been performed, using the transformed parity check matrix obtained by performing at least column permutation corresponding to the parity interleaving for the parity check matrix H by the type B method used for the LDPC coding by the LDPC encoder 115 in FIG. 8, or the transformed parity check matrix (FIG. 29) obtained by performing row permutation for the parity check matrix (FIG. 27) by the type A method.

Here, LDPC decoding for enabling suppression of a circuit scale and suppression of an operation frequency within a sufficiently feasible range by being performed using a transformed parity check matrix has been previously proposed (for example, see Japanese Patent No. 4224777).

Therefore, first, the LDPC decoding using a transformed parity check matrix, which has been previously proposed, will be described with reference to FIGS. 82 to 85.

Figure 82:
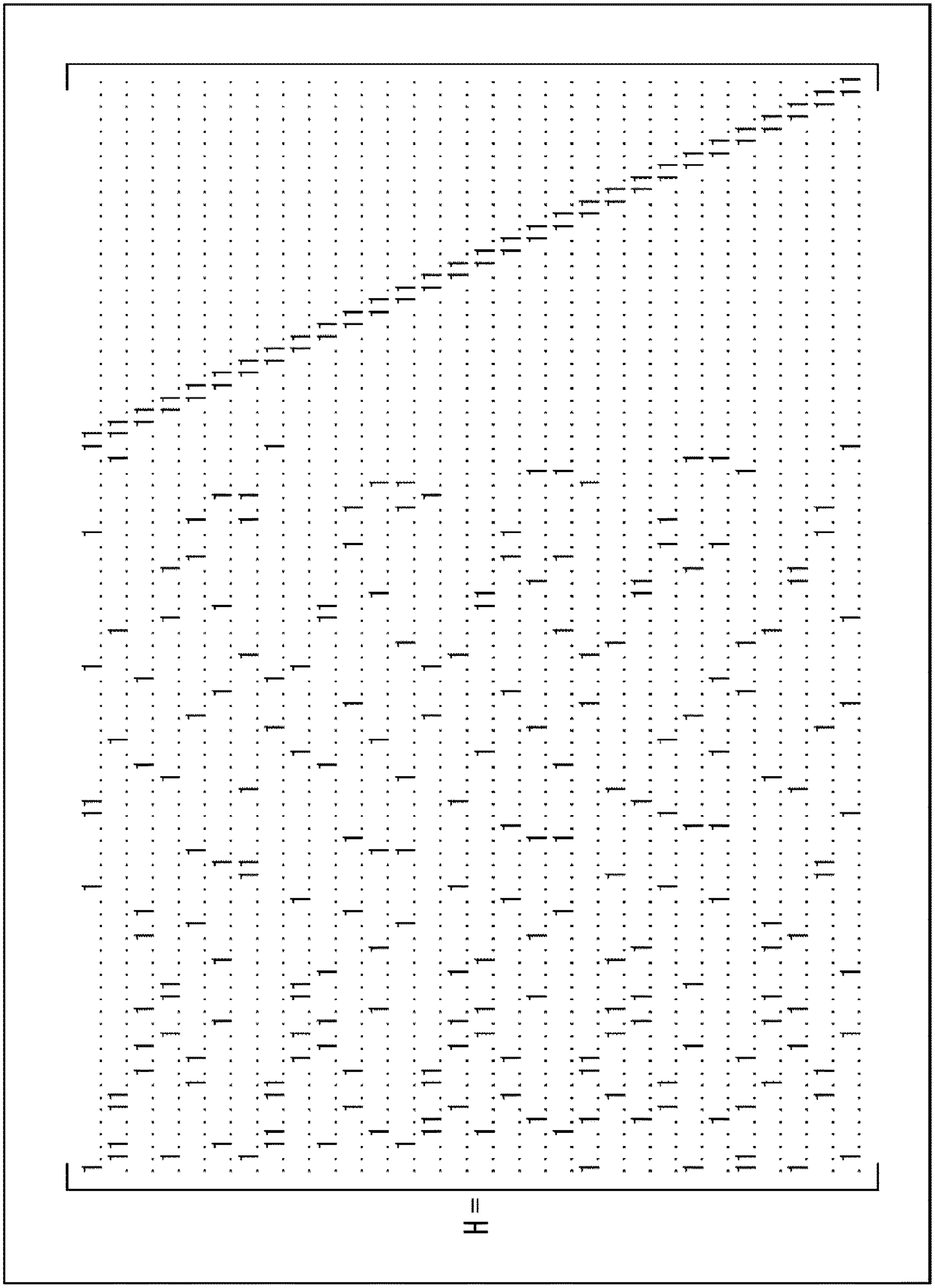
FIG. 82 is a diagram illustrating an example of a parity check matrix of an LDPC code.

FIG. 82 is a diagram illustrating an example of the parity check matrix H of the LDPC code with the code length N of 90 and the coding rate of ⅔.

Note that, in FIG. 82 (similarly performed in FIGS. 83 and 84 described below), 0 is expressed by a period (.).

In the parity check matrix H in FIG. 82, the parity matrix has a step structure.

Figure 83:
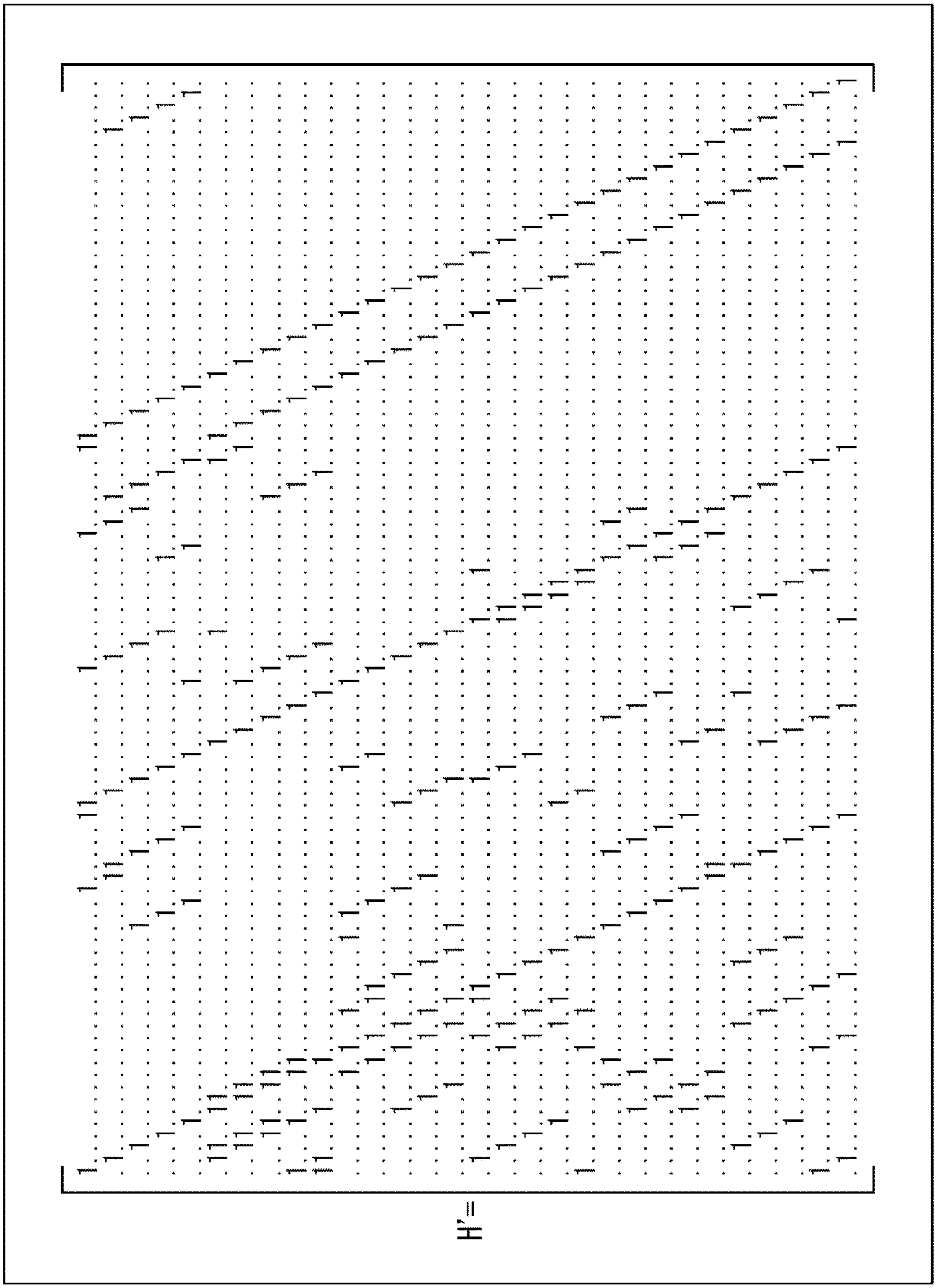
FIG. 83 is a diagram illustrating an example of a matrix (transformed parity check matrix) obtained by applying row permutation and column permutation to a parity check matrix.

FIG. 83 is a diagram illustrating a parity check matrix H' obtained by applying row permutation of the expression (11) and column permutation of the expression (12) to the parity check matrix H in FIG. 82.

$$\text{Row permutation: } (6s+t+1)\text{th row} \rightarrow (5t+s+1)\text{th row} \tag{11}$$

$$\text{Column permutation: } (6x+y+61)\text{th column} \rightarrow (5y+x+61)\text{th column} \tag{12}$$

Note that, in the expressions (11) and (12), s, t, x, and y are integers in ranges of 0≤s<5, 0≤t<6, 0≤x<5, and 0≤t<6, respectively.

According to the row permutation of the expression (11), permutation is performed in such a manner that the 1, 7, 13, 19, and 25th rows where the remainder becomes 1 when being divided by 6 are respectively permutated to the 1, 2, 3, 4, and 5th rows, and the 2, 8, 14, 20, and 26th rows where the remainder becomes 2 when being divided by 6 are respectively permutated to the 6, 7, 8, 9, and 10th rows.

Furthermore, according to the column permutation of the expression (12), permutation is performed for the 61st and subsequent columns (parity matrix) in such a manner that the 61, 67, 73, 79, and 85th columns where the remainder becomes 1 when being divided by 6 are respectively permutated to the 61, 62, 63, 64, and 65th columns, and the 62, 68, 74, 80, and 86th columns where the remainder becomes 2 when being divided by 6 are respectively permutated to the 66, 67, 68, 69, and 70th columns.

A matrix obtained by performing the row and column permutation for the parity check matrix H in FIG. 82 is the parity check matrix H' in FIG. 83.

Here, the row permutation of the parity check matrix H does not affect the arrangement of the code bits of the LDPC code.

Furthermore, the column permutation of the expression (12) corresponds to parity interleaving with the information length K of 60, the parallel factor P of 5, and the divisor q (=M/P) of the parity length M (30 here) of 6, of the parity interleaving of interleaving the position of the (K+Py+x+1)th code bit with the (K+qx+y+1)th code bit.

Therefore, the parity check matrix H' in FIG. 83 is a transformed parity check matrix obtained by performing at least the column permutation of permutating the (K+qx+y+1)th column of the parity check matrix (hereinafter referred to as original parity check matrix as appropriate) H in FIG. 82 with the (K+Py+x+1)th column.

When multiplying the transformed parity check matrix H' in FIG. 83 by a resultant obtained by performing the same permutation as the expression (12) for the LDPC code of the original parity check matrix H in FIG. 82, a 0 vector is output. In other words, assuming that a row vector obtained by applying the column permutation of the expression (12) to the row vector c as the LDPC code (one codeword) of the original parity check matrix H is represented by c', $H'c'^T$ naturally becomes a 0 vector because $Hc^T$ becomes a 0 vector from the nature of the parity check matrix.

From the above, the transformed parity check matrix H' in FIG. 83 is a parity check matrix of the LDPC code c' obtained by performing the column permutation of the expression (12) for the LDPC code c of the original parity check matrix H.

Therefore, a similar decoding result to the case of decoding the LDPC code of the original parity check matrix H using the parity check matrix H can be obtained by performing the column permutation of the expression (12) for the LDPC code c of the original parity check matrix H, decoding (LDPC decoding) the LDPC code c' after the column permutation using the transformed parity check matrix H' in FIG. 83, and applying reverse permutation to the column permutation of the expression (12) to the decoding result.

Figure 84:
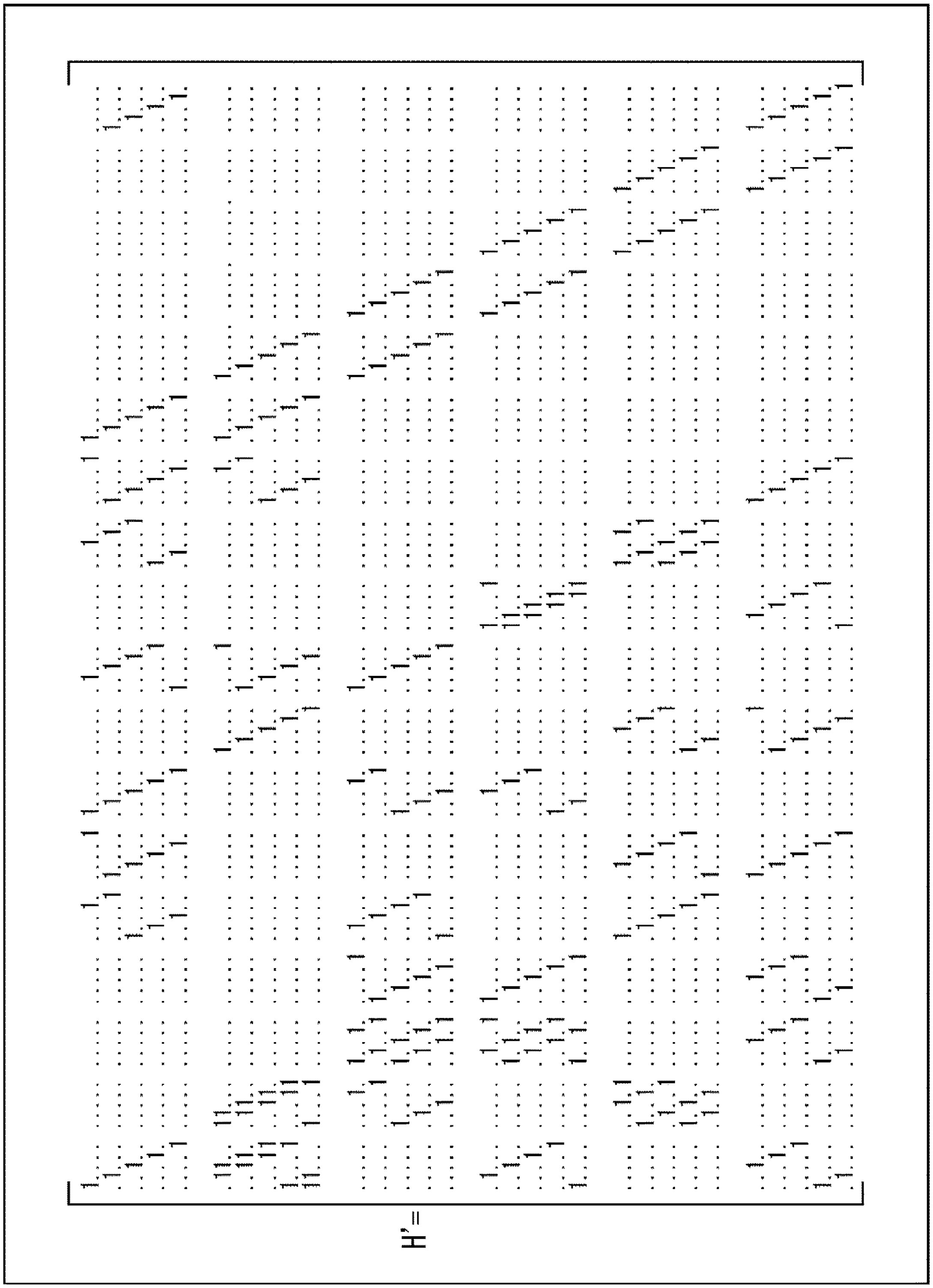
FIG. 84 is a diagram illustrating an example of a transformed parity check matrix divided into 5×5 units.

FIG. 84 is a diagram illustrating the transformed parity check matrix H' in FIG. 83, which is separated in units of 5×5 matrix.

In FIG. 84, the transformed parity check matrix H' is represented by a combination of an identity matrix of 5×5 (=P×P) as the parallel factor P, a matrix where one or more of 1s in the identity matrix become 0 (hereinafter, the matrix is referred to as quasi identify matrix), a matrix obtained by cyclically shifting the identity matrix or the quasi identify matrix (hereinafter the matrix is referred to as shift matrix as appropriate), and a sum of two or more of the identity matrix, the quasi identify matrix, and the shift matrix (hereinafter, the matrix is referred to as sum matrix as appropriate), and a 5×5 zero matrix.

It can be said that the transformed parity check matrix H' in FIG. 84 is configured by the 5×5 identity matrix, the quasi identity matrix, the shift matrix, the sum matrix, and the 0 matrix. Therefore, these 5×5 matrices (the identity matrix, the quasi identity matrix, the shift matrix, the sum matrix, and the 0 matrix) constituting the transformed parity check matrix H' are hereinafter referred to as configuration matrices as appropriate.

For decoding of an LDPC code of a parity check matrix represented by a P×P configuration matrix, an architecture that simultaneously performs P check node operations and variable node operations can be used.

Figure 85:
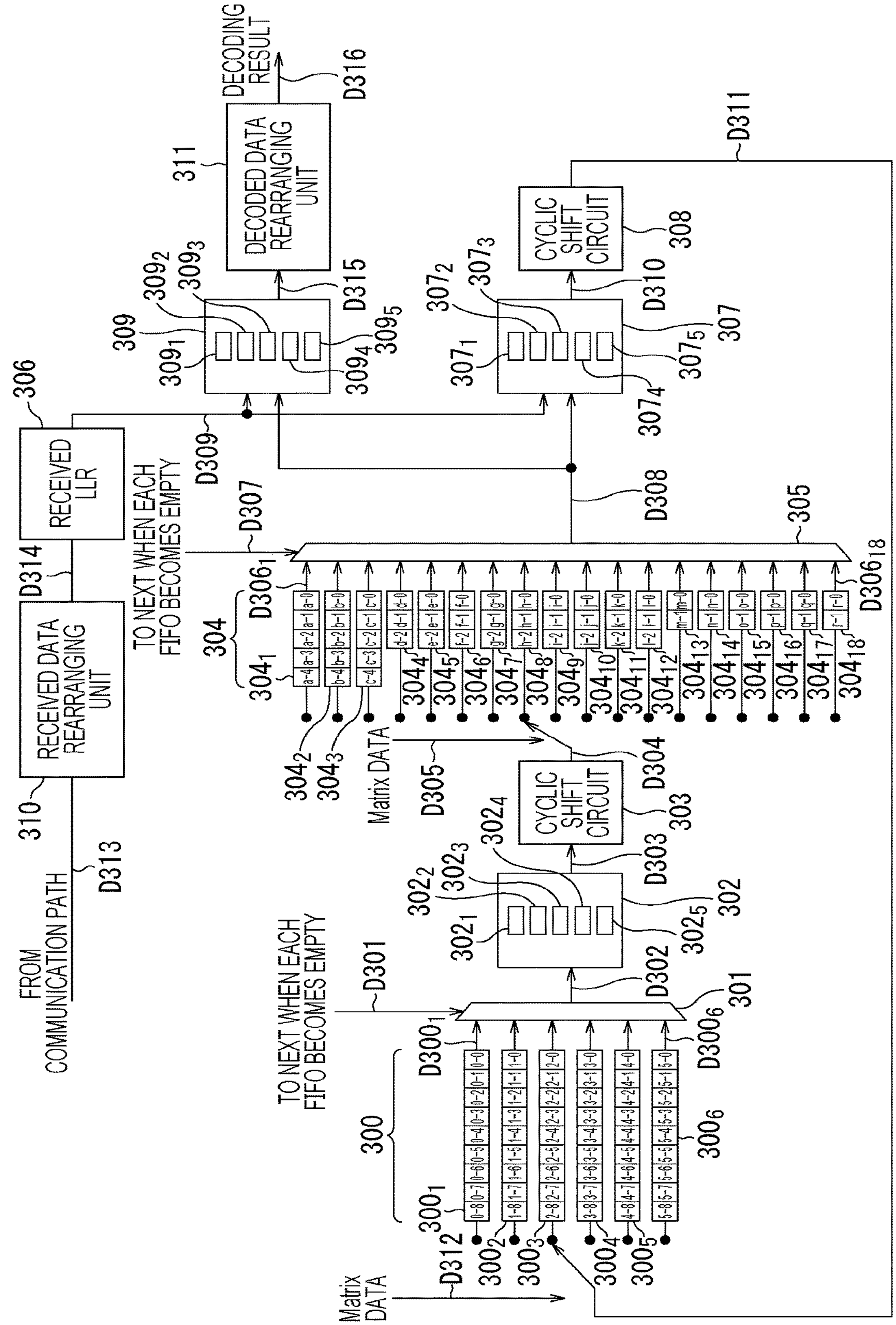
FIG. 85 is a block diagram illustrating a configuration example of a decoding device that collectively performs P node operations.

FIG. 85 is a block diagram illustrating a configuration example of a decoding device that performs such decoding.

In other words, FIG. 85 illustrates a configuration example of a decoding device that decodes the LDPC code using the transformed parity check matrix H' in FIG. 84 obtained by performing at least the column permutation of the expression (12) for the original parity check matrix H in FIG. 82.

The decoding device in FIG. 85 includes an edge data storage memory 300 including six FIFOs $\mathbf{300}_1$ to $\mathbf{300}_6$, a selector 301 for selecting the FIFOs $\mathbf{300}_1$ to $\mathbf{300}_6$, a check node calculation unit 302, two cyclic shift circuits 303 and 308, an edge data storage memory 304 including eighteen FIFOs $\mathbf{304}_1$ to $\mathbf{304}_{18}$, a selector 305 for selecting the FIFOs $\mathbf{304}_1$ to $\mathbf{304}_{18}$, a received data memory 306 for storing received data, a variable node calculation unit 307, a decoded word calculation unit 309, a received data rearranging unit 310, and a decoded data rearranging unit 311.

First, a method of storing data in the edge data storage memories 300 and 304 will be described.

The edge data storage memory 300 is configured by the six FIFOs $\mathbf{300}_1$ to $\mathbf{300}_6$, the six corresponding to a number obtained by dividing the number of rows of 30 of the transformed parity check matrix H' in FIG. 84 by the number of rows (parallel factor P) of 5 of the configuration matrix. The FIFO $\mathbf{300}_y$ (y=1, 2, . . . , 6) includes storage regions of a plurality of stages, and messages corresponding to five edges, the five corresponding to the number of rows and the number of columns (parallel factor P) of the configuration matrix, can be read and written at the same time with respect to the storage regions of the respective stages. Furthermore, the number of stages of the storage regions of the FIFO $\mathbf{300}_y$ is nine that is the maximum value of the number of 1s (Hamming weights) in the row direction of the transformed parity check matrix in FIG. 84.

In the FIFO $\mathbf{300}_1$, data (message $v_i$ from the variable node) corresponding to the positions of 1 of the 1st to 5th rows of the transformed parity check matrix H' in FIG. 84 is stored close to each other (ignoring 0) for each row in the cross direction. In other words, data corresponding to the positions of 1 of the 5×5 identity matrix of from (1, 1) to (5, 5) of the transformed parity check matrix H' is stored in the storage region of the first stage of the FIFO $\mathbf{300}_1$, where the j-th row i-th column is represented by (j, i). Data corresponding to the positions of 1 of the shift matrix of from (1, 21) to (5, 25) of the transformed parity check matrix H' (the shift matrix obtained by cyclically shifting the 5×5 identity matrix by only 3 in the right direction) is stored in the storage region of the second stage. Data is stored in association with the transformed parity check matrix H', similarly in the storage regions of the third to eighth stages. Then, data corresponding to the positions of 1 of the shift matrix of from (1, 86) to (5, 90) of the transformed parity check matrix H' (the shift matrix obtained by permutating 1 in the 1st row of the 5×5 identity matrix to 0 and cyclically shifting the identity matrix by only 1 in the left direction) is stored in the storage region of the ninth stage.

Data corresponding to the positions of 1 of from the 6th to 10th rows of the transformed parity check matrix H' in FIG. 84 is stored in the FIFO $\mathbf{300}_2$. In other words, data corresponding to the positions of 1 of a first shift matrix constituting the sum matrix of from (6, 1) to (10, 5) of the transformed parity check matrix H' (the sum matrix that is a sum of the first shift matrix obtained by cyclically shifting the 5×5 identity matrix by 1 to the right and a second shift matrix obtained by cyclically shifting the 5×5 identity matrix by 2 to the right) is stored in the storage region of the first stage of the FIFO $\mathbf{300}_2$. Furthermore, data corresponding to the positions of 1 of the second shift matrix constituting the sum matrix of from (6, 1) to (10, 5) of the transformed parity check matrix H' is stored in the storage region of the second stage.

In other words, in regard to the configuration matrix with the weight of 2 or more, when the configuration matrix is expressed by a form of a sum of some matrices of a P×P identity matrix with the weight of 1, a quasi identity matrix in which one or more of the elements of 1 of the identity matrix are 0, and a shift matrix obtained by cyclically shifting the identity matrix or the quasi identity matrix, the data corresponding to the position of 1 of the identity matrix with the weight of 1, the quasi identity matrix, or the shift matrix (message corresponding to the edge which belongs to the identity matrix, the quasi identity matrix, or the shift matrix) is stored in the same address (the same FIFO of FIFOs $\mathbf{300}_1$ to $\mathbf{300}_6$).

Hereinafter, data is stored in association with the transformed parity check matrix H', similarly in the storage regions of the third to ninth stages.

Data are similarly stored in the FIFO $\mathbf{300}_3$ to $\mathbf{300}_6$ in association with the transformed parity check matrix H'.

The edge data storage memory 304 is configured by the eighteen FIFO $\mathbf{304}_1$ to $\mathbf{304}_{18}$, the eighteen corresponding to a number obtained by dividing the number of columns of 90 of the transformed parity check matrix H' by the number of columns (parallel factor P) of 5 of the configuration matrix. The FIFO $\mathbf{304}_x$ (x=1, 2, . . . , 18) includes storage regions of a plurality of stages, and messages corresponding to five edges, the five corresponding to the number of rows and the number of columns (parallel factor P) of the configuration matrix, can be read and written at the same time with respect to the storage regions of the respective stages.

In the FIFO $\mathbf{304}_1$, data (message $u_j$ from the check node) corresponding to the positions of 1 of the 1st to 5th columns of the transformed parity check matrix H' in FIG. 84 is stored close to each other (ignoring 0) for each column in the vertical direction. In other words, data corresponding to the positions of 1 of the 5×5 identity matrix of from (1, 1) to (5, 5) of the transformed parity check matrix H' is stored in the storage region of the first stage of the FIFO $\mathbf{304}_1$. Data corresponding to the positions of 1 of a first shift matrix constituting the sum matrix of from (6, 1) to (10, 5) of the transformed parity check matrix H' (the sum matrix that is a sum of the first shift matrix obtained by cyclically shifting the 5×5 identity matrix by 1 to the right and a second shift matrix obtained by cyclically shifting the 5×5 identity matrix by 2 to the right) is stored in the storage region of the second stage. Furthermore, data corresponding to the positions of 1 of the second shift matrix constituting the sum matrix of from (6, 1) to (10, 5) of the transformed parity check matrix H' is stored in the storage region of the third stage.

In other words, in regard to the configuration matrix with the weight of 2 or more, when the configuration matrix is expressed by a form of a sum of some matrices of a P×P identity matrix with the weight of 1, a quasi identity matrix in which one or more of the elements of 1 of the identity matrix are 0, and a shift matrix obtained by cyclically shifting the identity matrix or the quasi identity matrix, the data corresponding to the position of 1 of the identity matrix with the weight of 1, the quasi identity matrix, or the shift matrix (message corresponding to the edge which belongs to the identity matrix, the quasi identity matrix, or the shift matrix) is stored in the same address (the same FIFO of FIFOs $\mathbf{304}_1$ to $\mathbf{304}_{18}$).

Hereinafter, data is stored in association with the transformed parity check matrix H', similarly in the storage regions of the fourth and fifth stages. The number of stages of the storage regions of the FIFO $\mathbf{304}_1$ is five that is the maximum value of the number of 1s (Hamming weights) in the row direction in the 1st to 5th columns of the transformed parity check matrix H'.

Data is similarly stored in the FIFOs $\mathbf{304}_2$ and $\mathbf{304}_3$ in association with the transformed parity check matrix H', and respective lengths (stages) are five. Data is similarly stored in the FIFOs $\mathbf{304}_4$ to $\mathbf{304}_{12}$ in association with the transformed parity check matrix H', and respective lengths are three. Data is similarly stored in the FIFOs $\mathbf{304}_{13}$ and $\mathbf{304}_{18}$ in association with the transformed parity check matrix H', and respective lengths are two.

Next, the operation of the decoding device in FIG. 85 will be described.

The edge data storage memory 300 includes six FIFOs $\mathbf{300}_1$ to $\mathbf{300}_6$, and selects FIFO to store data from among the six FIFOs $\mathbf{300}_1$ to $\mathbf{300}_6$ according to information (matrix data) D312 indicating which row of the transformed parity check matrix H' in FIG. 84 five messages D311 supplied from the previous cyclic shift circuit 308 belong to, and collectively stores the five messages D311 to the selected FIFO in order. Furthermore, in reading data, the edge data storage memory 300 sequentially reads the five messages D$\mathbf{300}_1$ from the FIFO $\mathbf{300}_1$ and supplies the read messages to the next selector 301. The edge data storage memory 300 sequentially reads the messages from the FIFOs $\mathbf{300}_2$ to $\mathbf{300}_6$ after completion of the reading of the message from the FIFO $\mathbf{300}_1$, and supplies the messages to the selector 301.

The selector 301 selects the five messages from the FIFO currently being read out, of the FIFOs $\mathbf{300}_1$ to $\mathbf{300}_6$, according to a select signal D301, and supplies the messages as message D302 to the check node calculation unit 302.

The check node calculation unit 302 includes five check node calculators $\mathbf{302}_1$ to $\mathbf{302}_5$, and performs the check node operation according to the expression (7), using the messages D302 (D$\mathbf{302}_1$ to D$\mathbf{302}_5$) (the messages $v_i$ of the expression (7)) supplied through the selector 301, and supplies five messages D303 (D$\mathbf{303}_1$ to D$\mathbf{303}_5$) obtained as a result of the check node operation (messages $u_j$ of the expression (7)) to the cyclic shift circuit 303.

The cyclic shift circuit 303 cyclically shifts the five messages D$\mathbf{303}_1$ to D$\mathbf{303}_5$ obtained by the check node calculation unit 302, on the basis of information (matrix data) D305 indicating how many identity matrices (or quasi identify matrices), which are the basis of the transformed parity check matrix H', have been cyclically shifted for the corresponding edge, and supplies a result as a message D304 to the edge data storage memory 304.

The edge data storage memory 304 includes eighteen FIFOs $304_1$ to $304_{18}$, and selects FIFO to store data from among the FIFOs $304_1$ to $304_{18}$ according to information (matrix data) D305 indicating which row of the transformed parity check matrix H' five messages D304 supplied from the previous cyclic shift circuit 303 belong to, and collectively stores the five messages D304 to the selected FIFO in order. Furthermore, in reading data, the edge data storage memory 304 sequentially reads five messages D$306_1$ from the FIFO $304_1$ and supplies the read messages to the next selector 305. The edge data storage memory 304 sequentially reads the messages from the FIFOs $304_2$ to $304_{18}$ after completion of the reading of the data from the FIFO $304_1$, and supplies the messages to the selector 305.

The selector 305 selects the five messages from the FIFO currently being read out, of the FIFOs $304_1$ to $304_{18}$, according to a select signal D307, and supplies the messages as message D308 to the variable node calculation unit 307 and the decoded word calculation unit 309.

Meanwhile, the received data rearranging unit 310 rearranges an LDPC code D313 corresponding to the parity check matrix H in FIG. 82, which has been received via the communication path 13, by performing the column permutation of the expression (12), and supplies data as received data D314 to the received data memory 306. The received data memory 306 calculates and stored received LLR (log likelihood ratio) from the received data D314 supplied from the received data rearranging unit 310, and groups five received LLRs and collectively supplies the five received LLRs as a received value D309 to the variable node calculation unit 307 and the decoded word calculation unit 309.

The variable node calculation unit 307 includes five variable node calculators $307_1$ to $307_5$, and performs the variable node operation according to the expression (1), using the messages D308 (D$308_1$ to D$308_5$) (messages $u_j$ of the expression (1)) supplied via the selector 305, and the five received values D309 (received values $u_{0i}$ of the expression (1)) supplied from the received data memory 306, and supplies messages D310 (D$310_1$ to D$310_5$) (messages $v_i$ of the expression (1)) obtained as a result of the operation to the cyclic shift circuit 308.

The cyclic shift circuit 308 cyclically shifts the messages D$310_1$ to D$310_5$ calculated by the variable node calculation unit 307 on the basis of information indicating how many identity matrices (or quasi identify matrices), which are the basis of the transformed parity check matrix H', have been cyclically shifted for the corresponding edge, and supplies a result as a message D311 to the edge data storage memory 300.

By one round of the above operation, one decoding (variable node operation and check node operation) of the LDPC code can be performed. After decoding the LDPC code a predetermined number of times, the decoding device in FIG. 85 obtains and outputs a final decoding result in the decoded word calculation unit 309 and the decoded data rearranging unit 311.

In other words, the decoded word calculation unit 309 includes five decoded word calculators $309_1$ to $309_5$, and calculates, as a final stage of the plurality of times of decoding, the decoding result (decoded word) on the basis of the expression (5), using the five messages D308 (D$308_1$ to D$308_5$) (messages $u_j$ of the expression (5)) output by the selector 305, and the five received values D309 (received values $u_{0i}$ of the expression (5)) supplied from the received data memory 306, and supplies resulting decoded data D315 to the decoded data rearranging unit 311.

The decoded data rearranging unit 311 rearranges the decoded data D315 supplied from the decoded word calculation unit 309 by performing reverse permutation to the column permutation of the expression (12), and outputs a final decoding result D316.

As described above, by applying at least one or both of the row permutation and the column permutation to the parity check matrix (original parity check matrix) to transform the parity check matrix into a parity check matrix (transformed parity check matrix) that can be represented by a combination of a P×P identity matrix, a quasi identity matrix in which one or more of 1s in the identity matrix are 0, a shift matrix obtained by cyclically shifting the identity matrix or the quasi identity, a sum matrix that is a sum of two or more of the identity matrix, the quasi identify matrix, and the shift matrix, and a P×P zero matrix, that is, by a combination of the configuration matrices, an architecture to perform P check node operations and variable node operations at the same time for decoding of the LDPC code, the P being a number smaller than the number of rows and the number of columns of the parity check matrix, can be adopted. In the case of adopting the architecture to perform P node operations (check node operations and variable node operations) at the same time, the P being the number smaller than the number of rows and the number of columns of the parity check matrix, a large number of repetitive decodings can be performed while suppressing the operation frequency to the feasible range, as compared with a case of performing the number of node operations at the same time, the number being equal to the number of rows and the number of columns of the parity check matrix.

The LDPC decoder 166 constituting the reception device 12 in FIG. 79 performs the LDPC decoding by performing the P check node operations and variable node operations at the same time, for example, similarly to the decoding device in FIG. 85.

In other words, assuming that the parity check matrix of the LDPC code output by the LDPC encoder 115 constituting the transmission device 11 in FIG. 8 is the parity check matrix H with the parity matrix having a step structure, as illustrated in FIG. 82, for example, to simplify the description, the parity interleaver 23 of the transmission device 11 performs the parity interleaving of interleaving the position of the (K+Py+x+1)th code bit with (K+qx+y+1)th code bit with the setting of the information length K of 60, the parallel factor P of 5, the divisor q (=M/P) of the parity length M of 6.

Since this parity interleaving corresponds to the column permutation of the expression (12) as described above, the LDPC decoder 166 does not need to perform the column permutation of the expression (12).

Therefore, in the reception device 12 in FIG. 79, the LDPC code for which the parity deinterleaving has not been performed, that is, the LDPC code in the state where the column permutation of the expression (12) has been performed, is supplied from the group-wise deinterleaver 55 to the LDPC decoder 166, as described above, and the LDPC decoder 166 performs similar processing to that of the decoding device in FIG. 85 except that the LDPC decoder 166 does not perform the column permutation of the expression (12).

Figure 86:
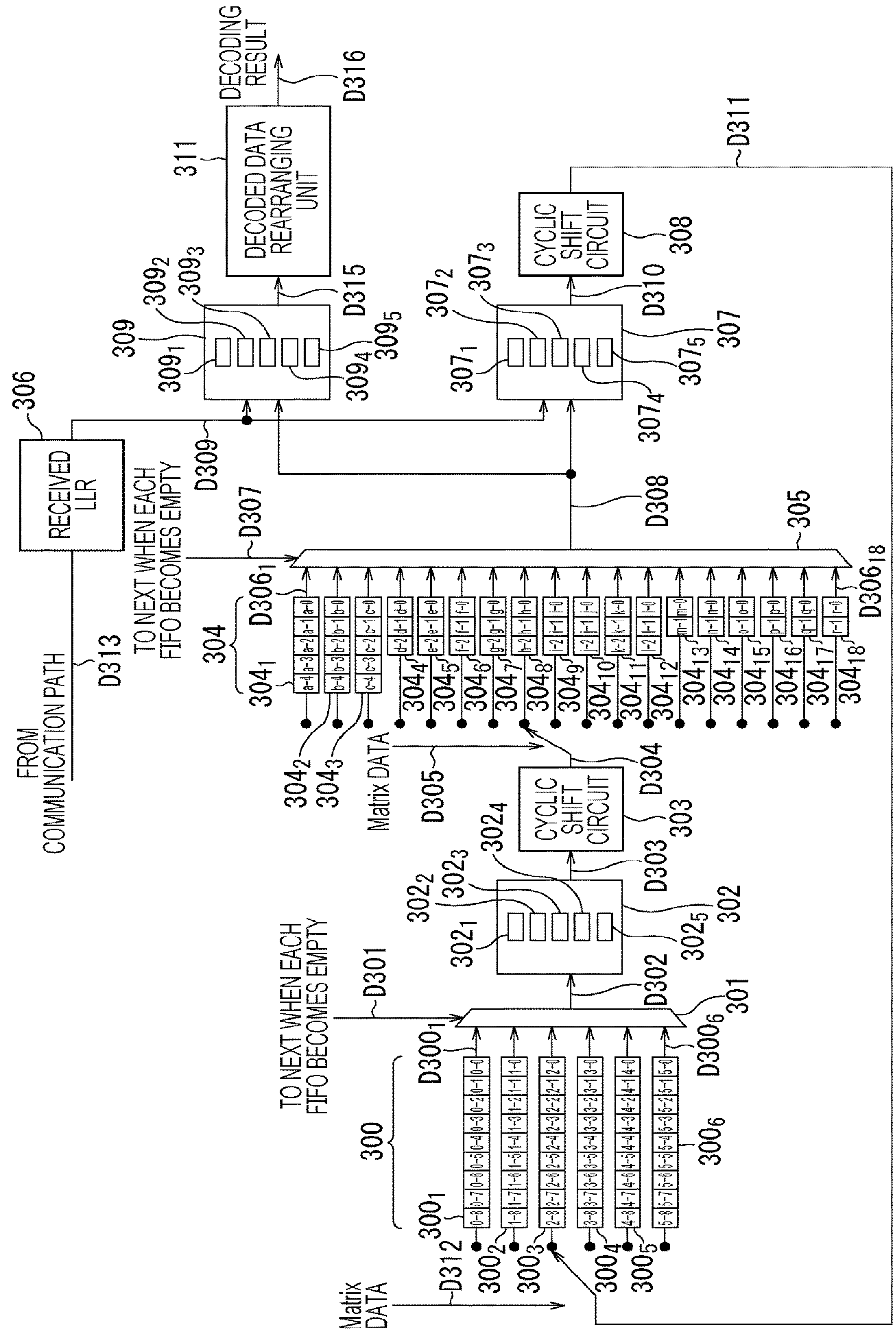
FIG. 86 is a block diagram illustrating a configuration example of the LDPC decoder 166.

In other words, FIG. 86 is a diagram illustrating a configuration example of the LDPC decoder 166 in FIG. 79.

In FIG. 86, the LDPC decoder 166 is similarly configured to the decoding device in FIG. 85 except that the received data rearranging unit 310 in FIG. 85 is not provided, and performs similar processing to that of the decoding device in FIG. 85 except that the column permutation of the expression (12) is not performed. Therefore, description is omitted.

As described above, since the LDPC decoder 166 can be configured without including the received data rearranging unit 310, the scale can be reduced as compared with the decoding device in FIG. 85.

Note that, in FIGS. 82 to 86, to simplify the description, the code length N of 90, the information length K of 60, the parallel factor (the numbers of rows and columns of the configuration matrix) P of 5, and the divisor q (=M/P) of the parity length M of 6 are set for the LDPC code. However, the code length N, the information length K, the parallel factor P, and the divisor q (=M/P) are not limited to the above-described values.

In other words, in the transmission device 11 in FIG. 8, what the LDPC encoder 115 outputs is the LDPC codes with the code lengths N of 64800, 16200, 69120, 17280, and the like, the information length K of N−Pq (=N−M), the parallel factor P of 360, and the divisor q of M/P, for example. However, the LDPC decoder 166 in FIG. 86 can be applied to a case of performing the LDPC decoding by performing the P check node operations and variable node operations at the same time for such LDPC codes.

Furthermore, after the decoding of the LDPC code in the LDPC decoder 166, the parity part of the decoding result is unnecessary, and in a case of outputting only the information bits of the decoding result, the LDPC decoder 166 can be configured without the decoded data rearranging unit 311.

<Configuration Example of Block Deinterleaver 54>

Figure 87:
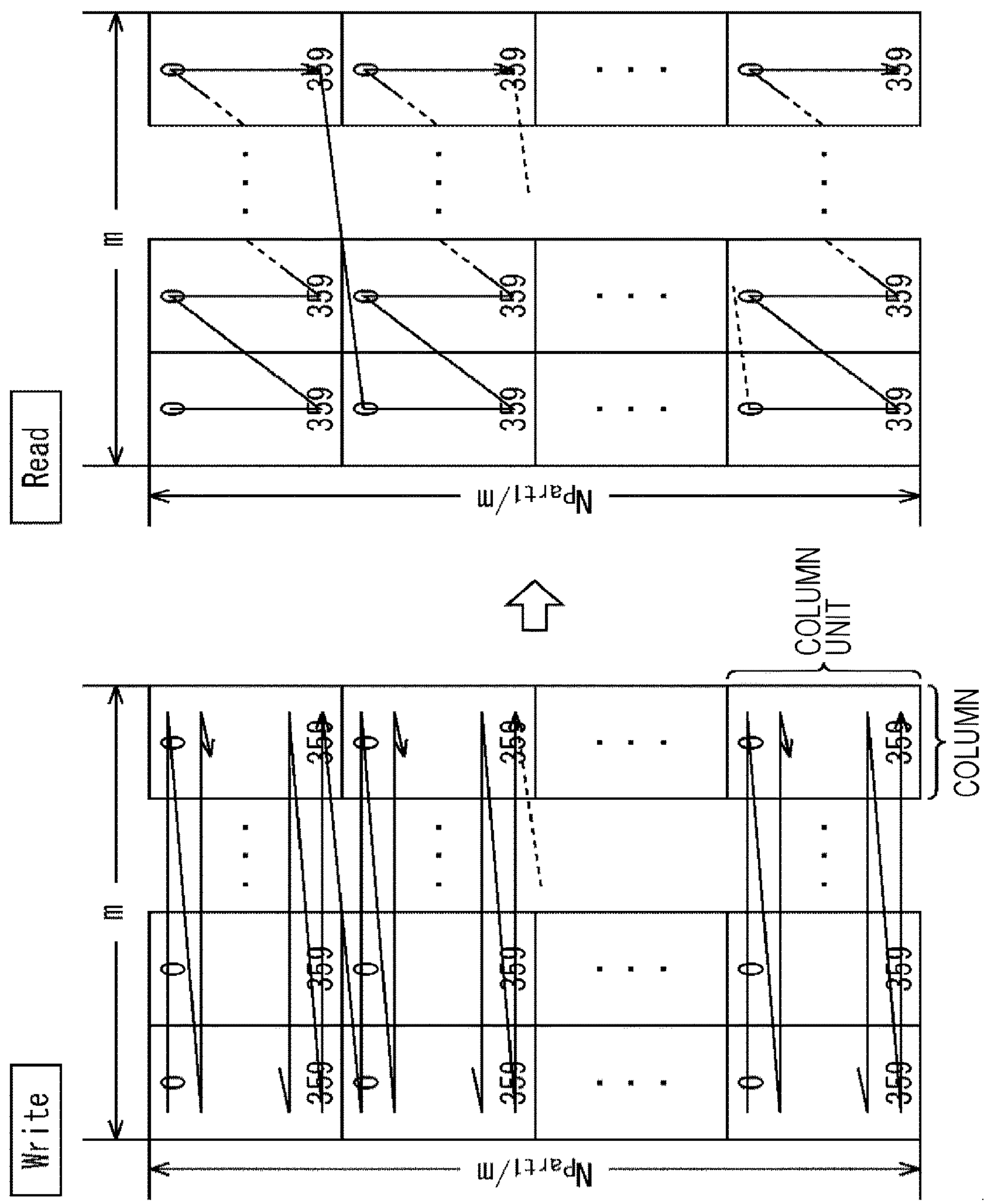
FIG. 87 is a diagram for describing block deinterleaving performed by a block deinterleaver 54.

FIG. 87 is a diagram for describing block deinterleaving performed by the block deinterleaver 54 in FIG. 80.

In the block deinterleaving, reverse processing to the block interleaving by the block interleaver 25 described in FIG. 75 is performed to return (restore) the sequence of the code bits of the LDPC code to the original sequence.

In other words, in the block deinterleaving, for example, as in the block interleaving, the LDPC code is written and read with respect to m columns, the m being equal to the bit length m of the symbol, whereby the arrangement of the code bits of the LDPC code is returned to the original arrangement.

Note that, in the block deinterleaving, writing of the LDPC code is performed in the order of reading the LDPC code in the block interleaving. Moreover, in the block deinterleaving, reading of the LDPC code is performed in the order of writing the LDPC code in the block interleaving.

In other words, in regard to part 1 of the LDPC code, part 1 of the LDPC code in units of m-bit symbol is written in the row direction from the 1st row of all the m columns, as illustrated in FIG. 87. In other words, the code bit of the LDPC code, which is the m-bit symbol, is written in the row direction.

Writing of part 1 in units of m bits is sequentially performed toward lower rows of the m columns, and when the writing of part 1 is completed, as illustrated in FIG. 87, reading of part 1 downward from the top of the first column unit of the column is performed in the columns from the left to right direction.

When the reading to the rightmost column is completed, the reading returns to the leftmost column, and reading of part 1 downward from the top of the second column unit of the column is performed in the columns from the left to right direction, as illustrated in FIG. 87. Hereinafter, reading of part 1 of the LDPC code of one codeword is similarly performed.

When the reading of part 1 of the LDPC code of one codeword is completed, in regard to part 2 in units of m-bit symbols, the units of m-bit symbols are sequentially concatenated after part 1, whereby the LDPC code in units of symbols is returned to the arrangement of code bits of the LDPC code (the LDCP code before block interleaving) of the original one codeword.

<Another Configuration Example of Bit Deinterleaver 165>

Figure 88:
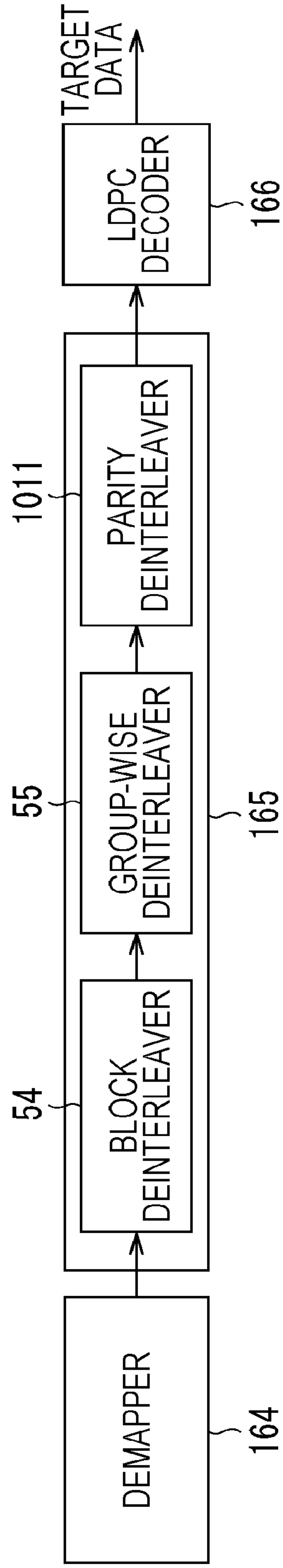
FIG. 88 is a block diagram illustrating another configuration example of the bit deinterleaver 165.

FIG. 88 is a block diagram illustrating another configuration example of the bit deinterleaver 165 in FIG. 79.

Note that, in FIG. 88, parts corresponding to those in FIG. 80 are given the same reference numerals, and hereinafter, description thereof will be omitted as appropriate.

In other words, the bit deinterleaver 165 in FIG. 88 is similarly configured to the case in FIG. 80 except that a parity deinterleaver 1011 is newly provided.

In FIG. 88, the bit deinterleaver 165 includes the block deinterleaver 54, the group-wise deinterleaver 55, and the parity deinterleaver 1011, and performs bit deinterleaving for the code bits of the LDPC code from the demapper 164.

In other words, the block deinterleaver 54 performs, for the LDPC code from demapper 164, block deinterleaving corresponding to the block interleaving performed by the block interleaver 25 of the transmission device 11 (processing reverse to the block interleaving), in other words, block deinterleaving of returning the positions of the code bits rearranged by the block interleaving to the original positions, and supplies a resulting LDPC code to the group-wise deinterleaver 55.

The group-wise deinterleaver 55 performs, for the LDPC code from the block deinterleaver 54, group-wise deinterleaving corresponding to group-wise interleaving as rearrangement processing performed by the group-wise interleaver 24 of the transmission device 11.

The LDPC code obtained as a result of group-wise deinterleaving is supplied from the group-wise deinterleaver 55 to the parity deinterleaver 1011.

The parity deinterleaver 1011 performs, for the bit codes after the group-wise deinterleaving in the group-wise deinterleaver 55, parity deinterleaving corresponding to the parity interleaving performed by the parity interleaver 23 of the transmission device 11 (processing reverse to the parity interleaving), in other words, parity deinterleaving of returning the arrangement of the code bits of the LDPC code changed in arrangement by the parity interleaving to the original arrangement.

The LDPC code obtained as a result of the parity deinterleaving is supplied from the parity deinterleaver 1011 to the LDPC decoder 166.

Therefore, in the bit deinterleaver 165 in FIG. 88, the LDPC code for which the block deinterleaving, the group-wise deinterleaving, and the parity deinterleaving have been performed, in other words, the LDPC code obtained by the LDPC coding according to the parity check matrix H, is supplied to the LDPC decoder 166.

The LDPC decoder 166 performs LDPC decoding for the LDPC code from the bit deinterleaver 165 using the parity check matrix H used for the LDPC coding by the LDPC encoder 115 of the transmission device 11.

In other words, in the type B method, the LDPC decoder 166 performs, for the LDPC code from the bit deinterleaver 165, the LDPC decoding using the parity check matrix H itself (of the type B method) used for the LDPC coding by the LDPC encoder 115 of the transmission device 11 or using the transformed parity check matrix obtained by performing at least column permutation corresponding to the parity interleaving for the parity check matrix H. Furthermore, in the type A method, the LDPC decoder 166 performs, for the LDPC code from the bit deinterleaver 165, the LDPC decoding using the parity check matrix (FIG. 28) obtained by applying column permutation to the parity check matrix (FIG. 27) (of the type A method) used for the LDPC coding by the LDPC encoder 115 of the transmission device 11 or using the transformed parity check matrix (FIG. 29) obtained by applying row permutation to the parity check matrix (FIG. 27) used for the LDPC coding.

Here, in FIG. 88, since the LDPC code obtained by LDPC coding according to the parity check matrix H is supplied from (the parity deinterleaver 1011 of) the bit deinterleaver 165 to the LDPC decoder 166, in a case of performing LDPC decoding of the LDPC code using the parity check matrix H itself by the type B method used for the LDPC coding by the LDPC encoder 115 of the transmission device 11 or using the parity check matrix (FIG. 28) obtained by applying column permutation to the parity check matrix (FIG. 27) by the type A method used for the LDPC coding, the LDPC decoder 166 can be configured as a decoding device for performing LDPC decoding by a full serial decoding method in which operations of messages (a check node message and a variable node message) are sequentially performed for one node at a time or a decoding device for performing LDPC decoding by a full parallel decoding method in which operations of messages are performed simultaneously (parallelly) for all nodes, for example.

Furthermore, in the LDPC decoder 166, in a case of performing LDPC decoding of the LDPC code using the transformed parity check matrix obtained by applying at least column permutation corresponding to the parity interleaving to the parity check matrix H by the type B method used for the LDPC coding by the LDPC encoder 115 of the transmission device 11 or using the transformed parity check matrix (FIG. 29) obtained by applying row permutation to the parity check matrix (FIG. 27) by the type A method used for the LDPC coding, the LDPC decoder 166 can be configured as an architecture decoding device for simultaneously performing the check node operation and the variable node operation for P nodes (or divisors of P other than 1), the architecture decoding device being also a decoding device (FIG. 85) including the received data rearranging unit 310 for rearranging the code bits of the LDPC code by applying column permutation similar to the column permutation (parity interleaving) for obtaining the transformed parity check matrix to the LDPC code.

Note that, in FIG. 88, for convenience of description, the block deinterleaver 54 for performing block deinterleaving, the group-wise deinterleaver 55 for performing group-wise deinterleaving, and the parity deinterleaver 1011 for performing parity deinterleaving are separately configured. However, two or more of the block deinterleaver 54, the group-wise deinterleaver 55, and the parity deinterleaver 1011 can be integrally configured similarly to the parity interleaver 23, the group-wise interleaver 24, and the block interleaver 25 of the transmission device 11.

<Configuration Example of Reception System>

Figure 89:
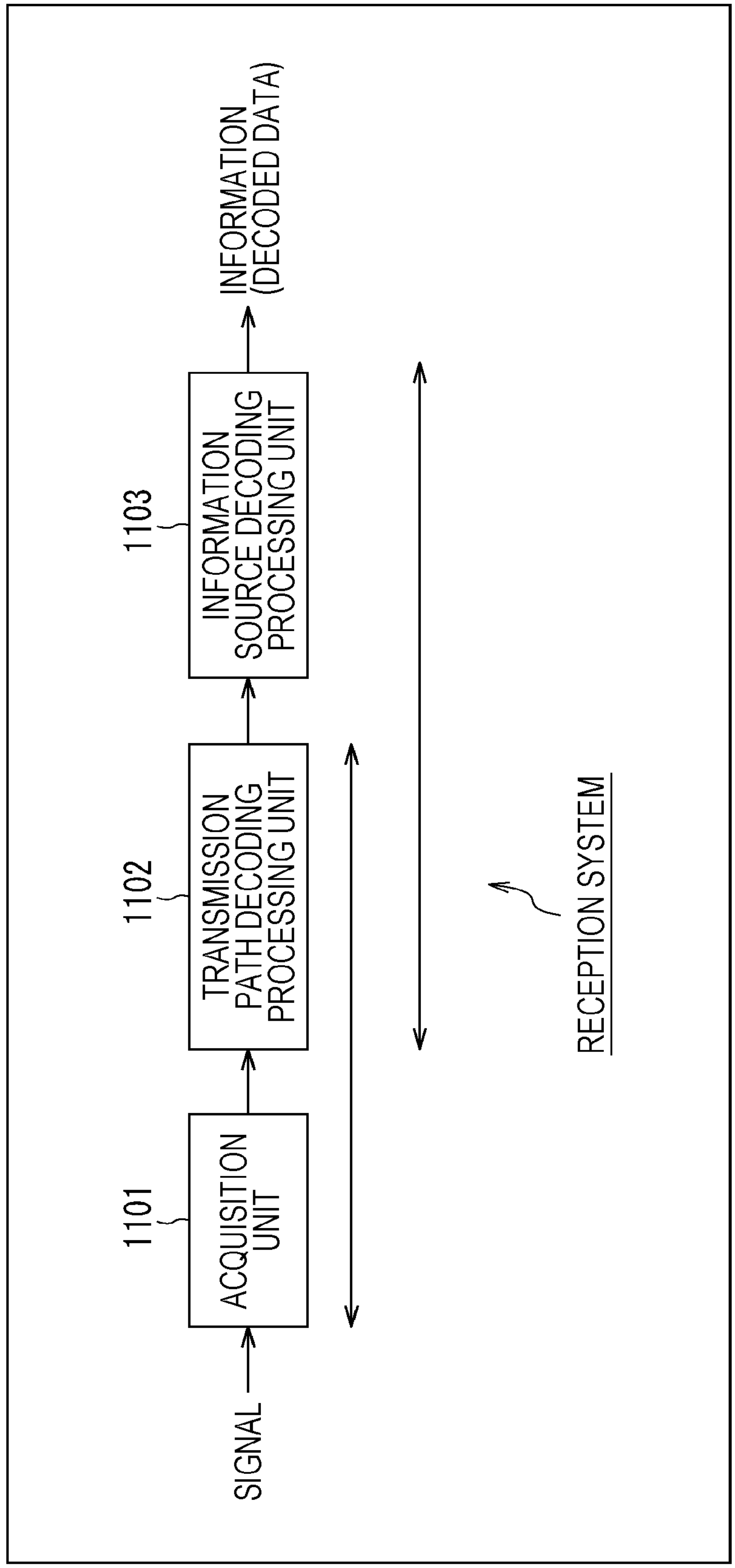
FIG. 89 is a block diagram illustrating a first configuration example of the reception system to which the reception device 12 is applicable.

FIG. 89 is a block diagram illustrating a first configuration example of the reception system to which the reception device 12 is applicable.

In FIG. 89, the reception system includes an acquisition unit 1101, a transmission path decoding processing unit 1102, and an information source decoding processing unit 1103.

The acquisition unit 1101 acquires a signal including the LDPC code obtained by performing at least the LDPC coding for the LDPC target data such as image data and audio data of a program or the like, via a transmission path (communication path, not illustrated) such as, for example, terrestrial digital broadcasting, satellite digital broadcasting, a cable television (CATV) network, the Internet, or another network, and supplies the signal to the transmission path decoding processing unit 1102.

Here, in a case where the signal acquired by the acquisition unit 1101 is broadcasted from, for example, a broadcasting station via terrestrial waves, satellite waves, cable television (CATV) networks, or the like, the acquisition unit 1101 is configured by a tuner, a set top box (STB), or the like. Furthermore, in a case where the signal acquired by the acquisition unit 1101 is transmitted from a web server by multicast like an internet protocol television (IPTV), for example, the acquisition unit 1101 is configured by, for example, a network interface (I/F) such as a network interface card (NIC).

The transmission path decoding processing unit 1102 corresponds to the reception device 12. The transmission path decoding processing unit 1102 applies transmission path decoding processing including at least processing of correcting an error occurring in the transmission path to the signal acquired by the acquisition unit 1101 via the transmission path, and supplies a resulting signal to the information source decoding processing unit 1103.

In other words, the signal acquired by the acquisition unit 1101 via the transmission path is a signal obtained by performing at least error correction coding for correcting an error occurring in the transmission path, and the transmission path decoding processing unit 1102 applies the transmission path decoding processing such as the error correction processing to such a signal, for example.

Here, examples of the error correction coding include LDPC coding, BCH coding, and the like. Here, at least the LDPC coding is performed as the error correction coding.

Furthermore, the transmission path decoding processing may include demodulation of a modulated signal, and the like.

The information source decoding processing unit 1103 applies information source decoding processing including at least processing of decompressing compressed information into original information to the signal to which the transmission path decoding processing has been applied.

In other words, compression encoding for compressing information is sometimes applied to the signal acquired by the acquisition unit 1101 via the transmission path in order to reduce the amount of data such as image and sound as the information. In that case, the information source decoding processing unit 1103 applies the information source decoding processing such as processing of decompressing the compressed information into the original information (decompression processing) to the signal to which the transmission path decoding processing has been applied.

Note that, in a case where the compression encoding has not been applied to the signal acquired by the acquisition unit 1101 via the transmission path, the information source decoding processing unit 1103 does not perform the processing of decompressing the compressed information into the original information.

Here, an example of the decompression processing includes MPEG decoding and the like. Furthermore, the transmission path decoding processing may include descrambling and the like in addition to the decompression processing.

In the reception system configured as described above, the acquisition unit 1101 acquires the signal obtained by applying the compression encoding such as MPEG coding to data such as image and sound, for example, and further applying the error correction coding such as the LDPC coding to the compressed data, via the transmission path, and supplies the acquired signal to the transmission path decoding processing unit 1102.

The transmission path decoding processing unit 1102 applies, for example, processing similar to the processing performed by the reception device 12 to the signal from the acquisition unit 1101 as the transmission path decoding processing, and supplies the resulting signal to the information source decoding processing unit 1103.

The information source decoding processing unit 1103 applies the information source decoding processing such as MPEG decoding to the signal from the transmission path decoding processing unit 1102, and outputs resulting image or sound.

The reception system in FIG. 89 as described above can be applied to, for example, a television tuner for receiving television broadcasting as digital broadcasting and the like.

Note that the acquisition unit 1101, the transmission path decoding processing unit 1102, and the information source decoding processing unit 1103 can be each configured as an independent device (hardware (integrated circuit (IC) or the like) or software module).

Furthermore, the acquisition unit 1101, the transmission path decoding processing unit 1102, and the information source decoding processing unit 1103 can be configured as a set of the acquisition unit 1101 and the transmission path decoding processing unit 1102, a set of the transmission path decoding processing unit 1102 and the information source decoding processing unit 1103, or a set of the acquisition unit 1101, the transmission path decoding processing unit 1102, and the information source decoding processing unit 1103, as an independent device.

Figure 90:
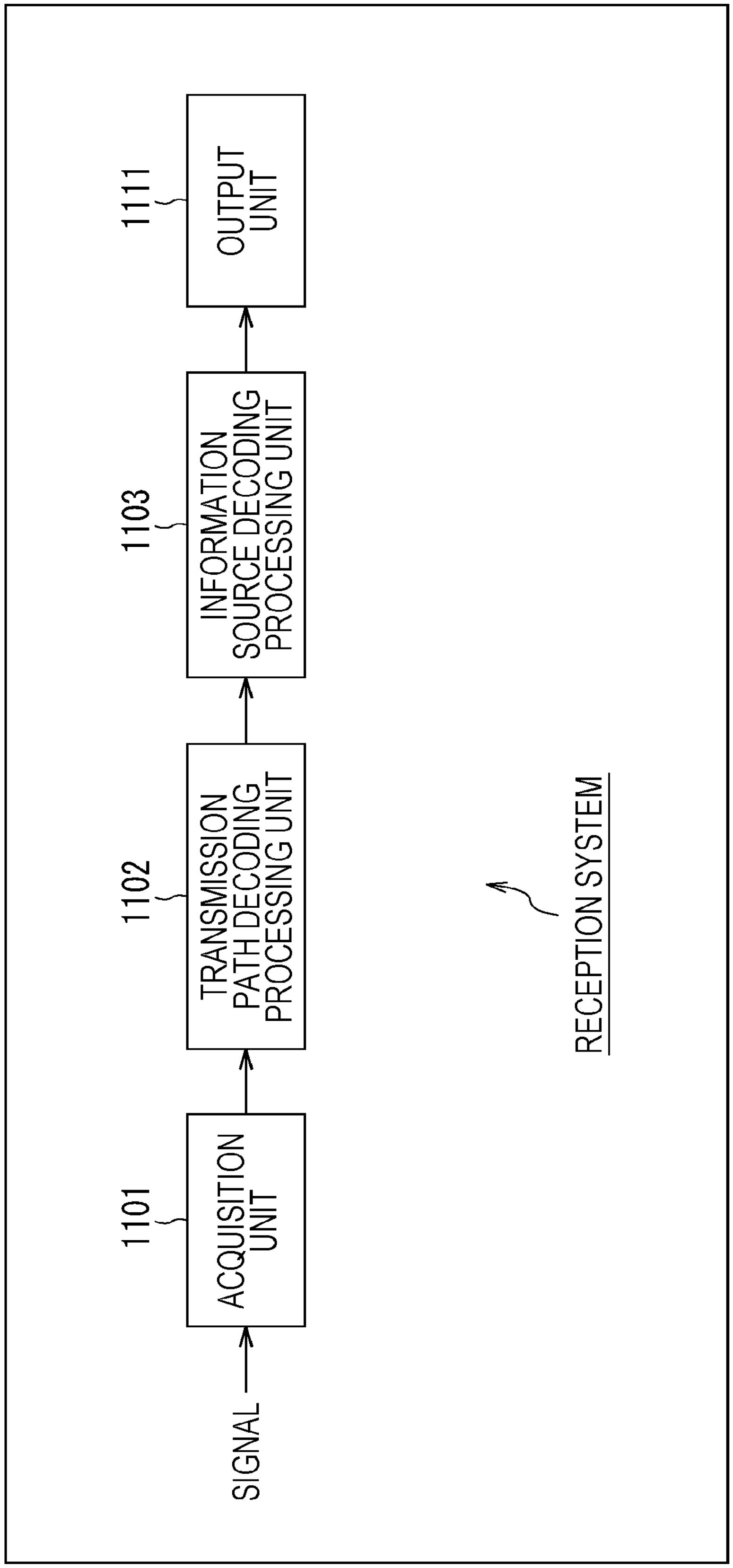
FIG. 90 is a block diagram illustrating a second configuration example of the reception system to which the reception device 12 is applicable.

FIG. 90 is a block diagram illustrating a second configuration example of the reception system to which the reception device 12 is applicable.

Note that, in FIG. 90, parts corresponding to those in FIG. 89 are given the same reference numerals, and hereinafter, description thereof will be omitted as appropriate.

The reception system in FIG. 90 is common to the case in FIG. 89 in including the acquisition unit 1101, the transmission path decoding processing unit 1102, and the information source decoding processing unit 1103 and is different from the case in FIG. 89 in newly including an output unit 1111.

The output unit 1111 is, for example, a display device for displaying an image or a speaker for outputting a sound, and outputs an image, a sound, or the like as a signal output from the information source decoding processing unit 1103. In other words, the output unit 1111 displays an image or outputs a sound.

The reception system in FIG. 90 as described above can be applied to, for example, a television (TV) receiver for receiving television broadcasting as the digital broadcasting, a radio receiver for receiving radio broadcasting, or the like.

Note that, in a case where the compression encoding has not been applied to the signal acquired by the acquisition unit 1101, the signal output by the transmission path decoding processing unit 1102 is supplied to the output unit 1111.

Figure 91:
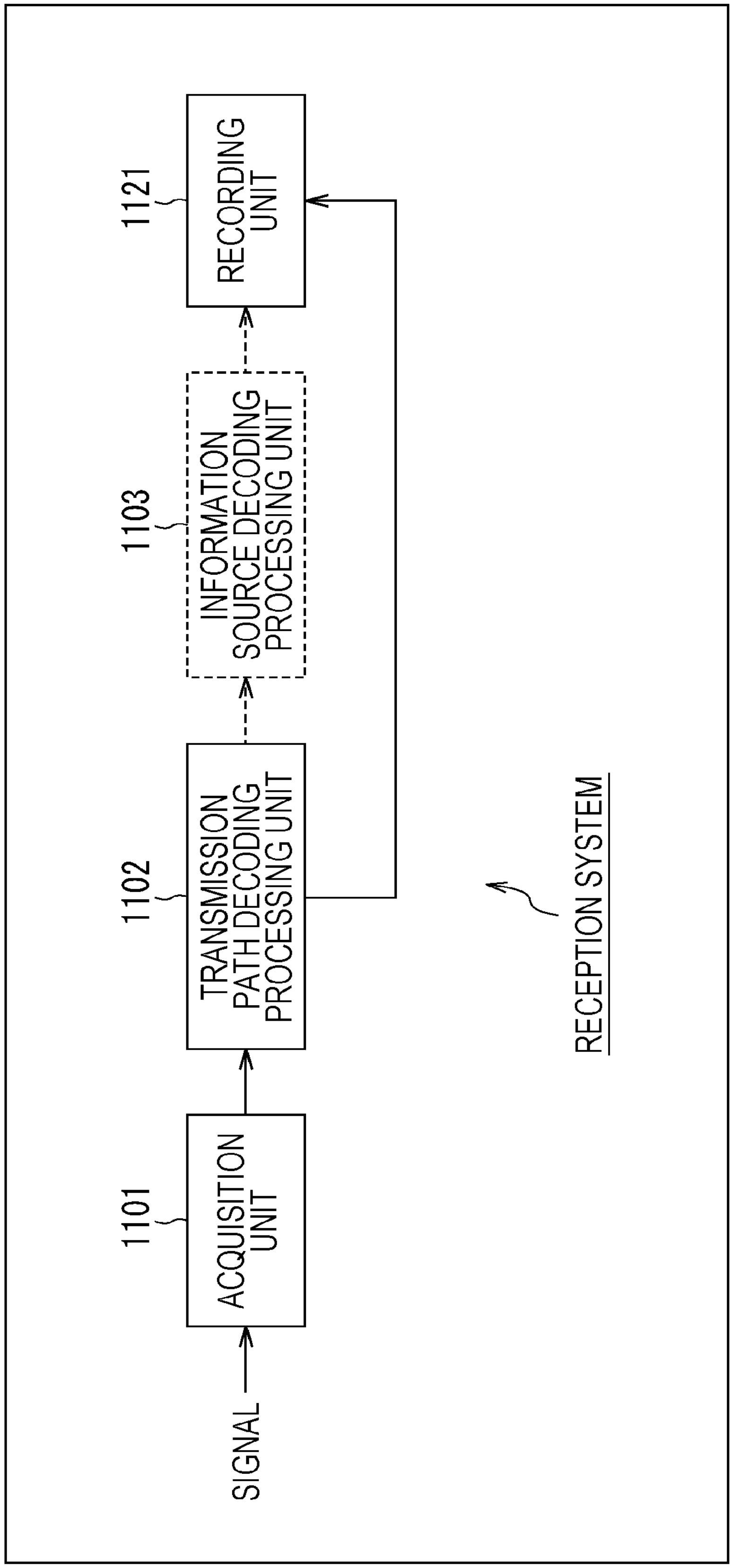
FIG. 91 is a block diagram illustrating a third configuration example of the reception system to which the reception device 12 is applicable.

FIG. 91 is a block diagram illustrating a third configuration example of the reception system to which the reception device 12 is applicable.

Note that, in FIG. 90, parts corresponding to those in FIG. 89 are given the same reference numerals, and hereinafter, description thereof will be omitted as appropriate.

The reception system in FIG. 91 is common to the case in FIG. 89 in including the acquisition unit 1101 and the transmission path decoding processing unit 1102.

However, the reception system in FIG. 91 is different from the case in FIG. 89 in not including the information source decoding processing unit 1103 and newly including a recording unit 1121.

The recording unit 1121 records (stores) the signal (for example, a TS packet of TS of MPEG) output by the transmission path decoding processing unit 1102 on a recording (storage) medium such as an optical disk, a hard disk (magnetic disk), or a flash memory.

The reception system in FIG. 91 as described above can be applied to a recorder for recording television broadcasting or the like.

Note that, in FIG. 91, the reception system includes the information source decoding processing unit 1103, and the information source decoding processing unit 1103 can record the signal to which the information source decoding processing has been applied, in other words, the image or sound obtained by decoding, in the recording unit 1121.

<Embodiment of Computer>

Next, the above-described series of processing can be executed by hardware or software. In a case of executing the series of processing by software, a program that configures the software is installed in a general-purpose computer or the like.

Figure 92:
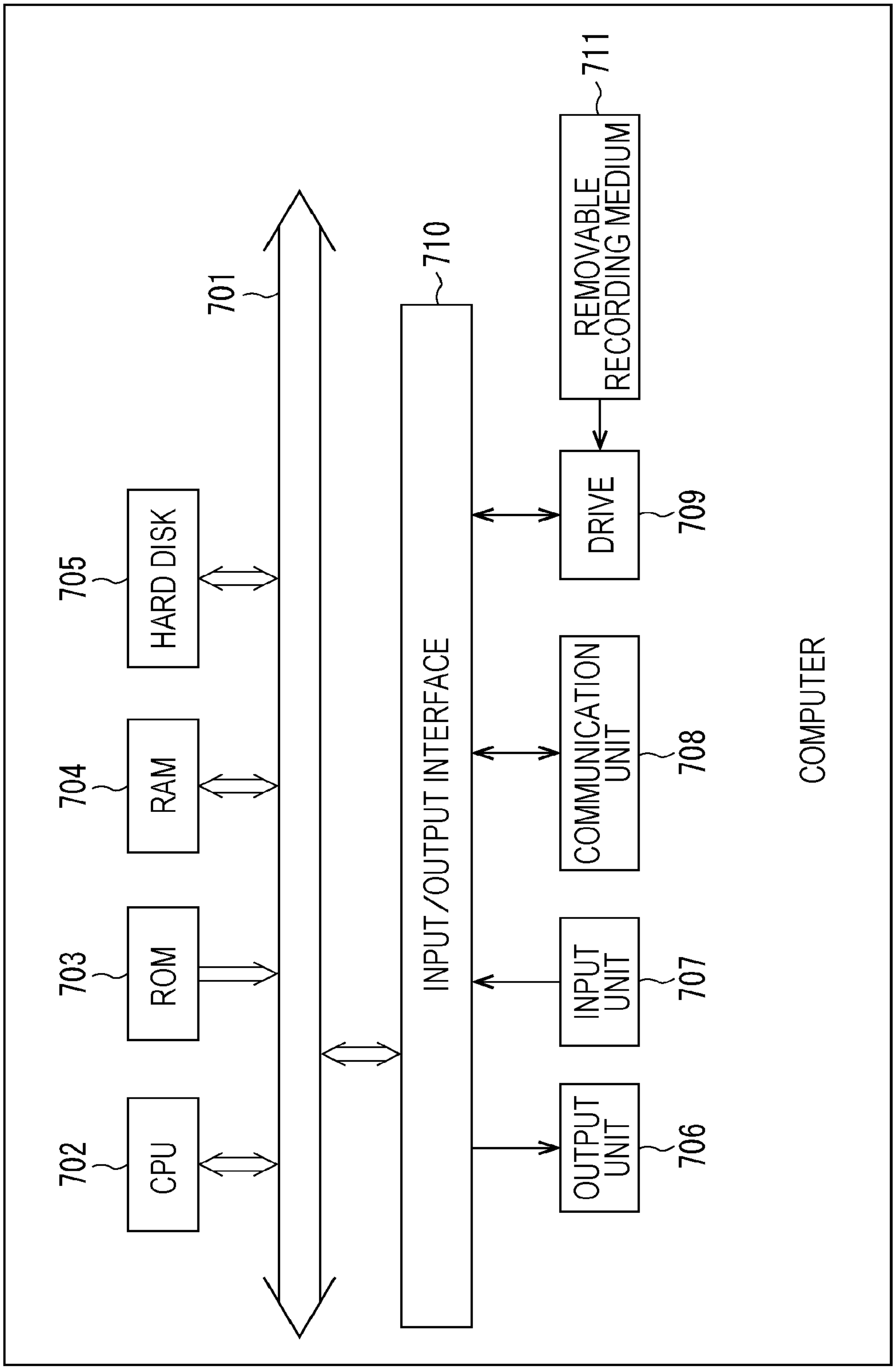
FIG. 92 is a block diagram illustrating a configuration example of an embodiment of a computer to which the present technology is applied.

Thus, FIG. 92 illustrates a configuration example of an embodiment of a computer to which a program for executing the above-described series of processing is installed.

The program can be recorded in advance in a hard disk 705 or a ROM 703 as a recording medium built in the computer.

Alternatively, the program can be temporarily or permanently stored (recorded) on a removable recording medium 711 such as a flexible disk, a compact disc read only memory (CD-ROM), a magneto optical (MO) disk, a digital versatile disc (DVD), a magnetic disk, or a semiconductor memory. Such a removable recording medium 711 can be provided as so-called package software.

Note that the program can be installed from the above-described removable recording medium 711 to the computer, can be transferred from a download site to the computer via a satellite for digital satellite broadcasting, or can be transferred by wired means to the computer via a network such as a local area network (LAN) or the internet, and the program thus transferred can be received by a communication unit 708 and installed on the built-in hard disk 705 in the computer.

The computer incorporates a central processing unit (CPU) 702. An input/output interface 710 is connected to the CPU 702 via a bus 701. The CPU 702 executes the program stored in the read only memory (ROM) 703 according to a command when the command is input by the user by an operation of an input unit 707 including a keyboard, a mouse, a microphone, and the like via the input/output interface 710. Alternatively, the CPU 702 loads the program stored in the hard disk 705, the program transferred from the satellite or the network, received by the communication unit 708, and installed in the hard disk 705, or the program read from the removable recording medium 711 attached to a drive 709 and installed in the hard disk 705 to a random access memory (RAM) 704 and executes the program. As a result, the CPU 702 performs the processing according to the above-described flowchart or the processing performed by the configuration of the above-described block diagram. Then, the CPU 702 causes an output unit 706 including a liquid crystal display (LCD), a speaker, and the like to output the processing result, the communication unit 708 to transmit the processing result, and the hard disk 705 to record the processing result, via the input/output interface 710, as necessary, for example.

Here, processing steps describing the program for causing the computer to perform various types of processing does not necessarily need to be processed chronologically according to the order described in the flowcharts, and includes processing executed in parallel or individually (for example, processing by parallel processing or object).

Furthermore, the program may be processed by one computer or may be processed in a distributed manner by a plurality of computers. Moreover, the program may be transferred to a remote computer and executed.

Note that embodiments of the present technology are not limited to the above-described embodiments, and various modifications can be made without departing from the gist of the present technology.

For example, (the parity check matrix initial value table of) the above-described new LDPC code and GW pattern can be used for a satellite channel, a ground wave, a cable (wired channel), and another communication path 13 (FIG. 7). Moreover, the new LDPC code and GW pattern can be used for data transmission other than digital broadcasting.

Note that the effects described in the present specification are merely examples and are not limited, and other effects may be exhibited.

REFERENCE SIGNS LIST

11 Transmission device
12 Reception device
23 Parity interleaver
24 Group-wise interleaver
25 Block interleaver
54 Block deinterleaver
55 Group-wise deinterleaver
111 Mode adaptation/multiplexer
112 Padder
113 BB scrambler
114 BCH encoder
115 LDPC encoder
116 Bit interleaver
117 Mapper
118 Time interleaver
119 SISO/MISO encoder
120 Frequency interleaver
121 BCH encoder
122 LDPC encoder
123 Mapper
124 Frequency interleaver
131 Frame builder/resource allocation unit
132 OFDM generation unit
151 OFDM processing unit
152 Frame management unit
153 Frequency deinterleaver
154 Demapper
155 LDPC decoder
156 BCH decoder
161 Frequency deinterleaver
162 SISO/MISO decoder
163 Time deinterleaver
164 Demapper
165 Bit deinterleaver
166 LDPC decoder
167 BCH decoder
168 BB descrambler
169 Null deletion unit
170 Demultiplexer
300 Edge data storage memory
301 Selector
302 Check node calculation unit
303 Cyclic shift circuit
304 Edge data storage memory
305 Selector
306 Received data memory
307 Variable node calculation unit
308 Cyclic shift circuit
309 Decoded word calculation unit
310 Received data rearranging unit
311 Decoded data rearranging unit
601 Coding processing unit
602 Storage unit
611 Coding rate setting unit
612 Initial value table reading unit
613 Parity check matrix generation unit
614 Information bit reading unit
615 Coding parity operation unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Reverse permutation unit
1002 Memory
1011 Parity deinterleaver
1101 Acquisition unit
1101 Transmission path decoding processing unit
1103 Information source decoding processing unit
1111 Output unit
1121 Recording unit

The invention claimed is:

1. A transmission device comprising:

an encoding unit configured to perform LDPC coding on a basis of a parity check matrix of an LDPC code with a code length N of 17280 bits and a coding rate r of 13/16, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 225 274 898 916 1020 1055 1075 1179 1185 1343 1376 1569 1828 1972 2852 2957 3183

548 602 628 928 1077 1474 1557 1598 1935 1981 2110 2472 2543 2594 2721 2884 2981
59 69 518 900 1158 1325 1367 1480 1744 2069 2119 2406 2757 2883 2914 2966 3232
1330 1369 1712 2133 2206 2487 2596 2606 2612 2666 2726 2733 2754 2811 2948 3030
391 542 689 748 810 1716 1927 2006 2296 2340 2357 2514 2797 2887 2896 3226
256 410 799 1126 1377 1409 1518 1619 1829 2037 2303 2324 2472 2475 2874 2992
862 1522 1905
809 842 945
561 1001 2857
2132 2592 2905
217 401 1894
11 30 1860
210 1188 2418
1372 2273 2455
407 2537 2962
939 2401 2677
2521 3077 3173
1374 2250 2423
23 188 1320
472 714 2144
2727 2755 2887
1814 2824 2852
148 1695 1845
595 1059 2702
1879 2480 2578
17 411 559
146 783 2154
951 1391 1979
1507 1613 3106
642 882 2356
1008 1324 3125
196 1794 2474
1129 1544 2931
765 1681 2591
1550 1936 3048
1596 1607 2794
156 1053 2926
1246 1996 3179
348 752 1943.

2. A transmission method comprising:

an encoding step of performing LDPC coding on a basis of a parity check matrix of an LDPC code with a code length N of 17280 bits and a coding rate r of 13/16, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 225 274 898 916 1020 1055 1075 1179 1185 1343 1376 1569 1828 1972 2852 2957 3183
548 602 628 928 1077 1474 1557 1598 1935 1981 2110 2472 2543 2594 2721 2884 2981
59 69 518 900 1158 1325 1367 1480 1744 2069 2119 2406 2757 2883 2914 2966 3232
1330 1369 1712 2133 2206 2487 2596 2606 2612 2666 2726 2733 2754 2811 2948 3030
391 542 689 748 810 1716 1927 2006 2296 2340 2357 2514 2797 2887 2896 3226
256 410 799 1126 1377 1409 1518 1619 1829 2037 2303 2324 2472 2475 2874 2992
862 1522 1905
809 842 945
561 1001 2857
2132 2592 2905
217 401 1894
11 30 1860
210 1188 2418
1372 2273 2455
407 2537 2962
939 2401 2677
2521 3077 3173
1374 2250 2423
23 188 1320
472 714 2144
2727 2755 2887
1814 2824 2852
148 1695 1845
595 1059 2702
1879 2480 2578
17 411 559
146 783 2154
951 1391 1979
1507 1613 3106
642 882 2356
1008 1324 3125
196 1794 2474
1129 1544 2931
765 1681 2591
1550 1936 3048
1596 1607 2794
156 1053 2926
1246 1996 3179
348 752 1943.

3. A reception device comprising:

a decoding unit configured to decode an LDPC code with a code length N of 17280 bits and a coding rate r of 13/16, the LDPC code being obtained from data transmitted by a transmission method including an encoding step of performing LDPC coding on a basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 225 274 898 916 1020 1055 1075 1179 1185 1343 1376 1569 1828 1972 2852 2957 3183
548 602 628 928 1077 1474 1557 1598 1935 1981 2110 2472 2543 2594 2721 2884 2981
59 69 518 900 1158 1325 1367 1480 1744 2069 2119 2406 2757 2883 2914 2966 3232
1330 1369 1712 2133 2206 2487 2596 2606 2612 2666 2726 2733 2754 2811 2948 3030
391 542 689 748 810 1716 1927 2006 2296 2340 2357 2514 2797 2887 2896 3226
256 410 799 1126 1377 1409 1518 1619 1829 2037 2303 2324 2472 2475 2874 2992
862 1522 1905
809 842 945
561 1001 2857

2132 2592 2905
217 401 1894
11 30 1860
210 1188 2418
1372 2273 2455
407 2537 2962
939 2401 2677
2521 3077 3173
1374 2250 2423
23 188 1320
472 714 2144
2727 2755 2887
1814 2824 2852
148 1695 1845
595 1059 2702
1879 2480 2578
17 411 559
146 783 2154
951 1391 1979
1507 1613 3106
642 882 2356
1008 1324 3125
196 1794 2474
1129 1544 2931
765 1681 2591
1550 1936 3048
1596 1607 2794
156 1053 2926
1246 1996 3179
348 752 1943.

4. A reception method comprising:

a decoding step of decoding an LDPC code with a code length N of 17280 bits and a coding rate r of 13/16, the LDPC code being obtained from data transmitted by a transmission method including an encoding step of performing LDPC coding on a basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 225 274 898 916 1020 1055 1075 1179 1185 1343 1376 1569 1828 1972 2852 2957 3183
548 602 628 928 1077 1474 1557 1598 1935 1981 2110 2472 2543 2594 2721 2884 2981
59 69 518 900 1158 1325 1367 1480 1744 2069 2119 2406 2757 2883 2914 2966 3232
1330 1369 1712 2133 2206 2487 2596 2606 2612 2666 2726 2733 2754 2811 2948 3030
391 542 689 748 810 1716 1927 2006 2296 2340 2357 2514 2797 2887 2896 3226
256 410 799 1126 1377 1409 1518 1619 1829 2037 2303 2324 2472 2475 2874 2992
862 1522 1905
809 842 945
561 1001 2857
2132 2592 2905
217 401 1894
11 30 1860
210 1188 2418
1372 2273 2455
407 2537 2962
939 2401 2677
2521 3077 3173
1374 2250 2423
23 188 1320
472 714 2144
2727 2755 2887
1814 2824 2852
148 1695 1845
595 1059 2702
1879 2480 2578
17 411 559
146 783 2154
951 1391 1979
1507 1613 3106
642 882 2356
1008 1324 3125
196 1794 2474
1129 1544 2931
765 1681 2591
1550 1936 3048
1596 1607 2794
156 1053 2926
1246 1996 3179
348 752 1943.

5. A transmission device comprising:

an encoding unit configured to perform LDPC coding on a basis of a parity check matrix of an LDPC code with a code length N of 17280 bits and a coding rate r of 14/16, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 337 376 447 504 551 864 872 975 1136 1225 1254 1271 1429 1478 1870 2122
58 121 163 365 515 534 855 889 1083 1122 1190 1448 1476 1635 1691 1954
247 342 395 454 479 665 674 1033 1041 1198 1300 1484 1680 1941 2096 2121
80 487 500 513 661 970 1038 1095 1109 1133 1416 1545 1696 1992 2051 2089
32 101 205 413 568 712 714 944 1329 1669 1703 1826 1904 1908 2014 2097
142 201 491 838 860 954 960 965 997 1027 1225 1488 1502 1521 1737 1804
453 1184 1542
10 781 1709
497 903 1546
1080 1640 1861
1198 1616 1817
771 978 2089
369 1079 1348
980 1788 1987
1495 1900 2015
27 540 1070
200 1771 1962
863 988 1329
674 1321 2152
807 1458 1727
844 867 1628
227 546 1027
408 926 1413

361 982 2087
1247 1288 1392
1051 1070 1281
325 452 467
1116 1672 1833
21 236 1267
504 856 2123
398 775 1912
1056 1529 1701
143 930 1186
553 1029 1040
303 653 1308
877 992 1174
1083 1134 1355
298 404 709
970 1272 1799
296 1017 1873
105 780 1418
682 1247 1867.

6. A transmission method comprising:

an encoding step of performing LDPC coding on a basis of a parity check matrix of an LDPC code with a code length N of 17280 bits and a coding rate r of 14/16, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 337 376 447 504 551 864 872 975 1136 1225 1254 1271 1429 1478 1870 2122
58 121 163 365 515 534 855 889 1083 1122 1190 1448 1476 1635 1691 1954
247 342 395 454 479 665 674 1033 1041 1198 1300 1484 1680 1941 2096 2121
80 487 500 513 661 970 1038 1095 1109 1133 1416 1545 1696 1992 2051 2089
32 101 205 413 568 712 714 944 1329 1669 1703 1826 1904 1908 2014 2097
142 201 491 838 860 954 960 965 997 1027 1225 1488 1502 1521 1737 1804
453 1184 1542
10 781 1709
497 903 1546
1080 1640 1861
1198 1616 1817
771 978 2089
369 1079 1348
980 1788 1987
1495 1900 2015
27 540 1070
200 1771 1962
863 988 1329
674 1321 2152
807 1458 1727
844 867 1628
227 546 1027
408 926 1413
361 982 2087
1247 1288 1392
1051 1070 1281
325 452 467
1116 1672 1833
21 236 1267
504 856 2123
398 775 1912
1056 1529 1701
143 930 1186
553 1029 1040
303 653 1308
877 992 1174
1083 1134 1355
298 404 709
970 1272 1799
296 1017 1873
105 780 1418
682 1247 1867.

7. A reception device comprising:

a decoding unit configured to decode an LDPC code with a code length N of 17280 bits and a coding rate r of 14/16, the LDPC code being obtained from data transmitted by a transmission method including an encoding step of performing LDPC coding on a basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 337 376 447 504 551 864 872 975 1136 1225 1254 1271 1429 1478 1870 2122
58 121 163 365 515 534 855 889 1083 1122 1190 1448 1476 1635 1691 1954
247 342 395 454 479 665 674 1033 1041 1198 1300 1484 1680 1941 2096 2121
80 487 500 513 661 970 1038 1095 1109 1133 1416 1545 1696 1992 2051 2089
32 101 205 413 568 712 714 944 1329 1669 1703 1826 1904 1908 2014 2097
142 201 491 838 860 954 960 965 997 1027 1225 1488 1502 1521 1737 1804
453 1184 1542
10 781 1709
497 903 1546
1080 1640 1861
1198 1616 1817
771 978 2089
369 1079 1348
980 1788 1987
1495 1900 2015
27 540 1070
200 1771 1962
863 988 1329
674 1321 2152
807 1458 1727
844 867 1628
227 546 1027
408 926 1413
361 982 2087
1247 1288 1392
1051 1070 1281
325 452 467
1116 1672 1833
21 236 1267
504 856 2123

398 775 1912
1056 1529 1701
143 930 1186
553 1029 1040
303 653 1308
877 992 1174
1083 1134 1355
298 404 709
970 1272 1799
296 1017 1873
105 780 1418
682 1247 1867.

8. A reception method comprising:

a decoding step of decoding an LDPC code with a code length N of 17280 bits and a coding rate r of 14/16, the LDPC code being obtained from data transmitted by a transmission method including an encoding step of performing LDPC coding on a basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 337 376 447 504 551 864 872 975 1136 1225 1254 1271 1429 1478 1870 2122
58 121 163 365 515 534 855 889 1083 1122 1190 1448 1476 1635 1691 1954
247 342 395 454 479 665 674 1033 1041 1198 1300 1484 1680 1941 2096 2121
80 487 500 513 661 970 1038 1095 1109 1133 1416 1545 1696 1992 2051 2089
32 101 205 413 568 712 714 944 1329 1669 1703 1826 1904 1908 2014 2097

142 201 491 838 860 954 960 965 997 1027 1225 1488 1502 1521 1737 1804
453 1184 1542
10 781 1709
497 903 1546
1080 1640 1861
1198 1616 1817
771 978 2089
369 1079 1348
980 1788 1987
1495 1900 2015
27 540 1070
200 1771 1962
863 988 1329
674 1321 2152
807 1458 1727
844 867 1628
227 546 1027
408 926 1413
361 982 2087
1247 1288 1392
1051 1070 1281
325 452 467
1116 1672 1833
21 236 1267
504 856 2123
398 775 1912
1056 1529 1701
143 930 1186
553 1029 1040
303 653 1308
877 992 1174
1083 1134 1355
298 404 709
970 1272 1799
296 1017 1873
105 780 1418
682 1247 1867.

* * * * *